US010861873B2

(12) United States Patent
Kim et al.

(10) Patent No.: US 10,861,873 B2
(45) Date of Patent: Dec. 8, 2020

(54) THREE-DIMENSIONAL MEMORY DEVICE INCLUDING SIGNAL AND POWER CONNECTION LINES EXTENDING THROUGH DIELECTRIC REGIONS AND METHODS OF MAKING THE SAME

(71) Applicant: SANDISK TECHNOLOGIES LLC, Addison, TX (US)

(72) Inventors: Jee-Yeon Kim, San Jose, CA (US); Kwang-Ho Kim, Pleasanton, CA (US); Fumiaki Toyama, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 34 days.

(21) Appl. No.: 16/404,844

(22) Filed: May 7, 2019

(65) Prior Publication Data

US 2020/0357814 A1 Nov. 12, 2020

(51) Int. Cl.

*H01L 27/11582* (2017.01)
*H01L 27/11519* (2017.01)
(Continued)

(52) U.S. Cl.

CPC ........ *H01L 27/11582* (2013.01); *G11C 5/063* (2013.01); *H01L 27/1157* (2013.01);
(Continued)

(58) Field of Classification Search

CPC ......... H01L 27/11519; H01L 27/11524; H01L 27/11529; H01L 27/11551–11556;
(Continued)

(56) References Cited

U.S. PATENT DOCUMENTS 5,915,167 A 6/1999 Leedy
9,356,034 B1 5/2016 Yada et al.
(Continued)

FOREIGN PATENT DOCUMENTS

CN 107863351 A 3/2018
WO WO2017142806 A1 8/2017

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).

(Continued)

*Primary Examiner* — Nelson Garces
(74) *Attorney, Agent, or Firm* — The Marbury Law Group PLLC

(57) ABSTRACT

A three-dimensional memory device includes a plurality of alternating stacks of insulating layers and electrically conductive layers located over a substrate, clusters of memory stack structures vertically extending through a respective one of the alternating stacks, and bit lines electrically connected to an upper end of a respective subset of the vertical semiconductor channels. In one embodiment, a subset of the bit lines can include a respective multi-level structure. Each multi-level structure includes bit-line-level bit line segments and an interconnection line segment located at a different level from the bit-line-level bit line segments. In another embodiment, groups of alternating stacks can be alternately indented along a horizontal direction perpendicular to the bit lines to provide dielectric material portions located in lateral indentation regions. Metal line structures connecting contact via structures can extend parallel to bit lines to provide electrical connections between word lines and underlying field effect transistors.

20 Claims, 80 Drawing Sheets

(51) Int. Cl.

| | |
|---|---|
| ***H01L 27/11524*** | (2017.01) |
| ***H01L 27/11573*** | (2017.01) |
| ***H01L 27/11529*** | (2017.01) |
| ***G11C 5/06*** | (2006.01) |
| ***H01L 27/11556*** | (2017.01) |
| ***H01L 27/11558*** | (2017.01) |
| ***H01L 27/11565*** | (2017.01) |
| ***H01L 27/1157*** | (2017.01) |

(52) U.S. Cl.
CPC .. *H01L 27/11519* (2013.01); *H01L 27/11524* (2013.01); *H01L 27/11529* (2013.01); *H01L 27/11556* (2013.01); *H01L 27/11558* (2013.01); *H01L 27/11565* (2013.01); *H01L 27/11573* (2013.01)

(58) Field of Classification Search
CPC .......... H01L 27/11578–11582; H01L 23/5283; H01L 27/11565; H01L 27/11573; H01L 29/7883
See application file for complete search history.

(56) References Cited

U.S. PATENT DOCUMENTS

| | | | |
|---|---|---|---|
| 9,806,093 | B2 | 10/2017 | Toyama et al. |
| 9,818,693 | B2 | 11/2017 | Toyama et al. |
| 9,818,759 | B2 | 11/2017 | Kai et al. |
| 10,038,006 | B2 | 7/2018 | Furihata et al. |
| 10,115,681 | B1 | 10/2018 | Ariyoshi |
| 10,256,248 | B2 | 4/2019 | Lu et al. |
| 10,269,620 | B2 | 4/2019 | Yu et al. |
| 2015/0372006 | A1 | 12/2015 | Kito et al. |
| 2017/0103993 | A1 | 4/2017 | Lee et al. |
| 2017/0179026 | A1 | 6/2017 | Toyama et al. |
| 2017/0179151 | A1 | 6/2017 | Kai et al. |
| 2017/0179152 | A1 | 6/2017 | Toyama et al. |
| 2017/0179153 | A1 | 6/2017 | Ogawa et al. |
| 2017/0179154 | A1 | 6/2017 | Furihata et al. |
| 2017/0236746 | A1 | 8/2017 | Yu et al. |
| 2017/0352678 | A1 | 12/2017 | Lu et al. |
| 2018/0342455 | A1* | 11/2018 | Nosho ............... H01L 27/11575 |
| 2019/0006381 | A1* | 1/2019 | Nakatsuji .......... H01L 27/11565 |
| 2019/0081053 | A1* | 3/2019 | Nojima ............. H01L 27/11524 |
| 2019/0221574 | A1 | 7/2019 | Shimabukuro et al. |

OTHER PUBLICATIONS

U.S. Appl. No. 15/898,544, filed Feb. 17, 2018, SanDisk Technologies LLC.
U.S. Appl. No. 15/909,036, filed Mar. 1, 2018, SanDisk Technologies LLC.
U.S. Appl. No. 15/956,139, filed Apr. 18, 2018, SanDisk Technologies LLC.
U.S. Appl. No. 16/020,637, filed Jun. 27, 2018, SanDisk Technologies LLC.
U.S. Appl. No. 16/020,739, filed Jun. 27, 2018, SanDisk Technologies LLC.
U.S. Appl. No. 16/020,817, filed Jun. 27, 2018, SanDisk Technologies LLC.
U.S. Appl. No. 16/213,180, filed Dec. 7, 2018, SanDisk Technologies LLC.
U.S. Appl. No. 16/213,382, filed Dec. 7, 2018, SanDisk Technologies LLC.
U.S. Appl. No. 16/251,782, filed Jan. 18, 2019, SanDisk Technologies LLC.
U.S. Appl. No. 16/366,245, filed Mar. 27, 2019, SanDisk Technologies LLC.
U.S. Appl. No. 16/366,330, filed Mar. 27, 2019, SanDisk Technologies LLC.
Kim, J.Y. et al., "Three-Dimensional Memory Device Including Signal and Power Connection Lines Extending Through Dielectric Regions and Methods Of Making The Same," Corresponding U.S. Appl. No. 16/404,961, filed May 7, 2019.
Notification of Transmittal of the International Search Report and Written Opinion of the International Search Authority or International Patent Application No. PCT/US2019/068891, dated Apr. 5, 2020, 9 pages.
Notice of Allowance and Fee(s) Due for U.S. Appl. No. 16/404,961, dated May 15, 2020, 16 pages.

* cited by examiner

THREE-DIMENSIONAL MEMORY DEVICE INCLUDING SIGNAL AND POWER CONNECTION LINES EXTENDING THROUGH DIELECTRIC REGIONS AND METHODS OF MAKING THE SAME

FIELD

The present disclosure relates generally to the field of semiconductor devices, and particular to a three-dimensional memory device including routing of bit lines, power lines and connecting lines through dielectric regions and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device includes a first alternating stack of insulating layers and electrically conductive layers located over a substrate, a second alternating stack of insulating layers and electrically conductive layers located over the substrate and spaced apart from the first alternating stack, clusters of memory stack structures vertically extending through the first and second alternating stacks, wherein each memory stack structure comprises a memory film and a vertical semiconductor channel, and bit lines electrically connected to an upper end of a respective subset of the vertical semiconductor channels. Each bit line in a first subset of the bit lines extends over the first and second alternating stacks as a continuous line structure and is vertically spaced from the substrate by a first interconnect-level separation distance. Each bit line in a second subset of the bit lines comprises a respective multi-level structure, each multi-level structure including bit-line-level bit line segments spaced from the substrate by the first interconnect-level separation distance and an interconnection line segment that is spaced from the substrate by a distance that is different from the first interconnect-level separation distance.

According to another embodiment of the present disclosure, a method of forming a three-dimensional memory device comprises forming first and second alternating stacks of insulating layers and electrically conductive layers located over a substrate and clusters of memory stack structures vertically extending through the first and second alternating stacks, wherein each memory stack structure comprises a memory film and a vertical semiconductor channel, and forming bit lines electrically connected to an upper end of a respective subset of the vertical semiconductor channels. Each bit line in a first subset of the bit lines extends over the first and second alternating stacks as a continuous line structure and is vertically spaced from the substrate by a first interconnect-level separation distance. Each bit line in a second subset of the bit lines comprises a respective multi-level structure, each multi-level structure including bit-line-level bit line segments spaced from the substrate by the first interconnect-level separation distance and an interconnection line segment that is spaced from the substrate by a distance that is different from the first interconnect-level separation distance.

According to yet another aspect of the present disclosure, a three-dimensional memory device comprises peripheral circuitry comprising field effect transistors located over a substrate, lower-level metal interconnect structures embedded in lower-level dielectric material layers overlying the field effect transistors and connected to nodes of the field effect transistors, and groups of alternating stacks of insulating layers and electrically conductive layers comprising word lines located over the lower-level dielectric material layers, each alternating stack laterally extending along a first horizontal direction. The groups of alternating stacks comprise odd-numbered groups that alternate with even-numbered groups along a second horizontal direction that is perpendicular to the first horizontal direction. Odd-numbered groups of alternating stacks each comprise a first laterally-protruding staircase segment on a first end, and a first indented region on a second end opposite to the first end along the first horizontal direction. Even-numbered groups of alternating stacks each comprise a second laterally-protruding staircase segment on a second end located between two of the first indented regions, and a second indented region located between two of the first laterally-protruding staircase segments on a first end opposite to the second end along the first horizontal direction. The device further comprises dielectric material portions located in the first and second indented regions, clusters of memory stack structures vertically extending through the groups of alternating stacks, word line contact via structures contacting the electrically conductive layers, word-line-interconnect metal lines electrically connected to a respective one of the word line contact via structures and extending from above the respective one of the word lines over a respective one of the dielectric material portions along the second horizontal direction; and through-memory-level word-line-connection via structures electrically connected to a respective one of the word-line-interconnect metal lines and extending through a respective one of the dielectric material portions and electrically connected to a respective one of the lower-level metal interconnect structures.

DETAILED DESCRIPTION

Figure 1A:
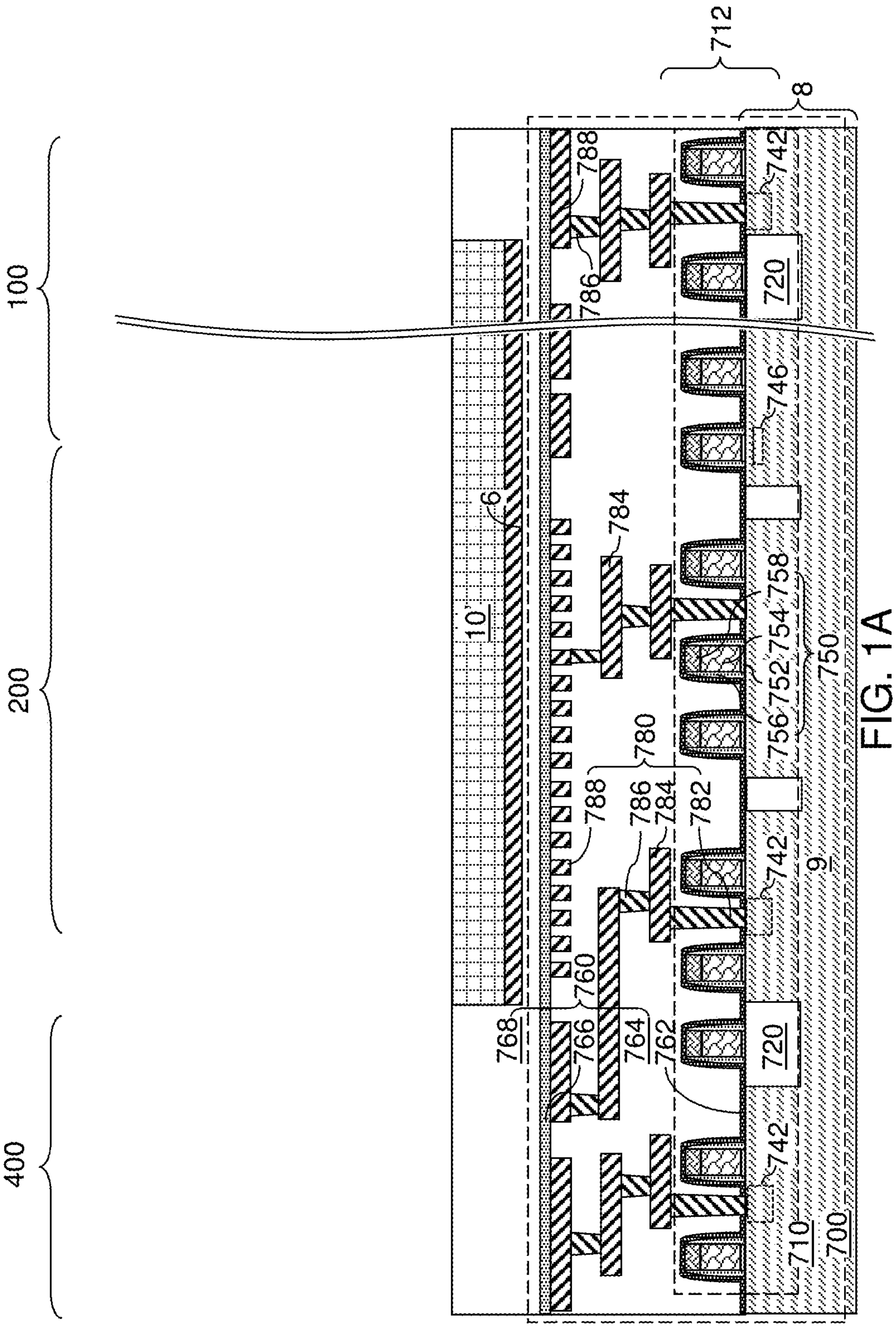
FIG. 1A is a vertical cross-sectional view of a first exemplary structure after formation of semiconductor devices, lower level dielectric layers, lower metal interconnect structures, and in-process source level material layers on a semiconductor substrate according to a first embodiment of the present disclosure.
Figure 1B:
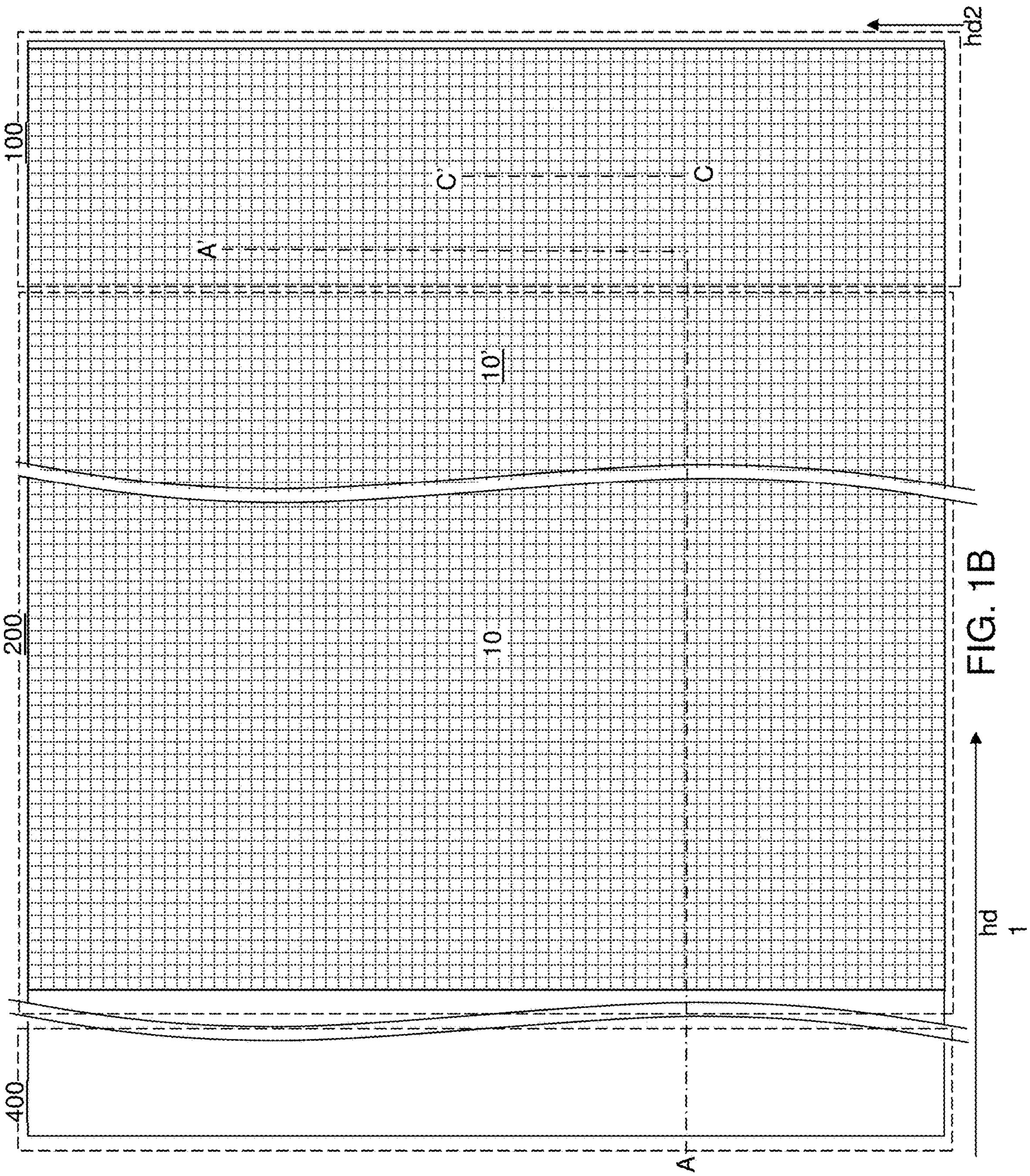
FIG. 1B is a top-down view of the first exemplary structure of FIG. 1A. The hinged vertical plane A-A' is the plane of the vertical cross-sectional view of FIG. 1A.

As discussed above, the present disclosure is directed to a three-dimensional memory device including routing of signal and power lines and vias through dielectric regions, such as level-shifted bit line routing and lateral word line connection routing through dielectric regions and methods of manufacturing the same, the various embodiments of which are described herein in detail. The embodiments of the present disclosure can be used to form various semiconductor devices such as three-dimensional monolithic memory array devices comprising a plurality of NAND memory strings.

In conventional three-dimensional memory devices, an opening is etched through the entire word line stack to form a via structure that provides signal and power from above the three-dimensional memory device to a driver circuit located under the word line stack. The via structure consumes a large area and increases processing cost to form an opening through the entire word line stack. Various embodiments are disclosed which form via structures in the dielectric filled bit line break area located in the middle of the word line stack. The bit line break areas can be areas within the memory array region in which the word lines and memory opening fill structures (i.e., channels, drains and memory films) are not present. By providing the via structures in the bit line break area as well as in free staircase areas at a word line hook up location, the processing costs can be significantly decreased by a simplification of the processing steps. In addition, the underutilized dielectric filled area for such via structures can be utilized, which increases the device density.

The drawings are not drawn to scale. Multiple instances of an element can be duplicated where a single instance of the element is illustrated, unless absence of duplication of elements is expressly described or clearly indicated otherwise. Ordinals such as "first," "second," and "third" can be used merely to identify similar elements, and different ordinals can be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element can be located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, or can have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction. As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" can be a heavily doped semiconductor material, or can be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material can be semiconducting or conductive, and can be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is an array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays can be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates can be thinned or removed from the memory levels before bonding, but as the memory levels are initially formed over separate substrates, such memories are not true monolithic three-dimensional memory arrays. The substrate can include integrated circuits fabricated thereon, such as driver circuits for a memory device The various three-dimensional memory devices of the present disclosure include a monolithic three-dimensional NAND string memory device, and can be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that can be attached to a circuit board through a set of pins or solder balls. A semiconductor package can include a semiconductor chip (or a "chip") or a plurality of semiconductor chips that are bonded throughout, for example, by flip-chip bonding or another chip-to-chip bonding. A package or a chip can include a single semiconductor die (or a "die") or a plurality of semiconductor dies. A die is the smallest unit that can independently execute external commands or report status. Typically, a package or a chip with multiple dies is capable of simultaneously executing as many external commands as the total number of planes therein. Each die includes one or more planes. Identical concurrent operations can be executed in each plane within a same die, although there can be some restrictions. In cases where the die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1C:
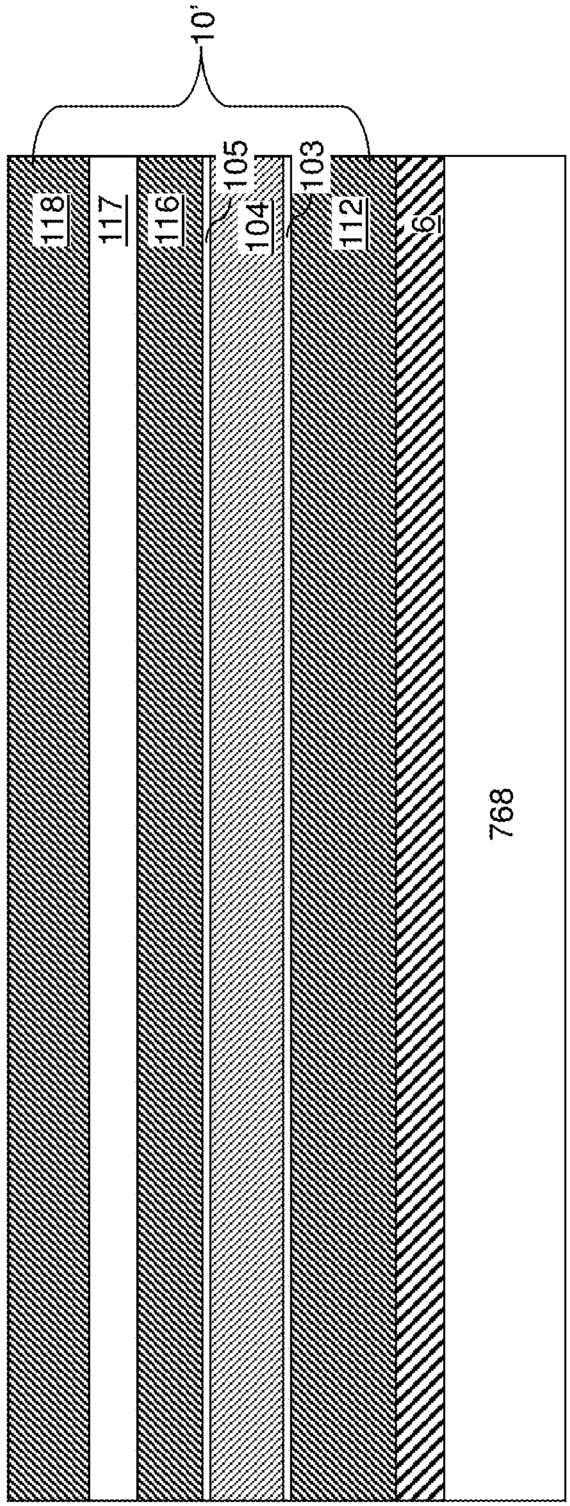
FIG. 1C is a magnified view of the in-process source level material layers along the vertical plane C-C' of FIG. 1B.
Figure 1D:
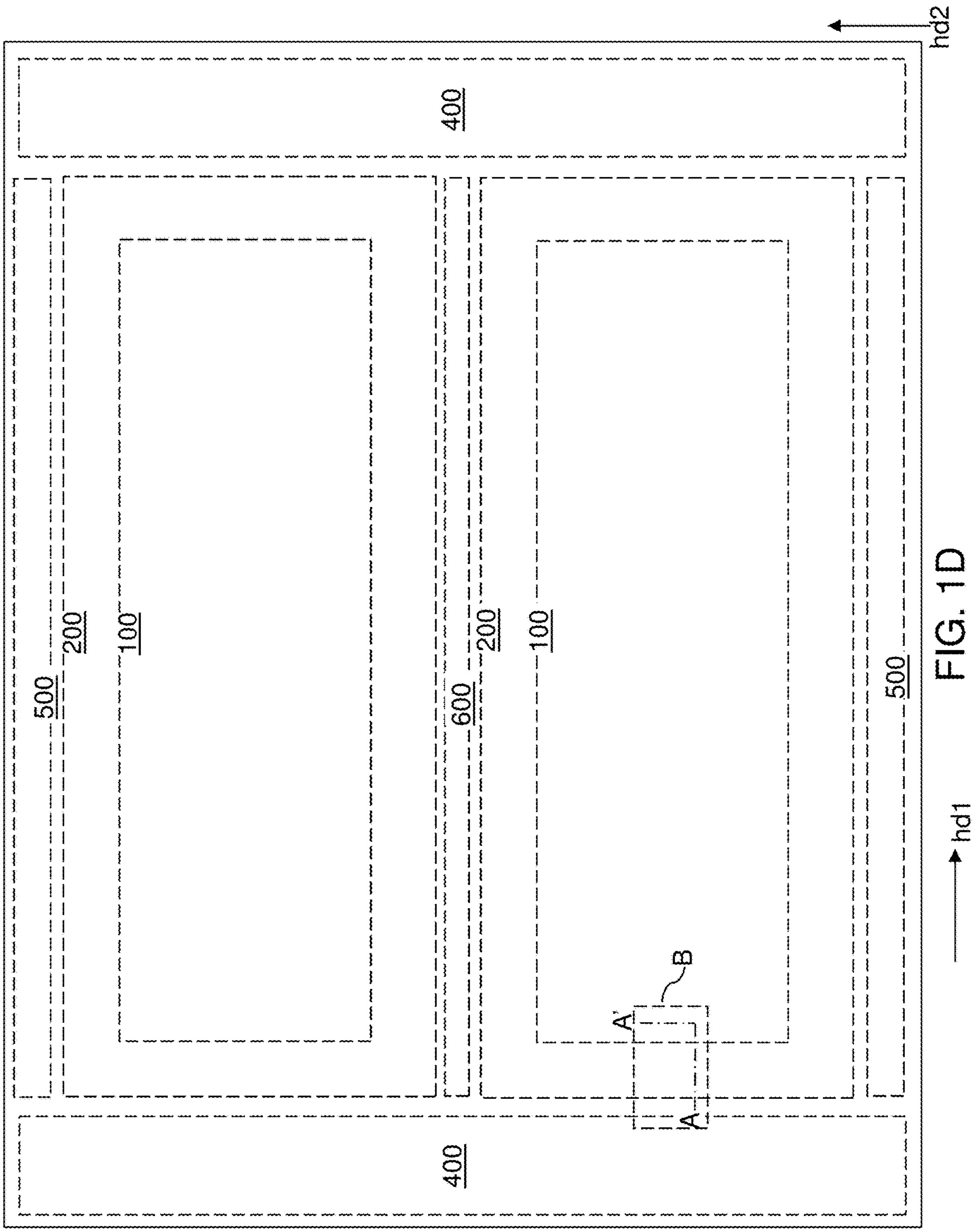
FIG. 1D is a top-down view of the first exemplary structure of FIGS. 1A-1C over a larger area than the area shown in FIG. 1B. The area B corresponds to the area illustrated in FIG. 1B. The hinged vertical plane A-A' is the plane of the vertical cross-sectional view of FIG. 1A.

Referring to FIGS. 1A-1D, a first exemplary structure according to a first embodiment of the present disclosure is illustrated. FIG. 1C is a magnified view of an in-process source-level material layers 10' illustrated in FIGS. 1A and 1B. FIG. 1D is a top-down view of the first exemplary structure on a larger scale than the top-down view of FIG. 1B. The first exemplary structure can include a substrate 8 and semiconductor devices 710 formed thereupon. The substrate 8 can include a substrate semiconductor layer 9 at least at an upper portion thereof. Shallow trench isolation structures 720 can be formed in an upper portion of the substrate semiconductor layer 9 to provide electrical isolation from other semiconductor devices. The semiconductor devices 710 can include, for example, field effect transistors including respective transistor active regions 742 (i.e., source regions and drain regions), channel regions 746, and gate structures 750. The field effect transistors can be arranged in a CMOS configuration. Each gate structure 750 can include, for example, a gate dielectric 752, a gate electrode 754, a dielectric gate spacer 756 and a gate cap dielectric 758. The semiconductor devices 710 can include any semiconductor circuitry to support operation of a memory structure to be subsequently formed, which is typically referred to as a driver circuitry, which is also known as peripheral circuitry. As used herein, a peripheral circuitry 712 refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices 710 can include word line switching devices for electrically biasing word lines of three-dimensional memory structures to be subsequently formed and sense amplifiers which are electrically connected to bit lines to be subsequently formed.

Dielectric material layers can be formed over the semiconductor devices 710, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 can function as a matrix for lower-level metal interconnect structures 780 that provide electrical wiring to and from the various nodes of the semiconductor devices 710 and landing pads for through-memory-level via structures to be subsequently formed. The lower-level metal interconnect structures 780 can be formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be formed within the first dielectric material layers 764. The first dielectric material layers 764 can be a plurality of dielectric material layers in which various elements of the lower-level metal interconnect structures 780 are sequentially formed. Each dielectric material layer selected from the first dielectric material layers 764 can include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that can be configured to function as landing pads for through-memory-level via structures to be subsequently formed.

The landing-pad-level metal line structures 788 can be formed within a topmost dielectric material layer of the first dielectric material layers 764 (which can be a plurality of dielectric material layers). Each of the lower-level metal interconnect structures 780 can include a metallic nitride liner and a metal fill structure. Top surfaces of the landing-pad-level metal line structures 788 and the topmost surface of the first dielectric material layers 764 can be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 can include a single dielectric material layer or a plurality of dielectric material layers. Each dielectric material layer selected from the at least one second dielectric material layer 768 can include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional conductive plate layer 6 and in-process source-level material layers 10'.

The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, can include a tungsten layer having a thickness in a range from 3 nm to 100 nm, although lesser and greater thicknesses can also be used.

A metal nitride layer (not shown) can be provided as a diffusion barrier layer on top of the conductive plate layer 6. The conductive plate layer 6 can function as a special source line in the completed device. In addition, the conductive plate layer 6 can comprise an etch stop layer and can comprise any suitable conductive, semiconductor or insulating layer.

The optional conductive plate layer 6 can include a metallic compound material such as a conductive metallic nitride (e.g., TiN) and/or a metal (e.g., W). The thickness of the optional conductive plate layer 6 can be in a range from 5 nm to 100 nm, although lesser and greater thicknesses can also be used.

With reference to FIG. 1C, the in-process source-level material layers 10' can include various layers that can be subsequently modified to form source-level material layers. The source-level material layers, upon formation, include a source contact layer that functions as a common source region for vertical field effect transistors of a three-dimensional memory device. In one embodiment, the in-process source-level material layers 10' can include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 can include a doped semiconductor material such as doped polysilicon or doped amorphous silicon. The conductivity type of the lower source-level material layer 112 and the upper source-level semiconductor layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 can be in a range from 10 nm to 300 nm, such as from 20 nm to 150 nm, although lesser and greater thicknesses can also be used.

The source-level sacrificial layer 104 can include a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be used.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be used.

The source-level insulating layer 117 can include a dielectric material such as silicon oxide. The thickness of the source-level insulating layer 117 can be in a range from 20 nm to 400 nm, such as from 40 nm to 200 nm, although lesser and greater thicknesses can also be used. The optional source-select-level conductive layer 118 can include a conductive material that can be used as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-select-level conductive layer 118 can be in a range from 30 nm to 200 nm, such as from 60 nm to 100 nm, although lesser and greater thicknesses can also be used.

The in-process source-level material layers 10' can be formed directly above a subset of the semiconductor devices 710 on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 10' can be patterned to provide openings in areas in which through-memory-level via structures and through-dielectric contact via structures are to be subsequently formed. Patterned portions of the stack of the conductive plate layer 6 and the in-process source-level material layers 10' are present in each memory array region (also referred to as a "memory region") 100 in which three-dimensional memory stack structures are to be subsequently formed. Patterned portions of the stack of the conductive plate layer 6 and the in-process source-level material layers 10' can be present in each staircase region 200, which laterally surrounds a respective one of the memory array regions 100.

The region of the semiconductor devices 710 and the combination of the lower-level dielectric material layers 760 and the lower-level metal interconnect structures 780 is herein referred to an underlying support device region 700, which is located underneath a memory-level assembly to be subsequently formed and includes peripheral devices for the memory-level assembly. The lower-level metal interconnect structures 780 are formed in the lower-level dielectric material layers 760.

Each memory array region 100 can have a rectangular shape with sides extending along a first horizontal direction hd1 (e.g., word line direction) and along a second horizontal direction hd2 (e.g., bit line direction) that is perpendicular to the first horizontal direction hd1. Multiple memory array regions 100 can be laterally spaced among one another along the second horizontal direction hd2. An inter-array connection via region 600 (which is also referred to as a connection via region or bit line break area) or a bit line hookup region 500 (which is also referred to as a bit line tap region for bit line hook-up) can be provided between each neighboring pair of memory array regions 100 that is surrounded by a respective one of the staircase regions 200. A bit line hookup region 500 is a region in which vertical interconnections are subsequently formed between bit lines and the bit line peripheral circuitry 712, such as sense amplifier circuitry and the bit line driver circuitry of the underlying support device region 700. A inter-array connection via region 600 is a region in which via structures for power connections to the peripheral circuitry 712 in the underlying support device region 700 are to be formed and/or via structures for electrical signal connection between other nodes of memory stack structures to be subsequently formed and respective support circuitry of the underlying support device region 700 are to be subsequently formed. For example, a source power distribution network can include through-memory-level via structures to be subsequently formed in the inter-array connection via region 600.

Peripheral connection regions 400 are laterally spaced from the memory array regions 100 along the first horizontal direction hd1 (e.g., word line direction). The peripheral connection regions 400 can include row decoder circuit connections, such as via structures for providing electrical connections from row decoder circuits to word lines, which comprise the electrically conductive layers within alternating stacks of insulating layers and electrically conductive layers in the memory array regions 100 and the staircase regions 200. Word line contact via structures can be subsequently formed in segments of the staircase regions 200 that are proximal to the peripheral connection regions 400, and can be electrically connected to semiconductor devices in the support device region 700 through additional through-memory-level via structures to be subsequently formed in the peripheral connection regions 400.

The optional conductive plate layer 6 and the in-process source-level material layers 10' can be present in the memory array regions 100 and the staircase regions 200, and can be absent in the areas of the bit line hookup regions 500, the inter-array connection via region 600, and the peripheral connection regions 400. The memory array regions 100, the staircase regions 200, the peripheral connection regions 400, the bit line hookup regions 500, and the inter-array connection via region 600 shown in FIG. 1D may comprise an entire memory plane or a portion of a memory plane. One or more memory planes may be formed on the same substrate 8.

The lower-level metal interconnect structures 780 can be electrically connected to active nodes (e.g., transistor active regions 742 or gate electrodes 754) of the semiconductor devices 710 (e.g., CMOS devices), and can be located at the level of the lower-level dielectric material layers 760. Through-memory-level via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level via structures to be subsequently formed.

Figure 2:
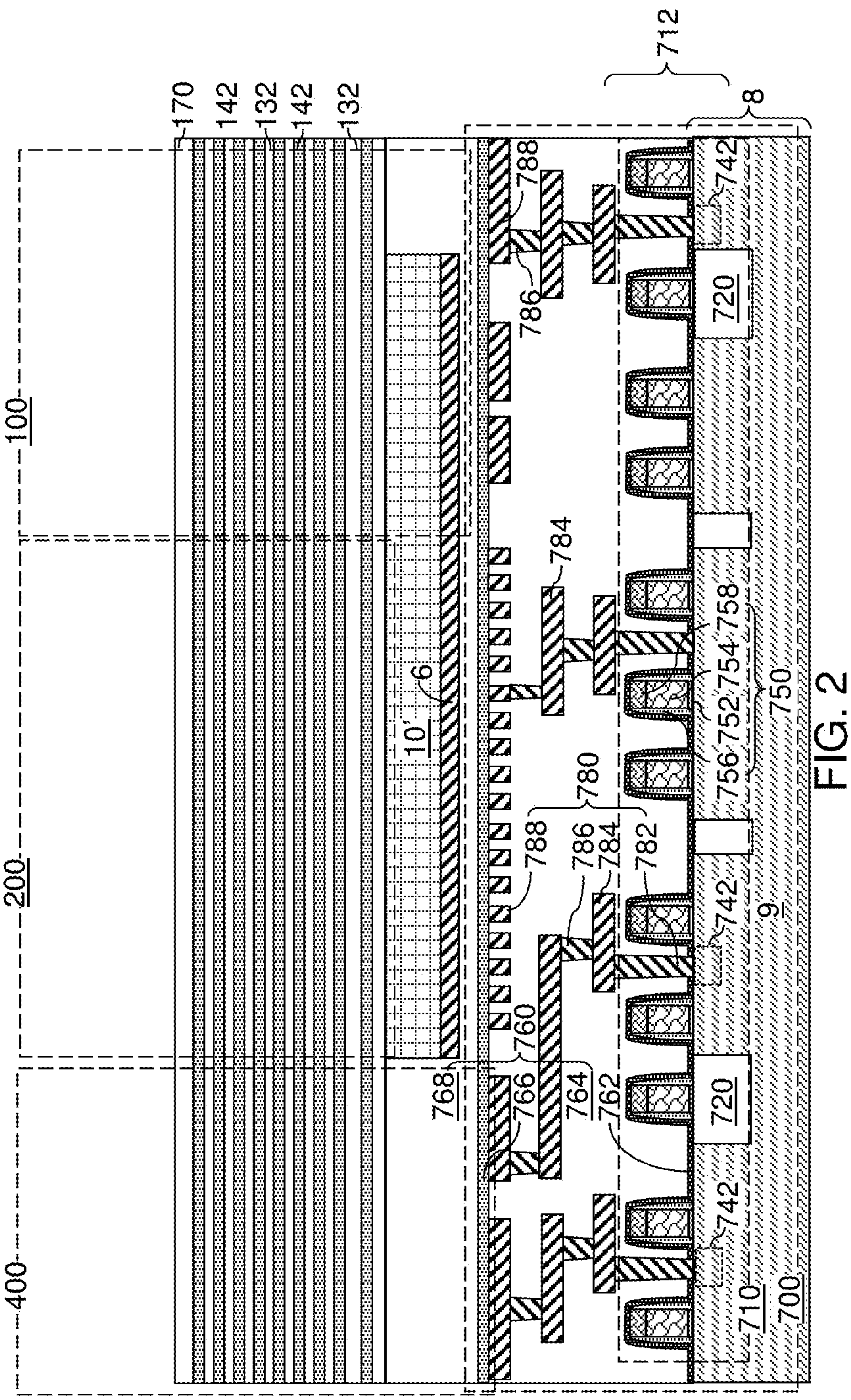
FIG. 2 is a vertical cross-sectional view of the first exemplary structure after formation of a first-tier alternating stack of first insulating layers and first spacer material layers according to the first embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers are subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements can have the same thickness throughout, or can have different thicknesses. The second elements can have the same thickness throughout, or can have different thicknesses. The alternating plurality of first material layers and second material layers can begin with an instance of the first material layers or with an instance of the second material layers, and can end with an instance of the first material layers or with an instance of the second material layers. In one embodiment, an instance of the first elements and an instance of the second elements can form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 can comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is used for the first insulating layers 132, tetraethylorthosilicate (TEOS) can be used as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first-tier alternating stack (132, 142) can have a uniform thickness that is substantially invariant within each respective first sacrificial material layer 142.

A first insulating cap layer 170 can be subsequently formed over the first-tier alternating stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the first insulating cap layer 170 can be in a range from 20 nm to 300 nm, although lesser and greater thicknesses can also be used.

Figure 3:
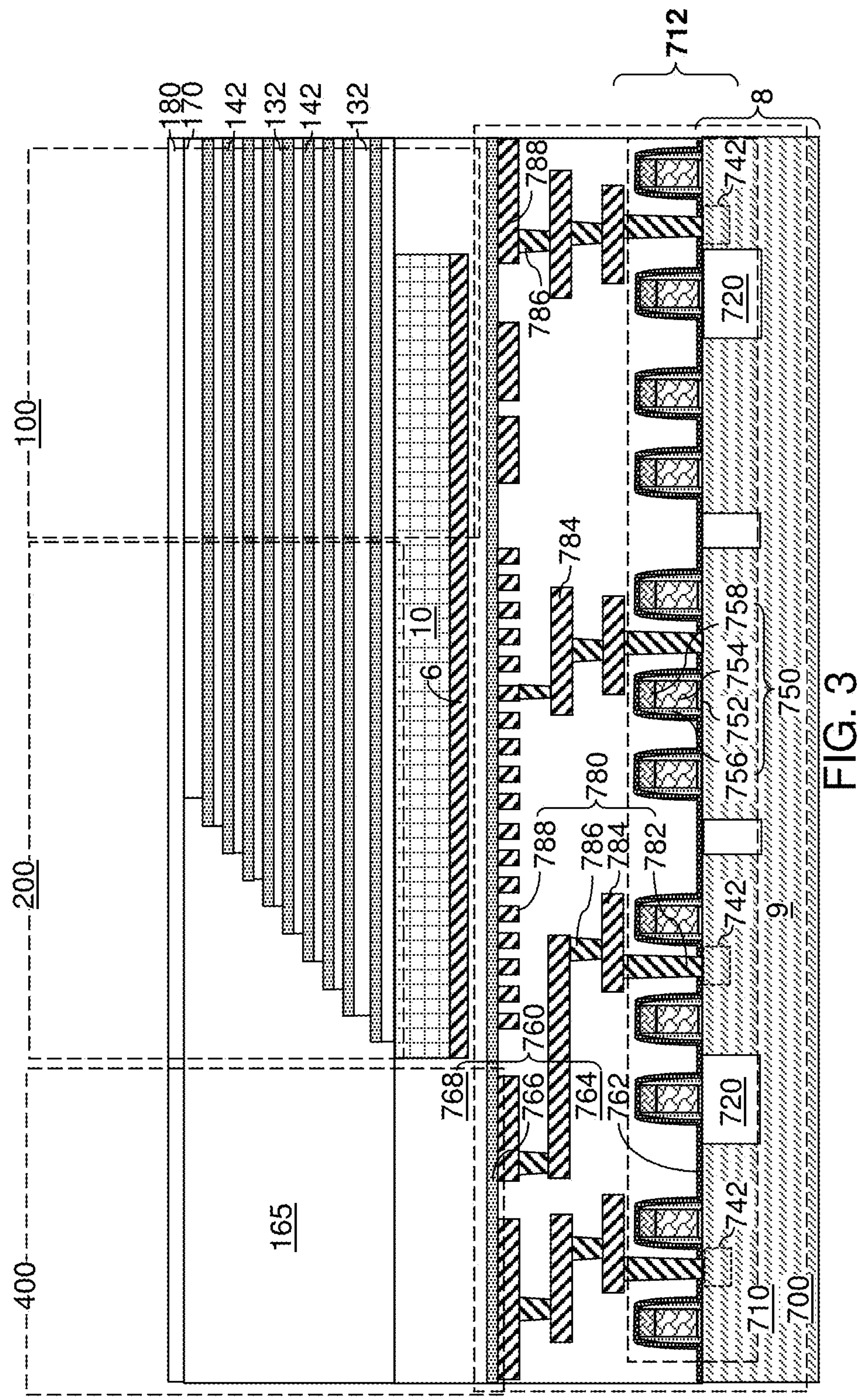
FIG. 3 is a vertical cross-sectional view of the first exemplary structure after patterning a first-tier staircase region, a first retro-stepped dielectric material portion, and an inter-tier dielectric layer according to the first embodiment of the present disclosure.

Referring to FIG. 3, the first insulating cap layer 170 and the first-tier alternating stack (132, 142) can be patterned to form first stepped surfaces in the staircase region 200. The staircase region 200 can include a respective first stepped area in which the first stepped surfaces can be formed, and a second stepped area in which additional stepped surfaces can be subsequently formed in a second-tier structure (to be subsequently formed over a first-tier structure) and/or additional tier structures. The first stepped surfaces can be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

The patterned portions of the first insulating cap layer 170 and the first-tier alternating stack (132, 142) can be present within the memory array regions 100 and in the staircase regions 200 without extending to the inter-array connection via regions 600, the bit line hookup regions 500, or the peripheral connection regions 400. The first stepped surfaces can be located within an outer annular segment of each staircase region 200. As used herein, an "annular" element refers to any element having an opening therethrough, and the shape of the opening may be circular, oval, polygonal, or of any closed curvilinear two-dimensional shape. Thus, the stepped cavity laterally can surround each of the memory array regions 100.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 can be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be used.

Figure 4A:
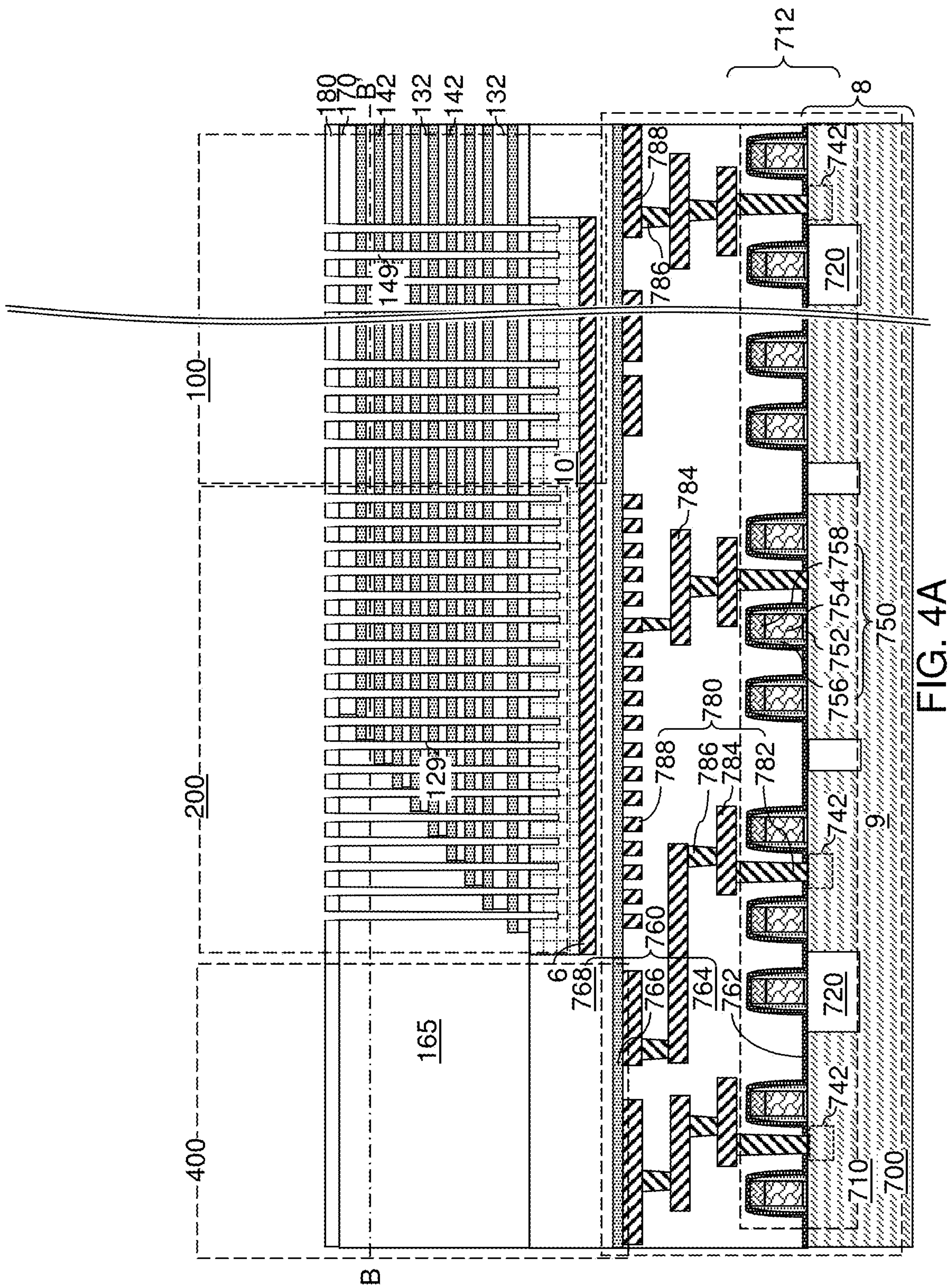
FIG. 4A is a vertical cross-sectional view of the first exemplary structure after formation of first-tier memory openings and first-tier support openings according to the first embodiment of the present disclosure.
Figure 4B:
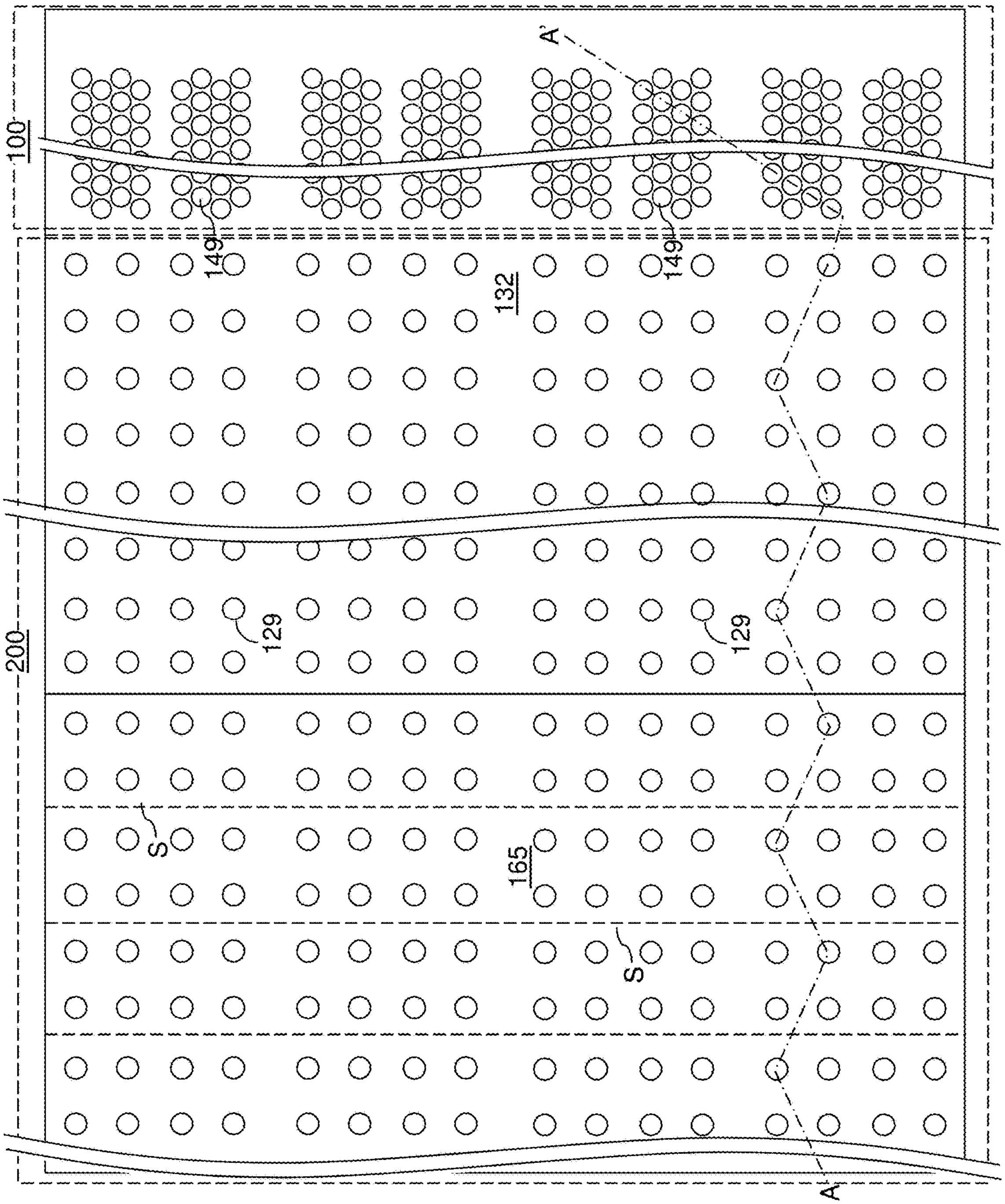
FIG. 4B is a horizontal cross-sectional view of the first exemplary structure of FIG. 4A. The hinged vertical plane A-A' corresponds to the plane of the vertical cross-sectional view of FIG. 4A.

Referring to FIGS. 4A and 4B, various first-tier openings (149, 129) can be formed through the inter-tier dielectric layer 180 and the first-tier structure (132, 142, 170, 165) and into the in-process source-level material layers 10'. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first isotropic etch process. The various first-tier openings (149, 129) can include first-tier memory openings 149 and first-tier support openings 129. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149.

The first-tier support openings 129 are openings that are formed in the staircase region 200 and are subsequently used to form staircase-region contact via structures that interconnect a respective pair of an underlying lower-level metal interconnect structure 780 (such as a landing-pad-level metal line structure 788) and an electrically conductive layer (which can be formed as one of the spacer material layers or can be formed by replacement of a sacrificial material layer within the electrically conductive layer). A subset of the first-tier support openings 129 that is formed through the first retro-stepped dielectric material portion 165 can be formed through a respective horizontal surface of the first stepped surfaces. Further, each of the first-tier support openings 129 can be formed directly above (i.e., above, and with an areal overlap with) a respective one of the lower-level metal interconnect structure 780.

In one embodiment, the first anisotropic etch process can include an initial step in which the materials of the first-tier alternating stack (132, 142) are etched concurrently with the material of the first retro-stepped dielectric material portion 165. The chemistry of the initial etch step can alternate to optimize etching of the first and second materials in the first-tier alternating stack (132, 142) while providing a comparable average etch rate to the material of the first retro-stepped dielectric material portion 165. The first anisotropic etch process can use, for example, a series of reactive ion etch processes or a single reaction etch process (e.g., $CF_4/O_2/Ar$ etch). The sidewalls of the various first-tier openings (149, 129) can be substantially vertical, or can be tapered.

After etching through the alternating stack (132, 142) and the first retro-stepped dielectric material portion 165, the chemistry of a terminal portion of the first anisotropic etch process can be selected to etch through the dielectric material(s) of the at least one second dielectric layer 768 with a higher etch rate than an average etch rate for the in-process source-level material layers 10'. For example, the terminal portion of the anisotropic etch process can include a step that etches the dielectric material(s) of the at least one second dielectric layer 768 selective to a semiconductor material within a component layer in the in-process source-level material layers 10'. In one embodiment, the terminal portion of the first anisotropic etch process can etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process can include at least one etch chemistry for etching the various semiconductor materials of the in-process source-level material layers 10'. The photoresist layer can be subsequently removed, for example, by ashing.

Optionally, the portions of the first-tier memory openings 149 and the first-tier support openings 129 at the level of the inter-tier dielectric layer 180 can be laterally expanded by an isotropic etch. In this case, the inter-tier dielectric layer 180 can comprise a dielectric material (such as borosilicate glass) having a greater etch rate than the first insulating layers 132 (that can include undoped silicate glass) in dilute hydrofluoric acid. An isotropic etch (such as a wet etch using HF) can be used to expand the lateral dimensions of the first-tier memory openings 149 at the level of the inter-tier dielectric layer 180. The portions of the first-tier memory openings 149 located at the level of the inter-tier dielectric layer 180 can be optionally widened to provide a larger landing pad for second-tier memory openings to be subsequently formed through a second-tier alternating stack (to be subsequently formed prior to formation of the second-tier memory openings).

Figure 5:
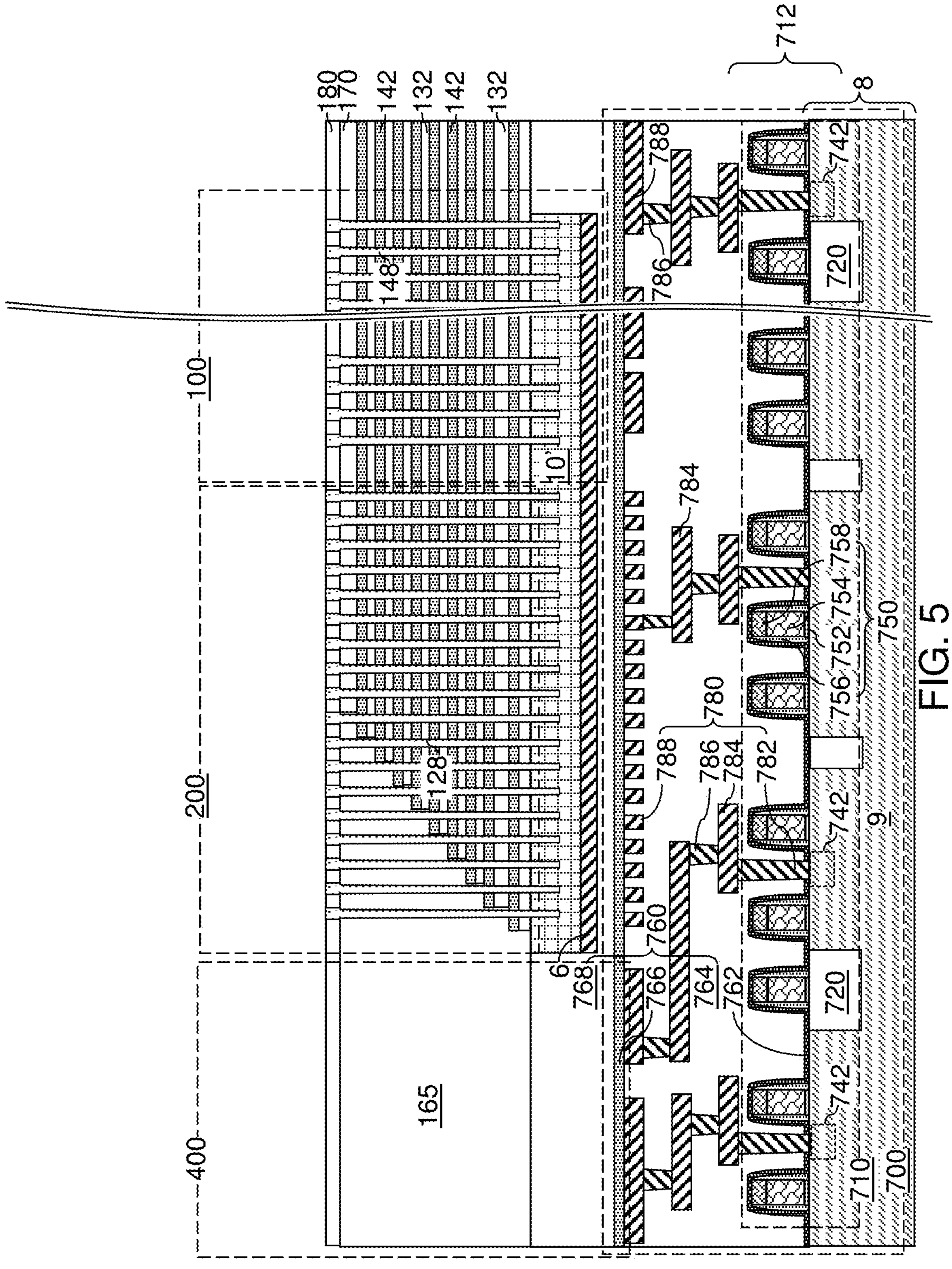
FIG. 5 is a vertical cross-sectional view of the first exemplary structure after formation of various sacrificial fill structures according to the first embodiment of the present disclosure.

Referring to FIG. 5, sacrificial first-tier opening fill portions (148, 128) can be formed in the various first-tier openings (149, 129). For example, a sacrificial first-tier fill material is deposited concurrently deposited in each of the first-tier openings (149, 129). The sacrificial first-tier fill material can include a material that can be subsequently removed selective to the materials of the first insulating layers 132 and the first sacrificial material layers 142.

In one embodiment, the sacrificial first-tier fill material can include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) can be used prior to depositing the sacrificial first-tier fill material. The sacrificial first-tier fill material can be formed by a non-conformal deposition or a conformal deposition method.

In another embodiment, the sacrificial first-tier fill material can include a silicon oxide material having a higher etch rate than the materials of the first insulating layers 132, the first insulating cap layer 170, and the inter-tier dielectric layer 180. For example, the sacrificial first-tier fill material can include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) can be used prior to depositing the sacrificial first-tier fill material. The sacrificial first-tier fill material can be formed by a non-conformal deposition or a conformal deposition method.

In yet another embodiment, the sacrificial first-tier fill material can include amorphous silicon or a carbon-containing material (such as amorphous carbon or diamond-like carbon) that can be subsequently removed by ashing, or a silicon-based polymer that can be subsequently removed selective to the materials of the first-tier alternating stack (132, 142).

Portions of the deposited sacrificial material can be removed from above the topmost layer of the first-tier alternating stack (132, 142), such as from above the inter-tier dielectric layer 180. For example, the sacrificial first-tier fill material can be recessed to a top surface of the inter-tier dielectric layer 180 using a planarization process. The planarization process can include a recess etch, chemical mechanical planarization (CMP), or a combination thereof. The top surface of the inter-tier dielectric layer 180 can be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Figure 6:
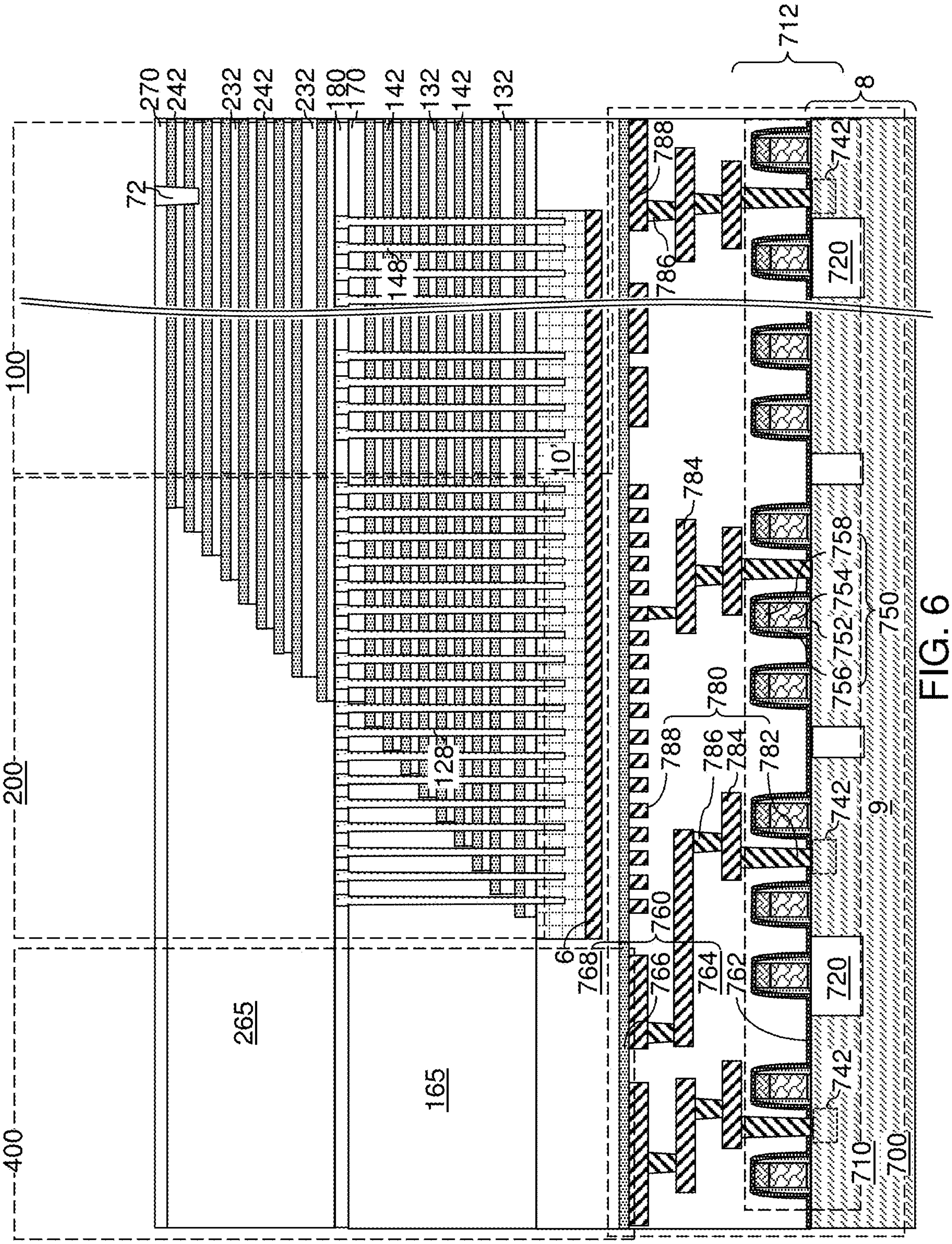
FIG. 6 is a vertical cross-sectional view of the first exemplary structure after formation of a second-tier alternating stack of second insulating layers and second spacer material layers, second stepped surfaces, and a second retro-stepped dielectric material portion according to the first embodiment of the present disclosure.

Referring to FIG. 6, a second-tier structure can be formed over the first-tier structure (132, 142, 170, 148). The second-tier structure can include an additional alternating stack of insulating layers and spacer material layers, which can be sacrificial material layers. For example, a second-tier alternating stack (232, 242) of material layers can be subsequently formed on the top surface of the first-tier alternating stack (132, 142). The second-tier alternating stack (232, 242) can include an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 can be a sacrificial material that can be removed selective to the third material of the second insulating layers 232. The second sacrificial material layers 242 can comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second-tier alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be used for the second insulating layers 232 can be any material that can be used for the first insulating layers 132. The fourth material of the second sacrificial material layers 242 is a sacrificial material that can be removed selective to the third material of the second insulating layers 232. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second-tier alternating stack (232, 242) can have a uniform thickness that is substantially invariant within each respective second sacrificial material layer 242.

Second stepped surfaces in the second stepped area can be formed in the staircase region 200 using a same set of processing steps as the processing steps used to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second-tier alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 can include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
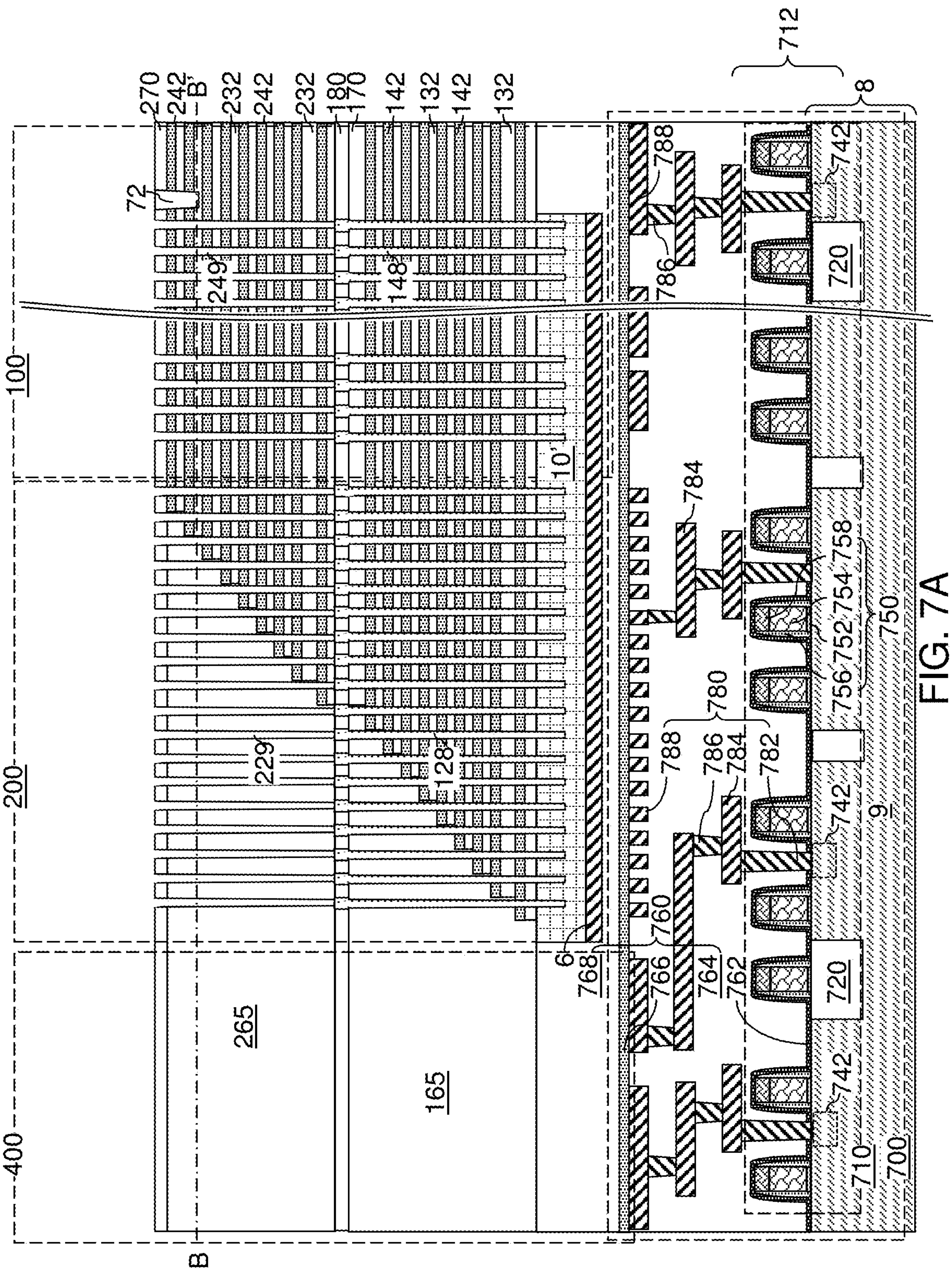
FIG. 7A is a vertical cross-sectional view of the first exemplary structure after formation of second-tier memory openings and second-tier support openings according to the first embodiment of the present disclosure.
Figure 7B:
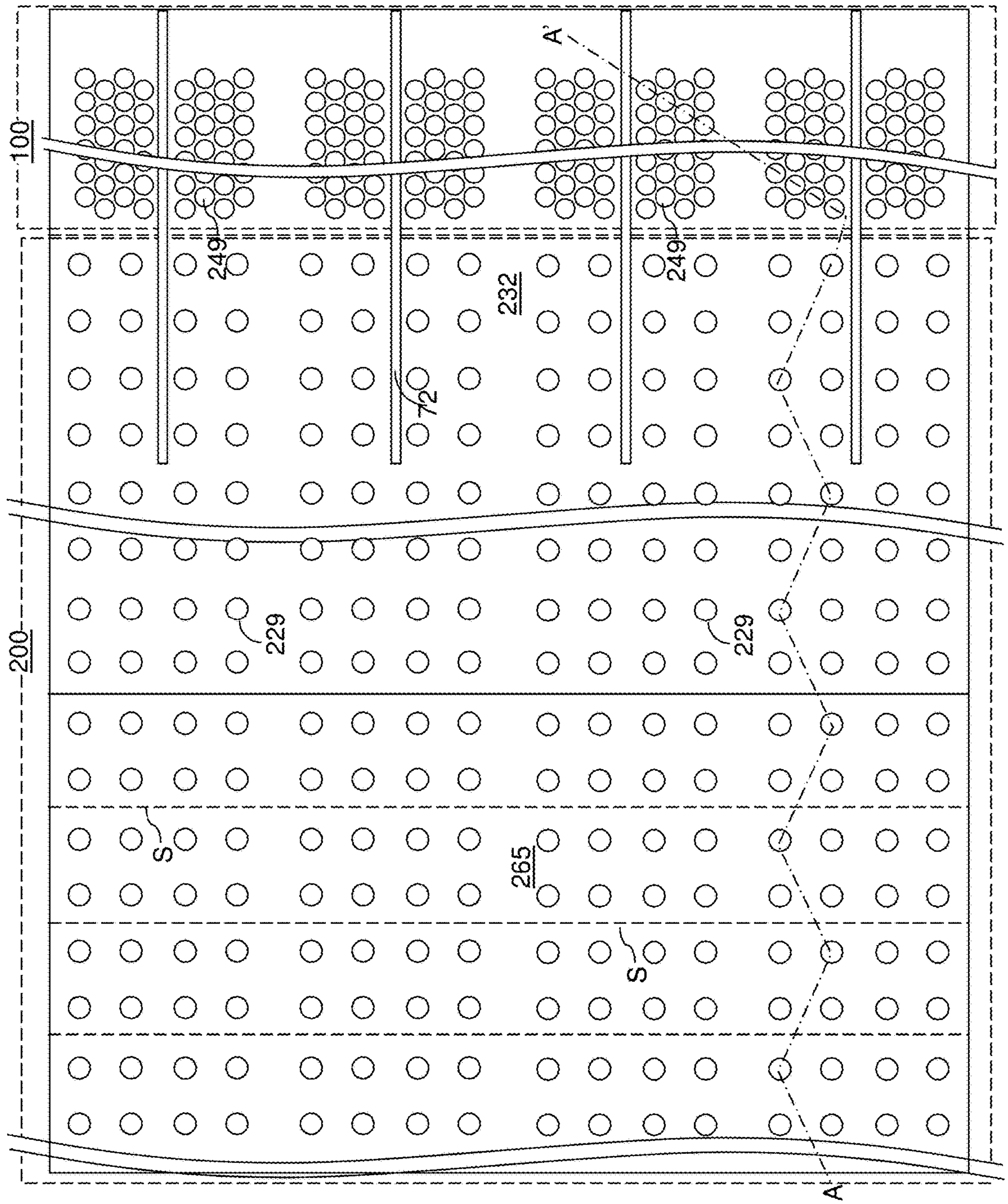
FIG. 7B is a horizontal cross-sectional view of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask used to pattern the first-tier openings (149, 129) can be used to pattern the photoresist layer.

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 can be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can use, for example, a series of reactive ion etch processes or a single reaction etch process (e.g., $CF_4/O_2/Ar$ etch). The sidewalls of the various second-tier openings (249, 229) can be substantially vertical, or can be tapered. A bottom periphery of each second-tier opening (249, 229) can be laterally offset, and/or can be located entirely within, a periphery of a top surface of an underlying sacrificial first-tier opening fill portion (148, 128). The photoresist layer can be subsequently removed, for example, by ashing.

Figure 8:
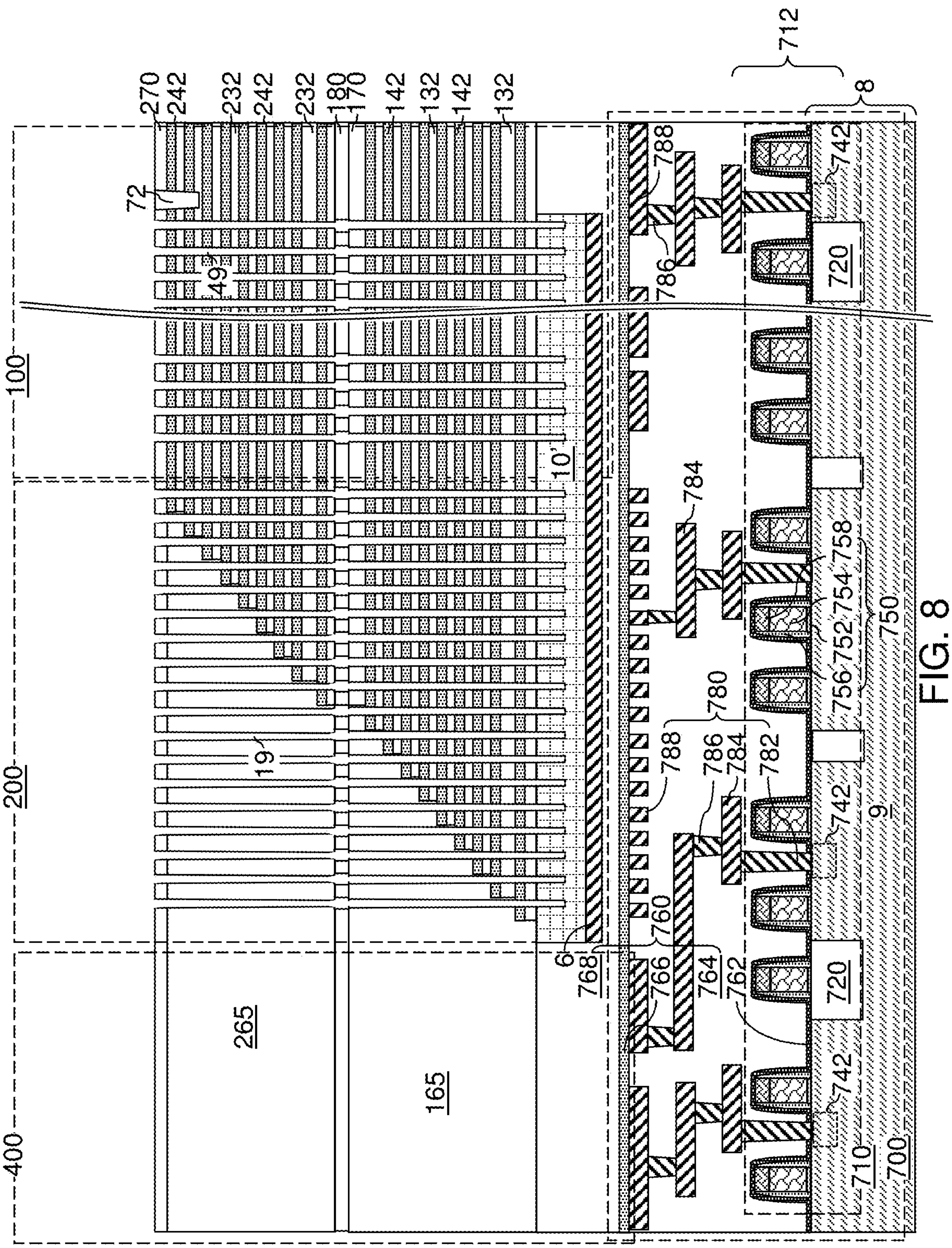
FIG. 8 is a vertical cross-sectional view of the first exemplary structure after formation of inter-tier memory openings and inter-tier support openings according to the first embodiment of the present disclosure.

Referring to FIG. 8, the sacrificial first-tier fill material of the sacrificial first-tier opening fill portions (148, 128) can be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. In one embodiment, the same structural change occurs in each of the memory openings 49 and the support openings 19. In an alternative embodiment, the support openings 19 may be filled with dielectric support pillars without forming the semiconductor channel material in the support openings 19.

Figure 9B:
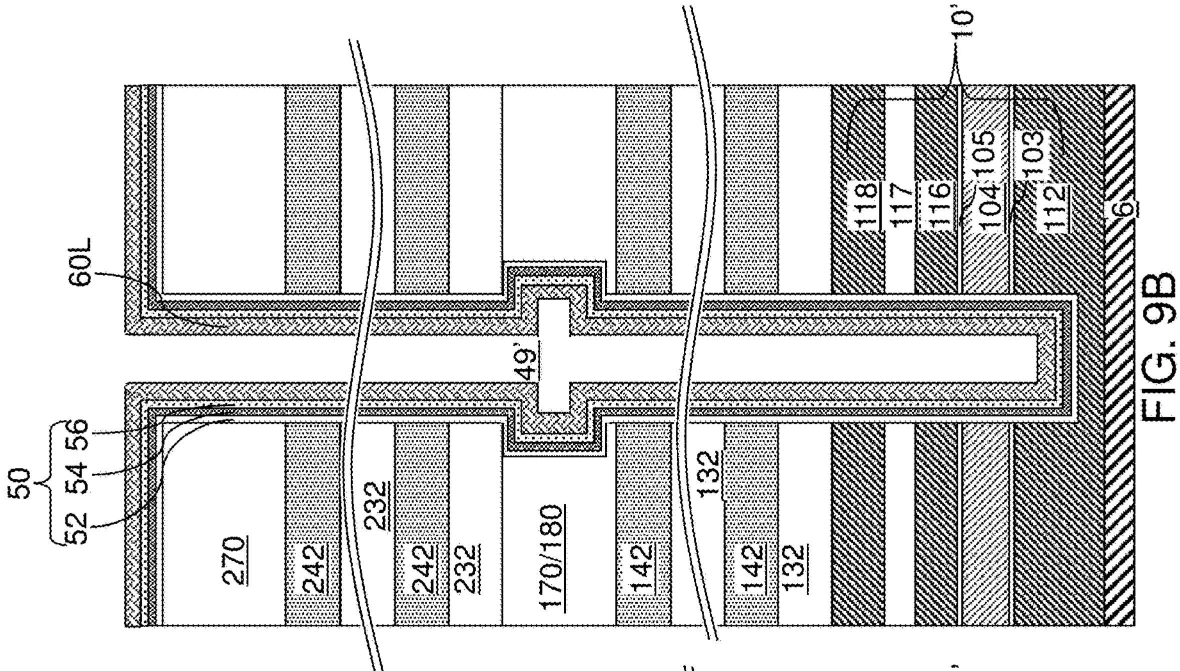
FIGS. 9A-9D illustrate sequential vertical cross-sectional views of a memory opening during formation of a memory opening fill structure according to the first embodiment of the present disclosure.
Figure 9A:
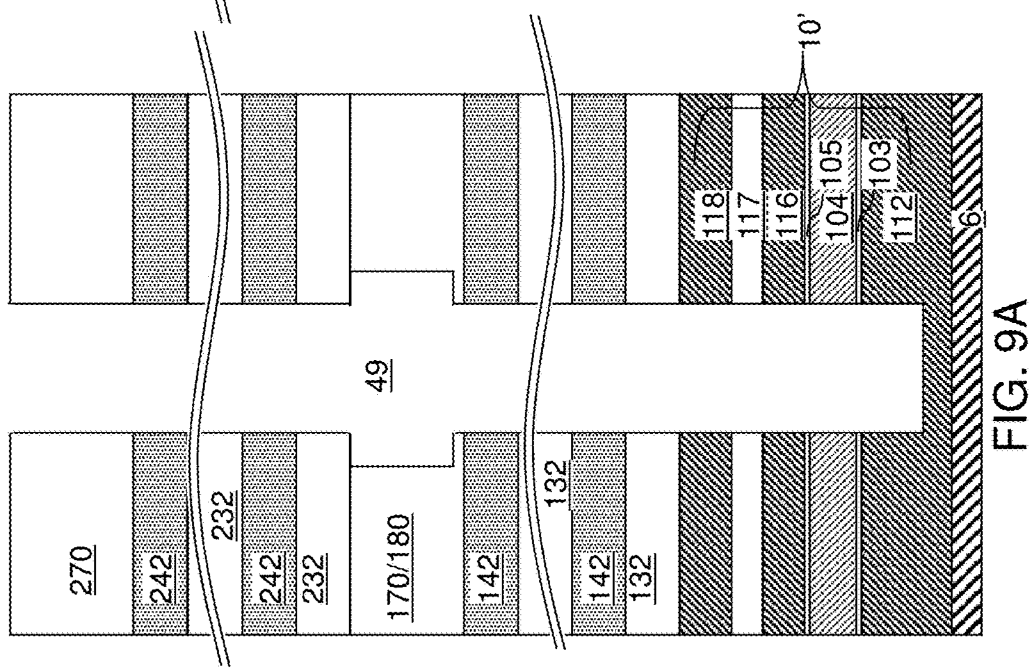

Referring to FIG. 9A, a memory opening 49 in the first exemplary device structure of FIG. 8 is illustrated. The memory opening 49 can extend through the first-tier structure and the second-tier structure.

Referring to FIG. 9B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide can consist essentially of the at least one metallic element and oxygen, or can consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. Alternatively, the sacrificial material layers (142, 242) can be laterally recessed with respect to the sidewalls of the insulating layers (132, 232), and a combination of a deposition process and an anisotropic etch process can be used to form the charge storage layer 54 as a plurality of memory material portions that are vertically spaced apart. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling can be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L can having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{15}/cm^3$ to $1.0\times10^{19}/cm^3$, such as from $1.0\times10^{16}/cm^3$ to $1.0\times10^{18}/cm^3$. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be used. A cavity 49' is formed in the volume of each memory opening 49 that is not filled with the deposited material layers (52, 54, 56, 60L).

Figure 9C:
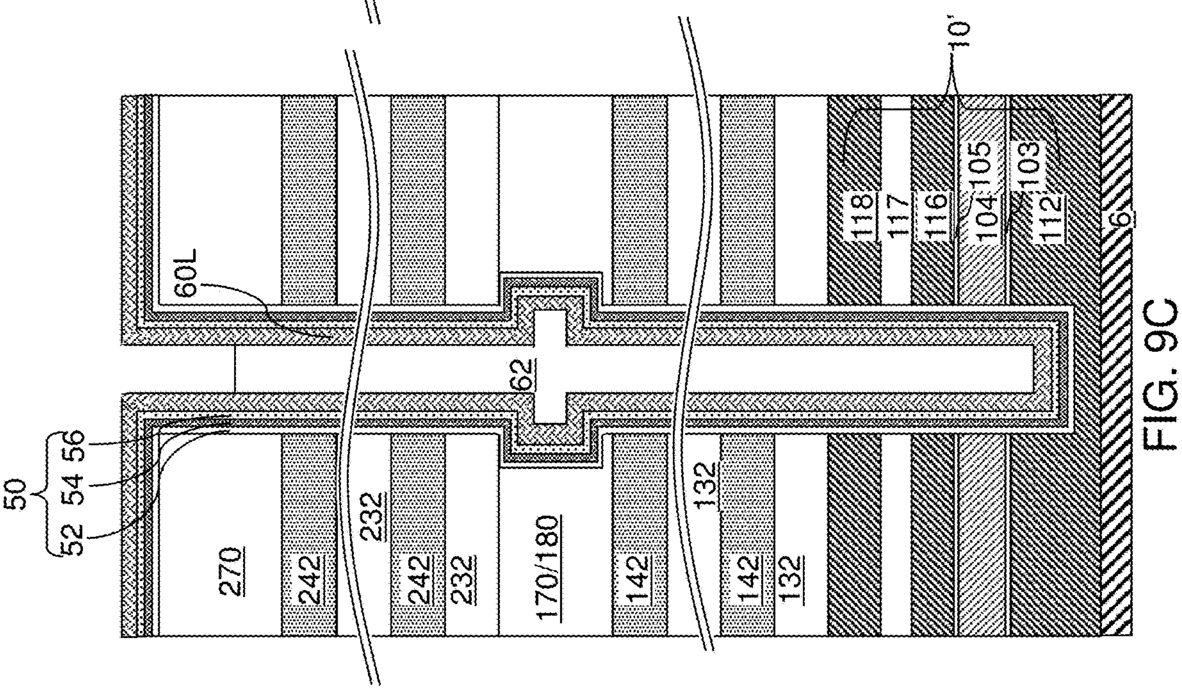

Referring to FIG. 9C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Figure 9D:
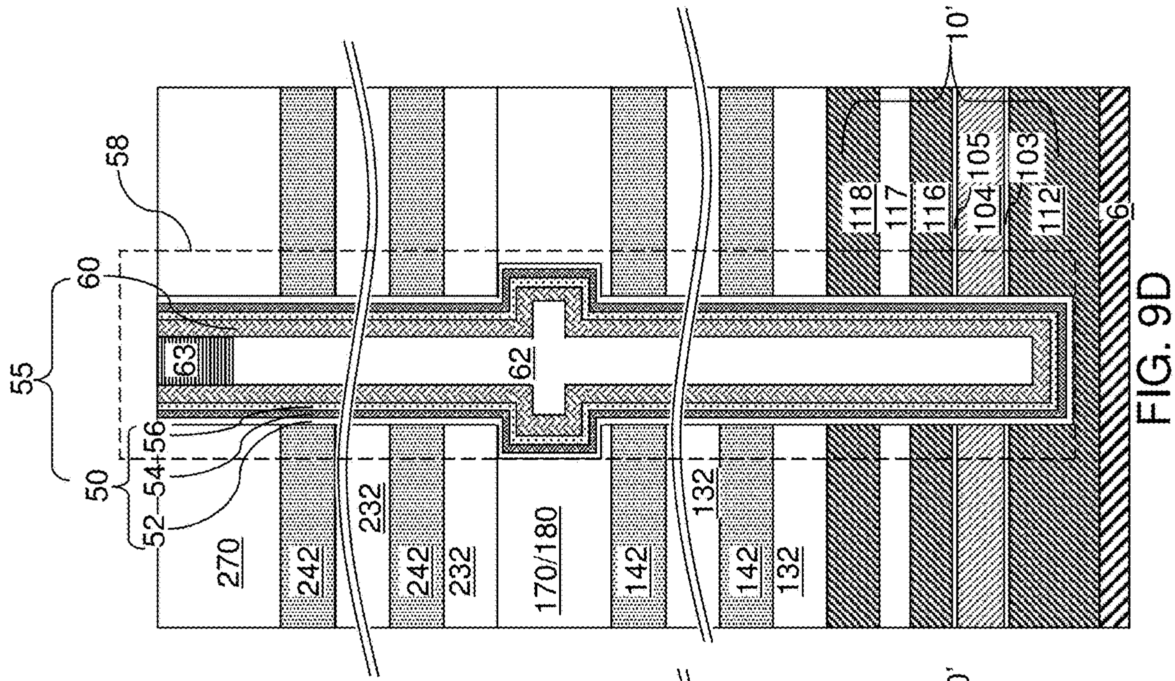
Figure 10A:
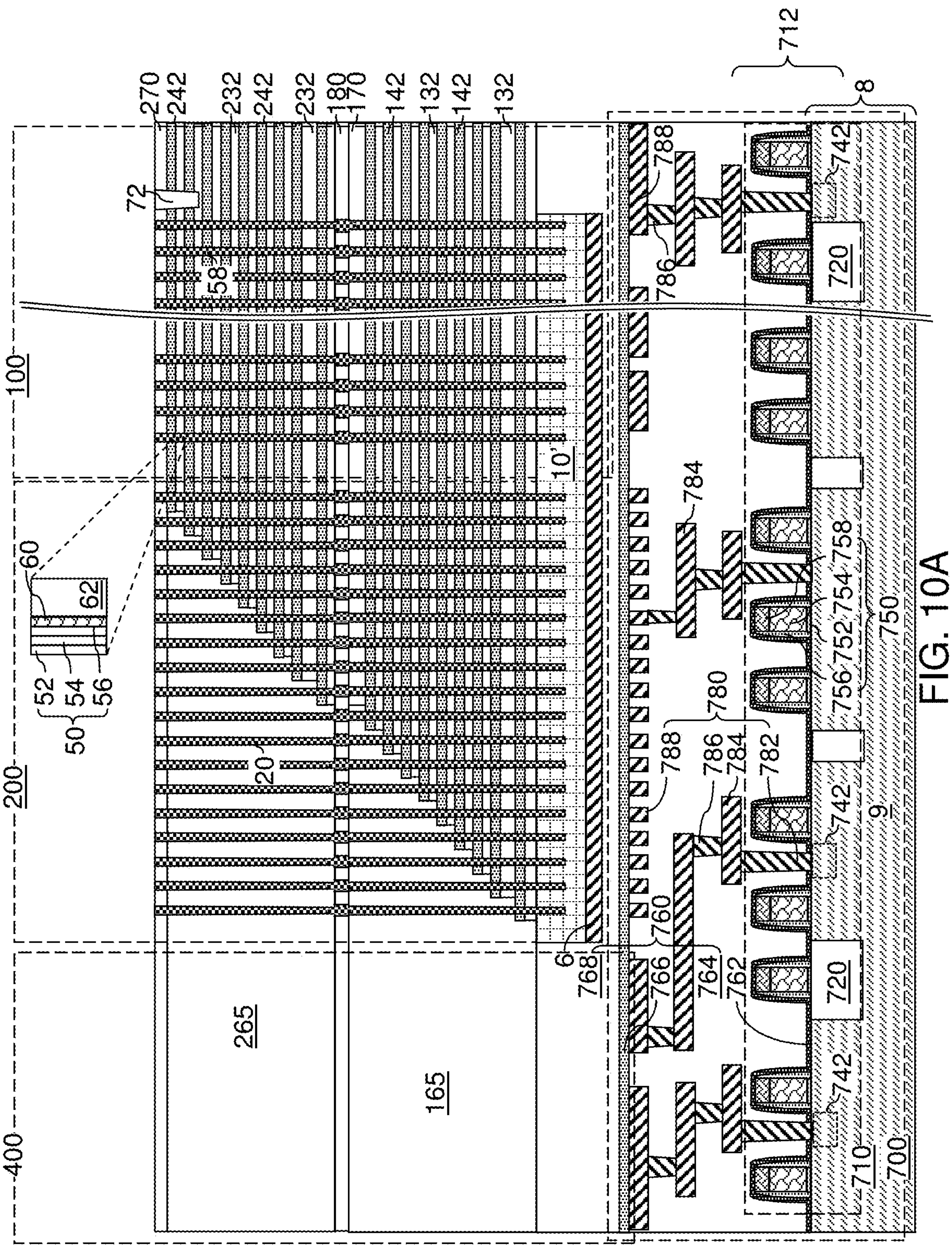
FIG. 10A is a vertical cross-sectional view of the first exemplary structure after formation of memory opening fill structures and support pillar structures according to the first embodiment of the present disclosure.
Figure 10B:
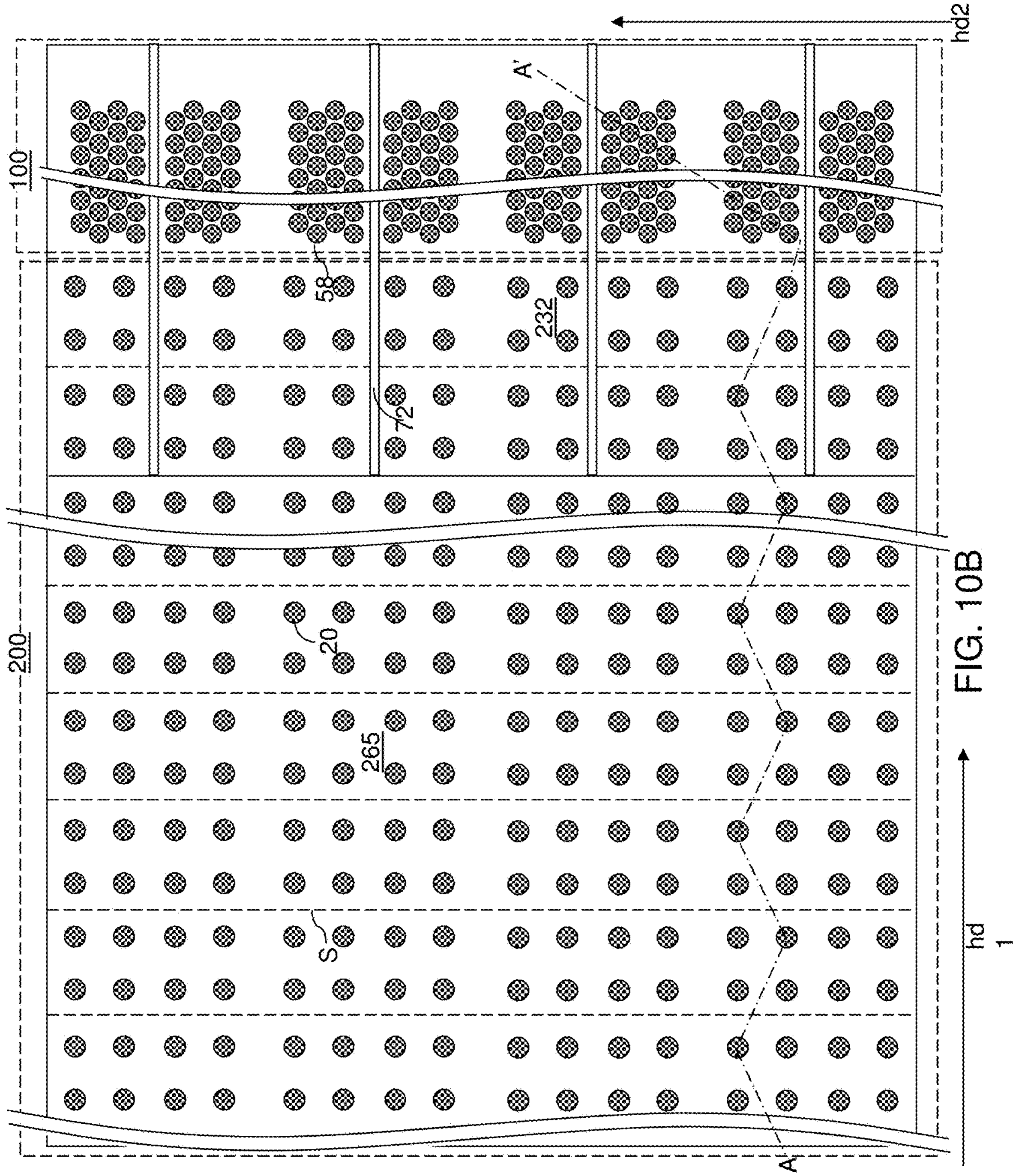
FIG. 10B is a top-down view of the first exemplary structure of FIG. 10A. The hinged vertical plane A-A' corresponds to the plane of the vertical cross-sectional view of FIG. 10A.
Figure 10C:
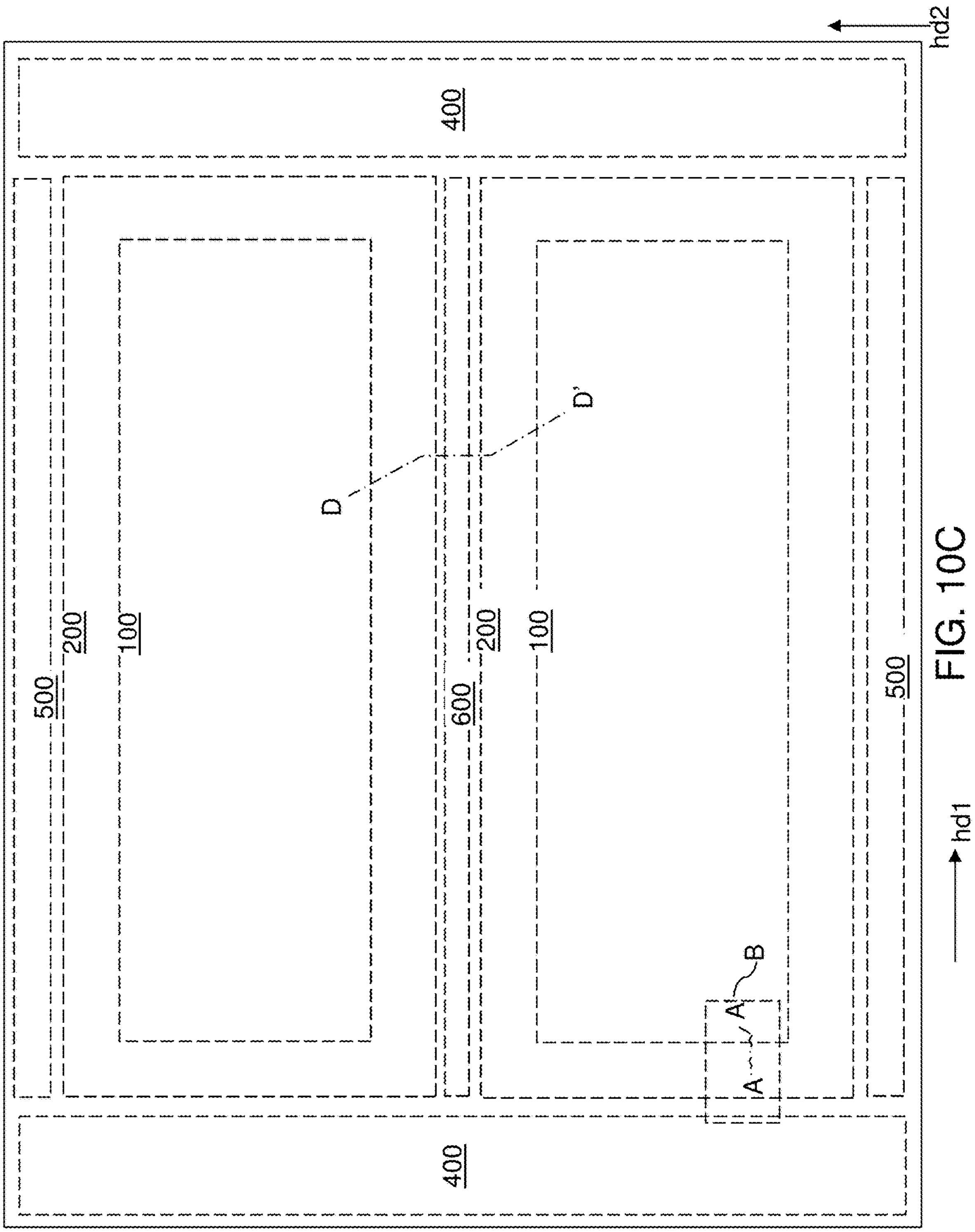
FIG. 10C is a top-down view of the first exemplary structure of FIGS. 10A and 10B over a larger area than the area shown in FIG. 10B. The area B corresponds to the area illustrated in FIG. 10B. The hinged vertical plane A-A' corresponds to the plane of the vertical cross-sectional view of FIG. 10A.
Figure 10D:
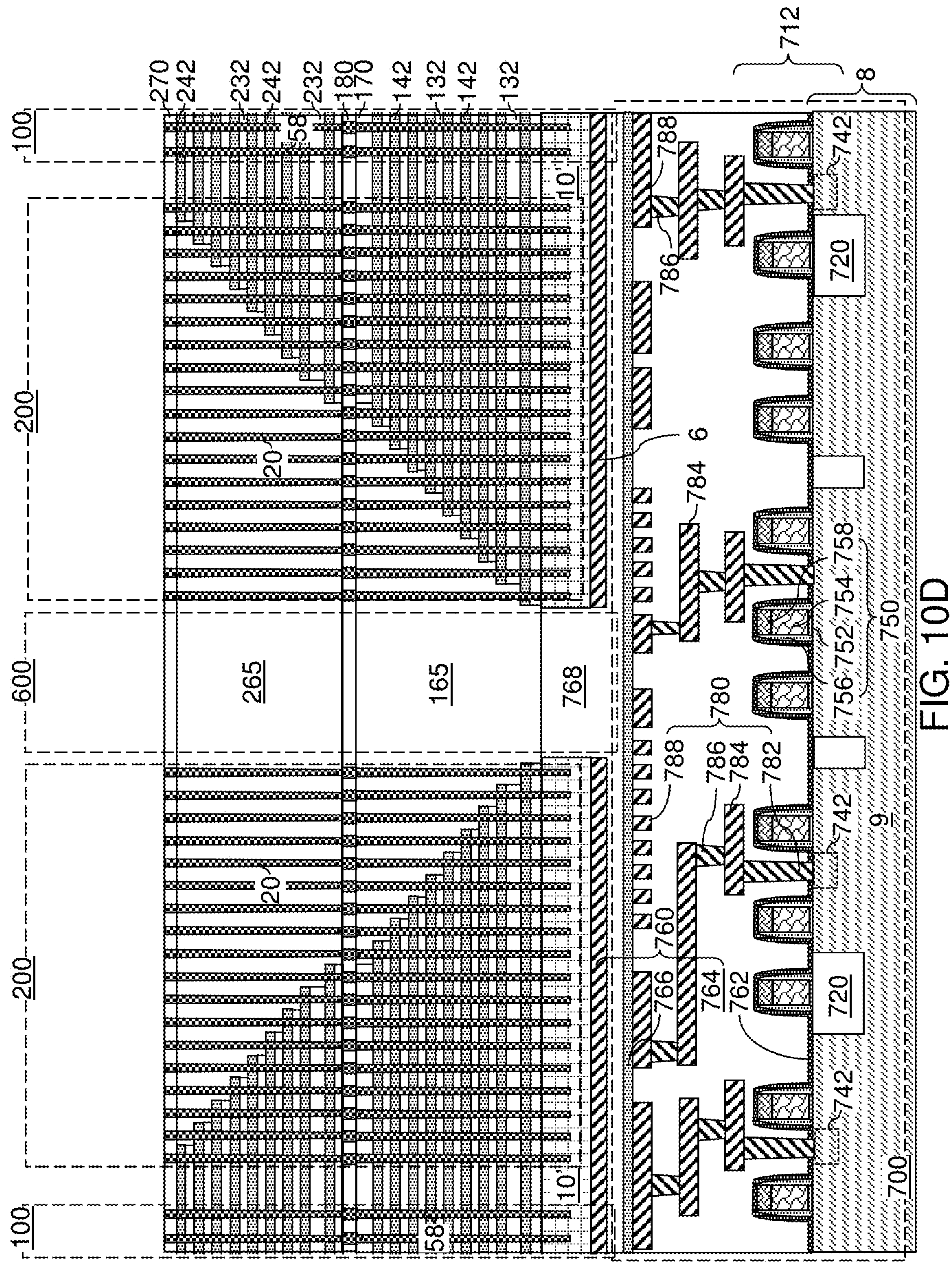
FIG. 10D is a vertical cross-sectional view of the first exemplary structure along the hinged vertical plane D-D' of FIG. 10C.
Figure 11A:
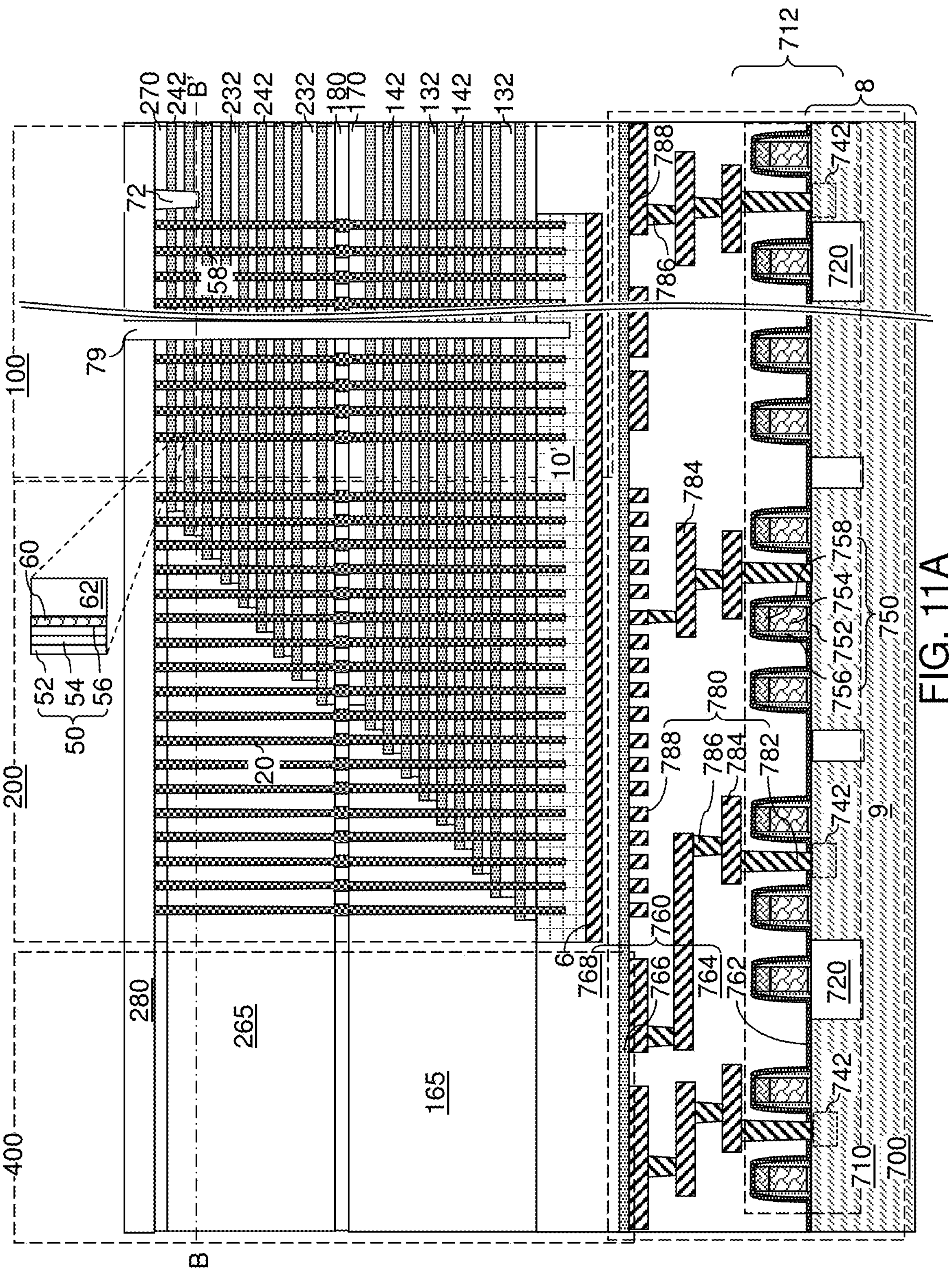
FIG. 11A is a vertical cross-sectional view of the first exemplary structure after formation of a first contact level dielectric layer and backside trenches according to the first embodiment of the present disclosure.
Figure 11B:
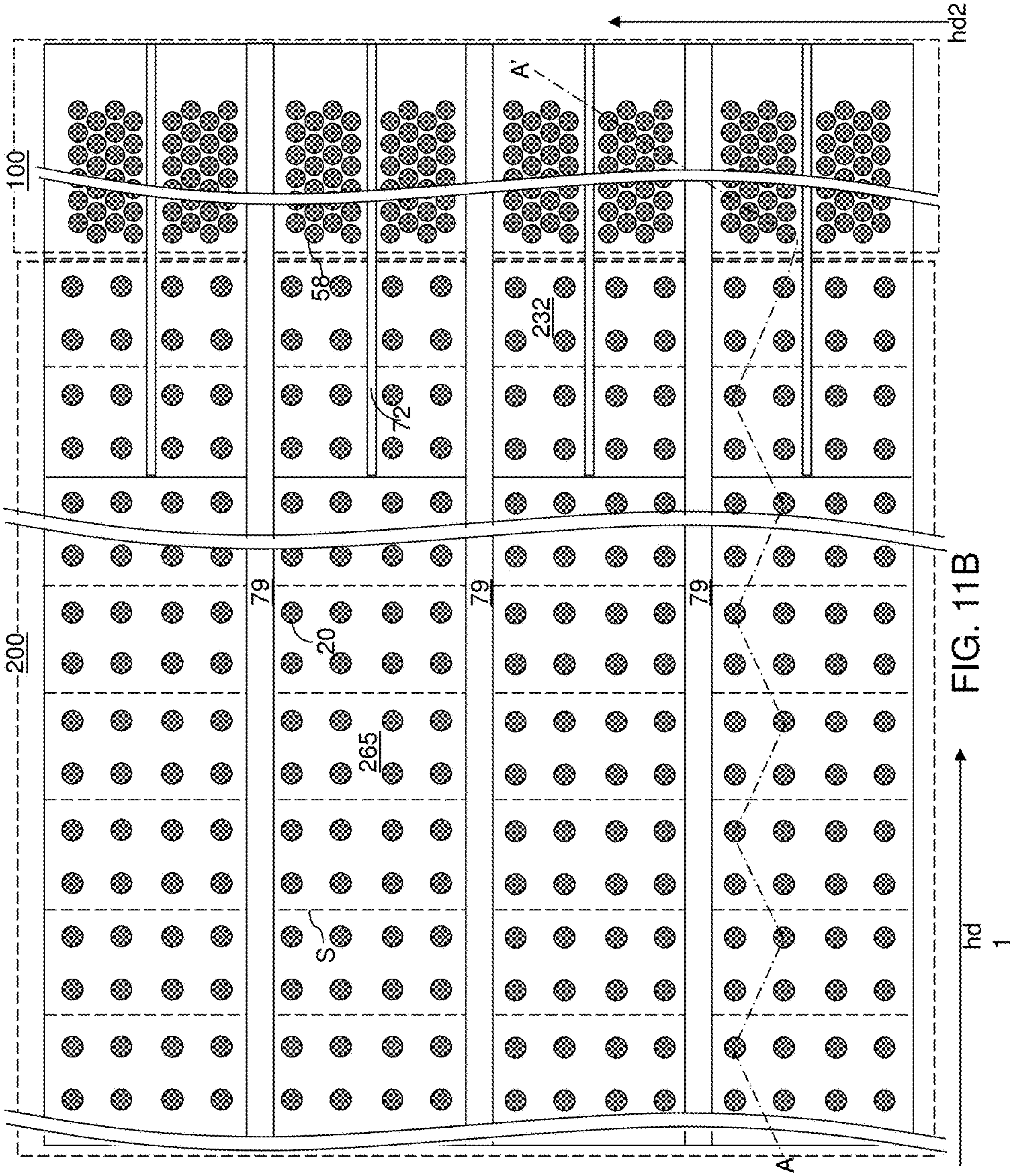
FIG. 11B is a horizontal cross-sectional view of the first exemplary structure along the horizontal plane B-B' of FIG. 11A. The hinged vertical plane A-A' corresponds to the plane of the vertical cross-sectional view of FIG. 11A.
Figure 11C:
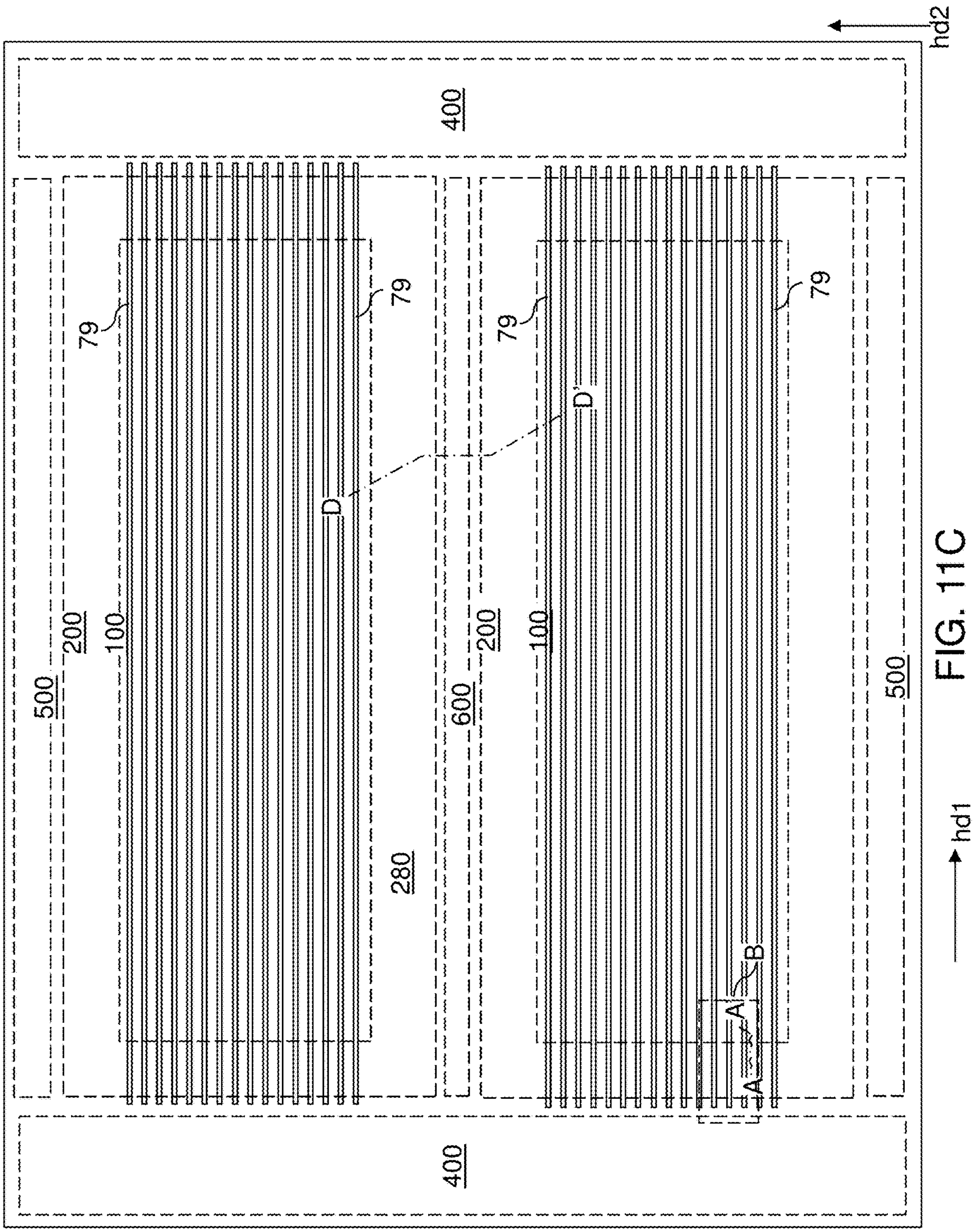
FIG. 11C is a top-down view of the first exemplary structure of FIGS. 11A and 11B over a larger area than the area shown in FIG. 11B. The area B corresponds to the area illustrated in FIG. 10B. The hinged vertical plane A-A' corresponds to the plane of the vertical cross-sectional view of FIG. 11A.
Figure 11D:
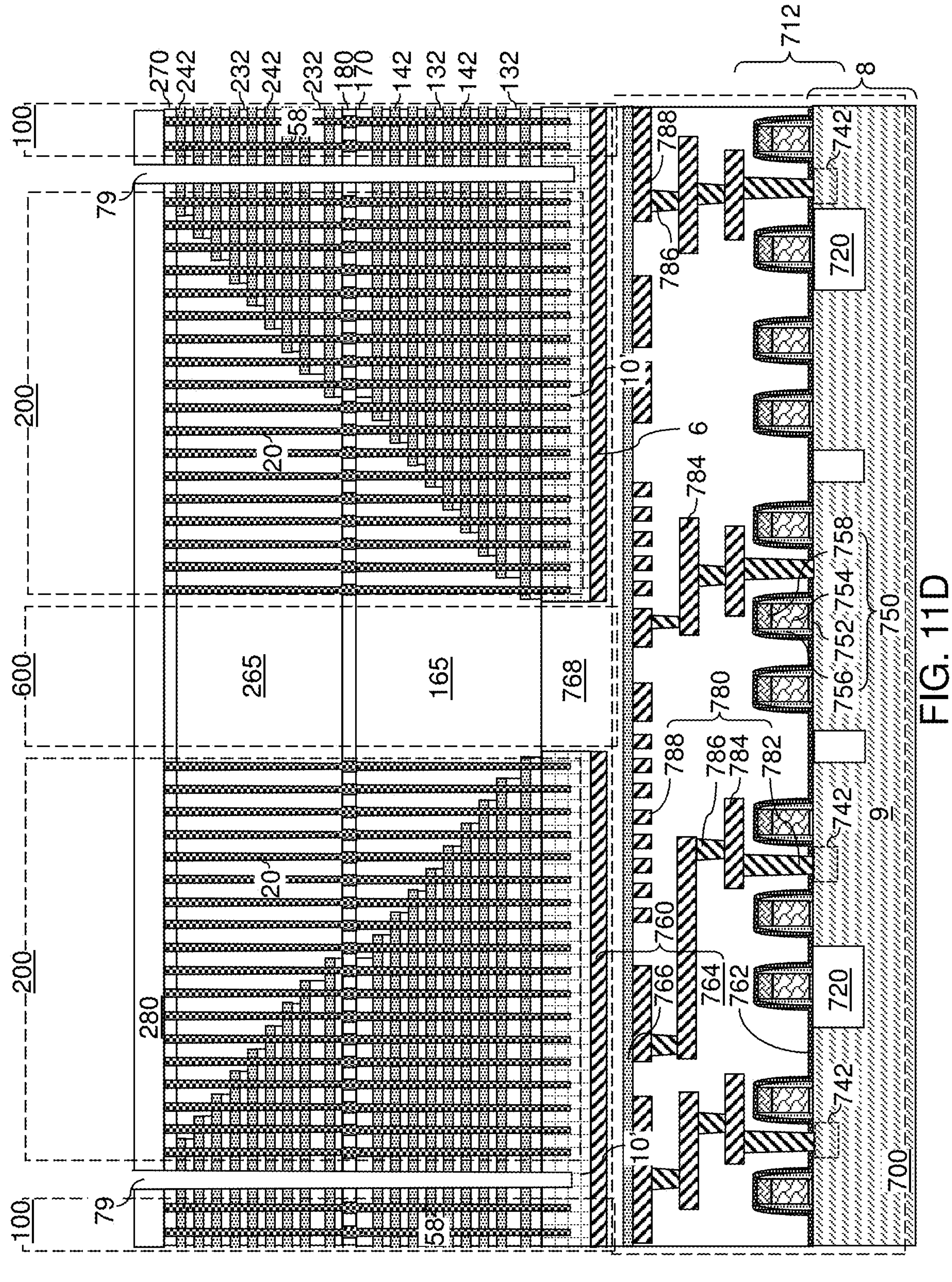
FIG. 11D is a vertical cross-sectional view of the first exemplary structure along the hinged vertical plane D-D' of FIG. 11C.

Referring to FIG. 9D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the n-doped semiconductor material constitutes a drain region 63. The dopant concentration in the drain regions 63 can be in a range from $5.0\times10^{19}/cm^3$ to $2.0\times10^{21}/cm^3$, although lesser and greater dopant concentrations can also be used. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer can be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 can constitute a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 can constitute a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Referring to FIGS. 10A-10D, the first exemplary structure is illustrated after formation of the memory opening fill structures 58. Support pillar structures 20 are formed in the support openings 19 concurrently with formation of the memory opening fill structures 58. Each support pillar structure 20 can have a same set of components as a memory opening fill structure 58. The retro-stepped dielectric material portions (165, 265) can cover the entire area of the inter-array connection via regions 600, the bit line hookup regions 500, and the peripheral connection regions 400, and overlie, and contact, the stepped surfaces within each of the staircase regions 200.

Referring to FIGS. 11A-11D, a first contact level dielectric layer 280 can be formed over the second-tier structure (232, 242, 270, 265, 72). The first contact level dielectric layer 280 includes a dielectric material such as silicon oxide, and can be formed by a conformal or non-conformal deposition process. For example, the first contact level dielectric layer 280 can include undoped silicate glass and can have a thickness in a range from 100 nm to 600 nm, although lesser and greater thicknesses can also be used.

A photoresist layer can be applied over the first contact level dielectric layer 280 and can be lithographically patterned to form elongated openings that extend along the first horizontal direction hd1 between clusters of memory opening fill structures 58. Backside trenches 79 can be formed by transferring the pattern in the photoresist layer (not shown) through the first contact level dielectric layer 280, the second-tier structure (232, 242, 270, 265, 72), and the first-tier structure (132, 142, 170, 165), and into the in-process source-level material layers 10'. Portions of the first contact level dielectric layer 280, the second-tier structure (232, 242, 270, 265, 72), the first-tier structure (132, 142, 170, 165), and the in-process source-level material layers 10' that underlie the openings in the photoresist layer can be removed to form the backside trenches 79. In one embodiment, the backside trenches 79 can be formed between clusters of memory stack structures 55. The clusters of the memory stack structures 55 can be laterally spaced apart along the second horizontal direction hd2 by the backside trenches 79. While it is desirable for the backside trenches 79 to be formed with completely straight sidewalls, the backside trenches 79 are often formed with local width variations with non-straight surfaces due to various effects including local variations of process parameters (such as local variations in gas flow, pressure, electrical field, etc.) and charge density variations within the first exemplary structure due to local layout variations of conductive components within the first exemplary structure.

Each alternating stack of insulating layers (132, 232) and sacrificial material layers (142, 242) is divided into a group of alternating stacks of insulating layers (132, 232) and sacrificial material layers (142, 242) in each contiguous combination of a memory array region 100 and a staircase region 200. Two neighboring groups of alternating stacks of insulating layers (132, 232) and sacrificial material layers (142, 242) can be laterally spaced from each other along the second horizontal direction hd2 by a respective one of the inter-array connection via regions 600 or by a respective one of the bit line hookup regions 500.

Figure 12:
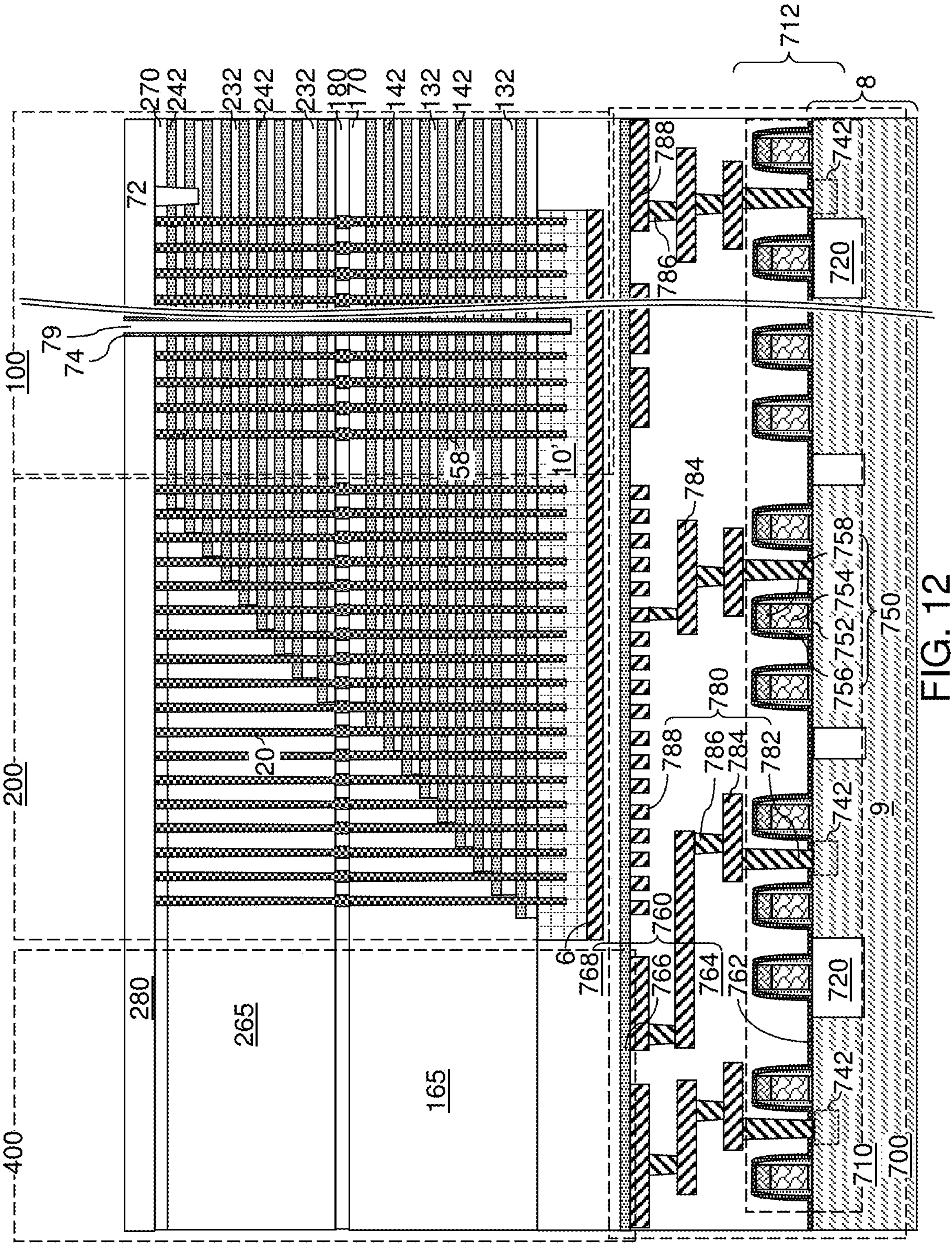
FIG. 12 is a vertical cross-sectional view of the first exemplary structure after formation of backside trench spacers according to the first embodiment of the present disclosure.
Figure 13A:
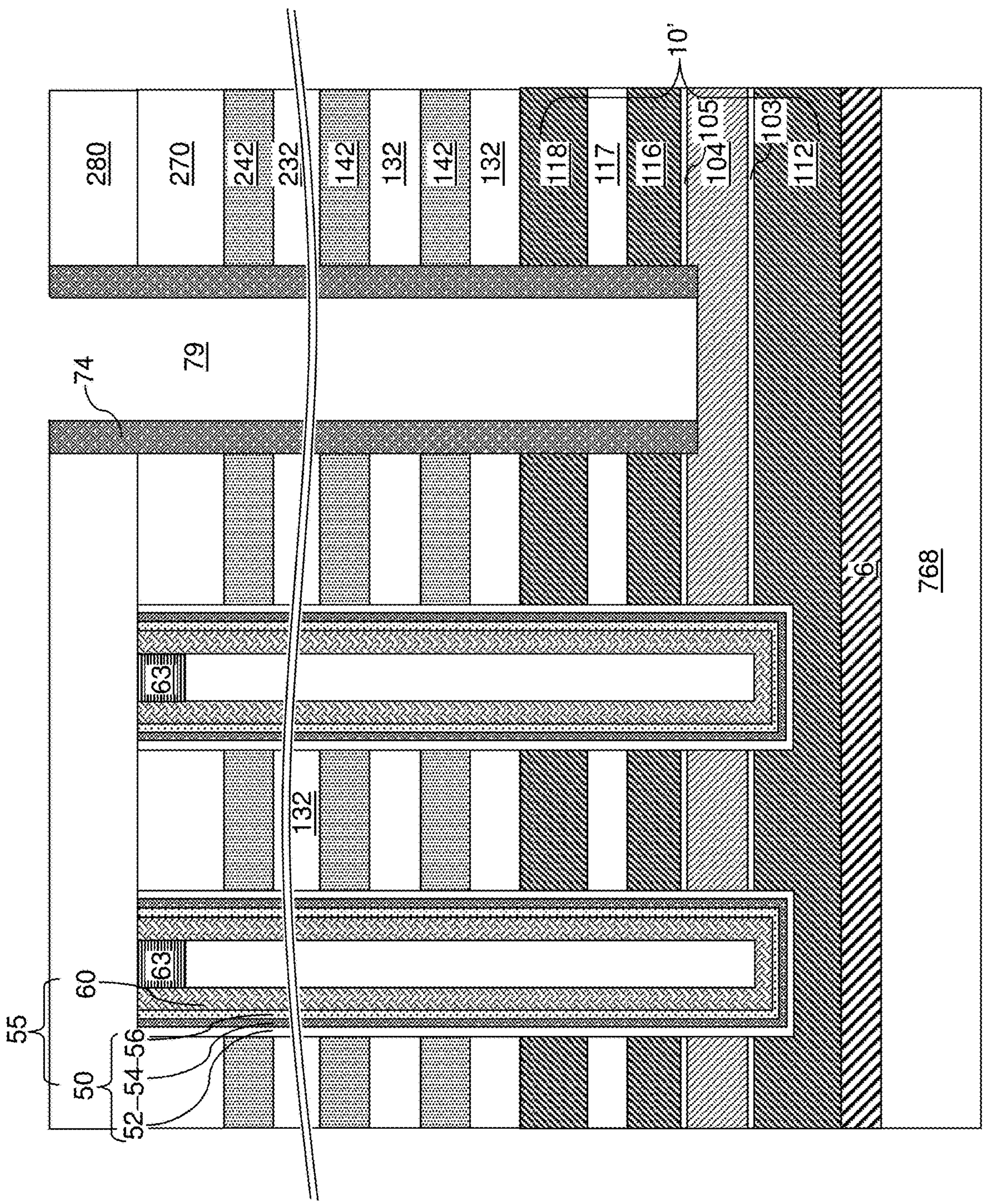
FIGS. 13A-13E illustrate sequential vertical cross-sectional views of memory opening fill structures and a backside trench during formation of source-level material layers according to the first embodiment of the present disclosure.

Referring to FIGS. 12 and 13A, a backside trench spacer 74 can be formed on sidewalls of each backside trench 79. For example, a conformal spacer material layer can be deposited in the backside trenches 79 and over the first contact level dielectric layer 280, and can be anisotropically etched to form the backside trench spacers 74. The backside trench spacers 74 include a material that is different from the material of the source-level sacrificial layer 104. For example, the backside trench spacers 74 can include silicon nitride.

Figure 13B:
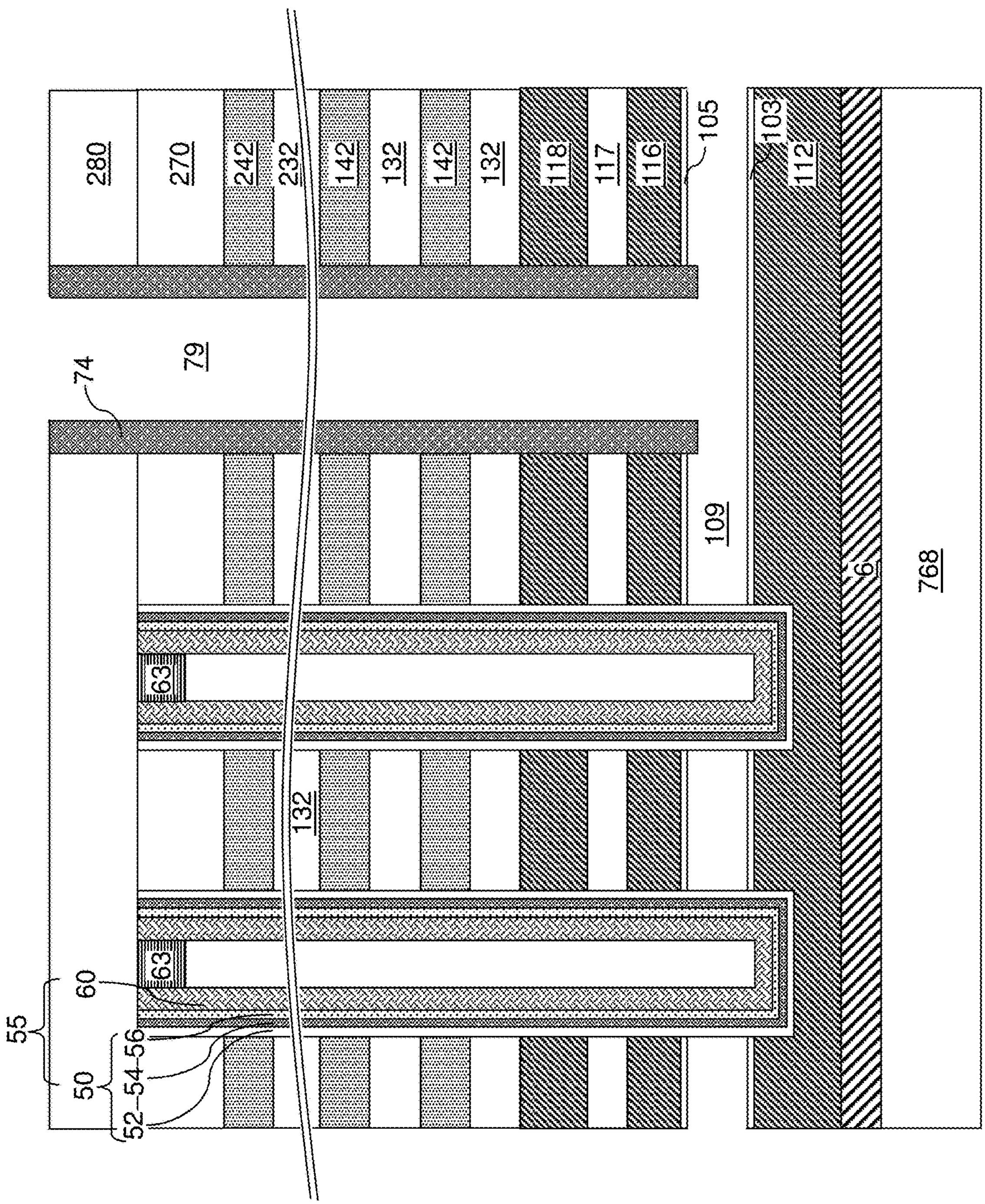

Referring to FIG. 13B, an etchant that etches the material of the source-level sacrificial layer 104 selective to the materials of the first-tier alternating stack (132, 142), the second-tier alternating stack (232, 242), the first and second insulating cap layers (170, 270), the first contact level dielectric layer 280, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) can be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 74, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and a bottom surface that are physically exposed to the source cavity 109.

Figure 13C:
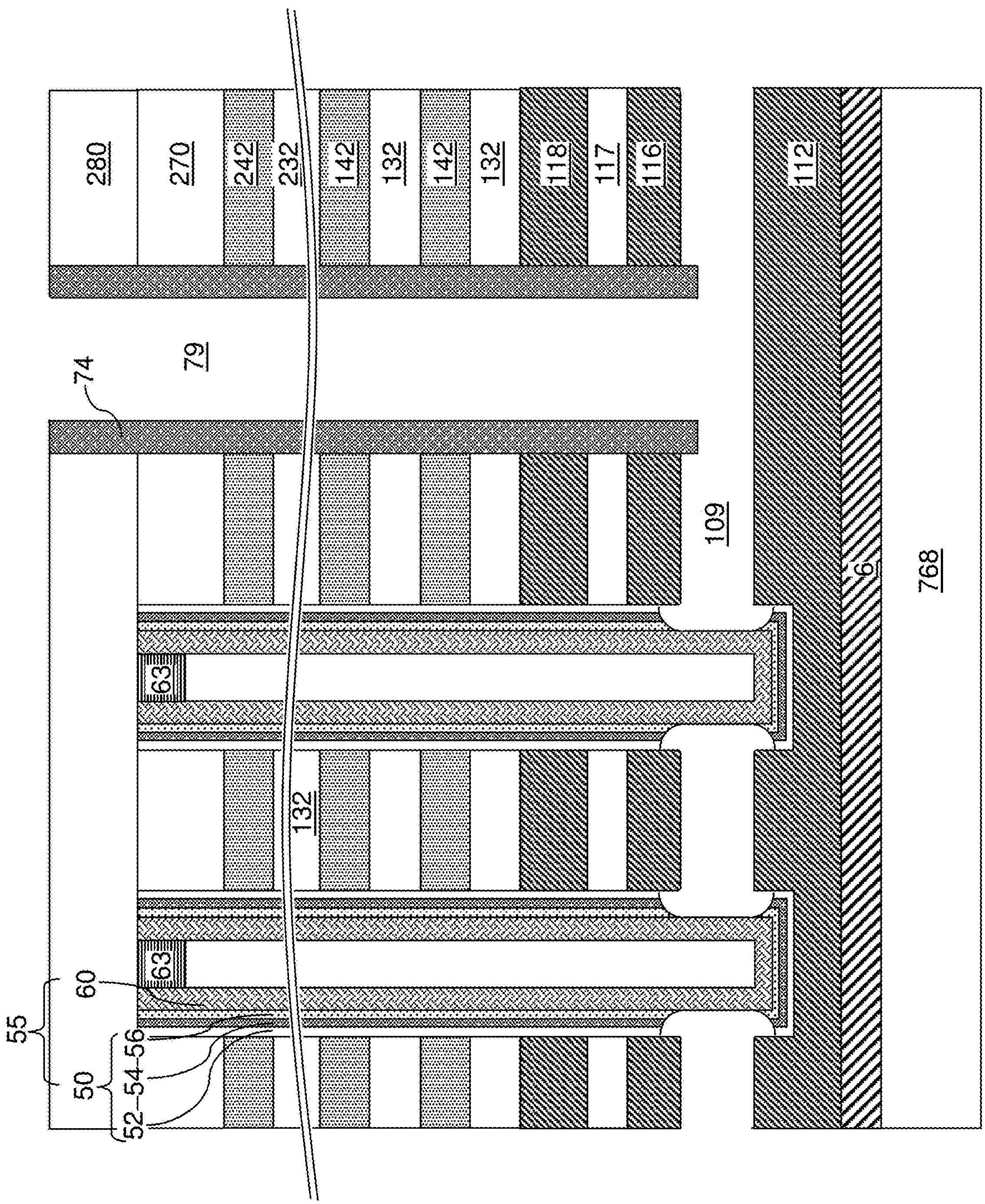

Referring to FIG. 13C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 can be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 13D:
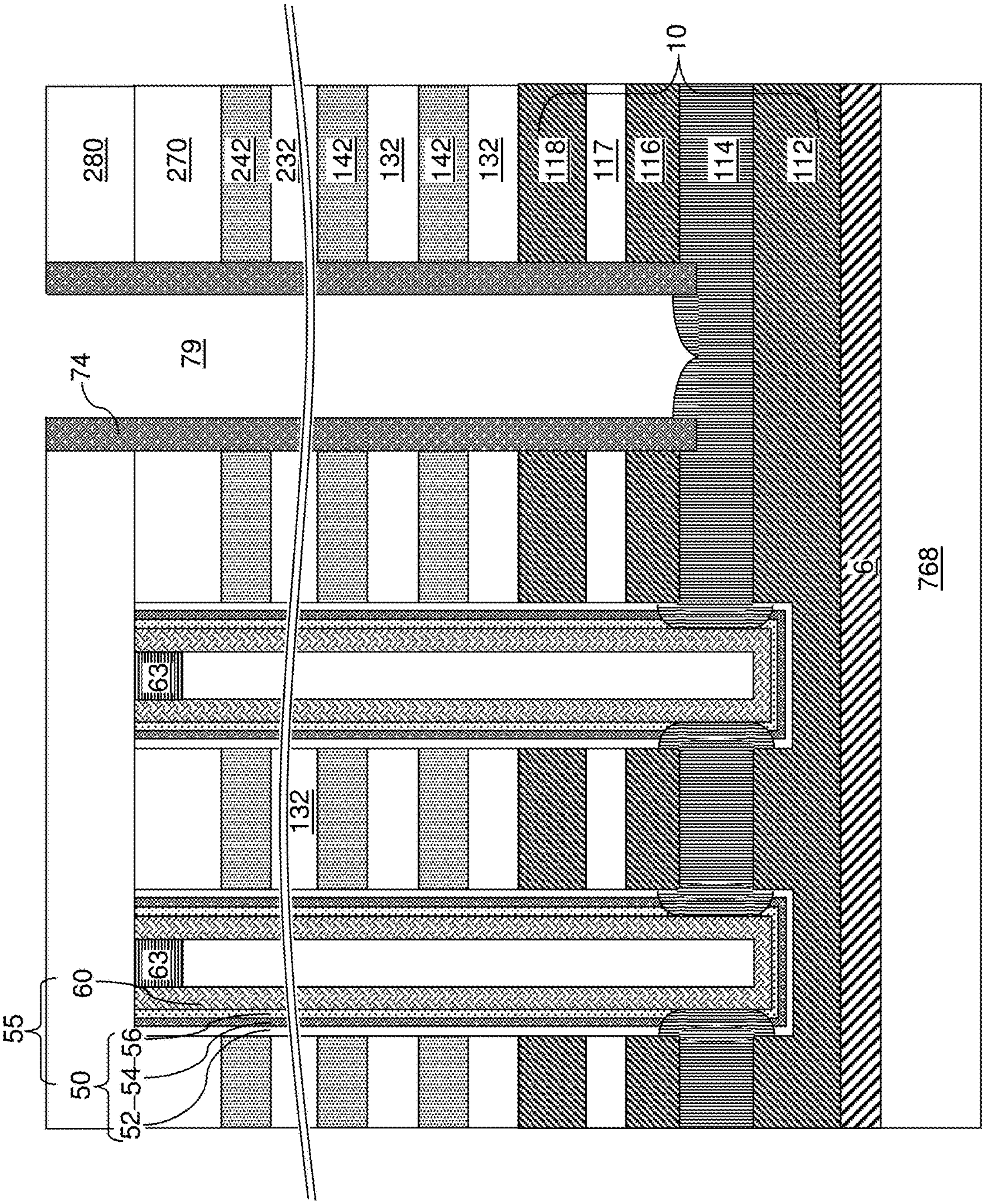

Referring to FIG. 13D, an n-doped semiconductor material can be deposited on the physically exposed semiconductor surfaces around the source cavity 109. The physically exposed semiconductor surfaces include bottom portions of outer sidewalls of the vertical semiconductor channels 60 and a boron-doped horizontal surface of the at least one source-level semiconductor layer (such as a bottom surface of the upper source-level semiconductor layer 116 and/or a top surface of the lower source-level semiconductor layer 112). For example, the physically exposed semiconductor surfaces can include the bottom portions of outer sidewalls of the vertical semiconductor channels 60, the top horizontal surface of the lower source-level semiconductor layer 112, and the bottom surface of the upper source-level semiconductor layer 116.

In one embodiment, the n-doped semiconductor material can be deposited on the physically exposed semiconductor surfaces around the source cavity 109 by a selective semiconductor deposition process. A semiconductor precursor gas, an etchant, and an n-type dopant precursor gas can be flowed concurrently into a process chamber including the first exemplary structure during the selective semiconductor deposition process. For example, the semiconductor precursor gas can include silane, disilane, or dichlorosilane, the etchant gas can include gaseous hydrogen chloride, and the n-type dopant precursor gas such as phosphine, arsine, or stibine. In this case, the selective semiconductor deposition process grows an n-doped semiconductor material from physically exposed semiconductor surfaces around the source cavity 109. The deposited n-doped semiconductor material forms a source contact layer 114, which can contact sidewalls of the vertical semiconductor channels 60. The atomic concentration of the n-type dopants in the deposited semiconductor material can be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed can consist essentially of semiconductor atoms and n-type dopant atoms. Alternatively, at least one non-selective n-doped semiconductor material deposition process can be used to form the source contact layer 114. Optionally, one or more etch back processes can be used in combination with a plurality of selective or non-selective deposition processes to provide a seamless and/or voidless source contact layer 114.

The duration of the selective semiconductor deposition process can be selected such that the source cavity 109 is filled with the source contact layer 114, and the source contact layer 114 contacts bottom end portions of inner sidewalls of the backside trench spacers 74. In one embodiment, the source contact layer 114 can be formed by selectively depositing an n-doped semiconductor material from semiconductor surfaces around the source cavity 109. In one embodiment, the doped semiconductor material can include doped polysilicon. Thus, the source-level sacrificial layer 104 can be replaced with the source contact layer 114.

The layer stack including the lower source-level semiconductor layer 112, the source contact layer 114, and the upper source-level semiconductor layer 116 constitutes a buried source layer (112, 114, 116). A p-n junction is present between the source contact layer 114 and the upper source-level semiconductor layer 116. The set of layers including the buried source layer (112, 114, 116), the source-level insulating layer 117, and the source-select-level conductive layer 118 constitutes source-level material layers 10, which replaces the in-process source-level material layers 10'.

Figure 13E:
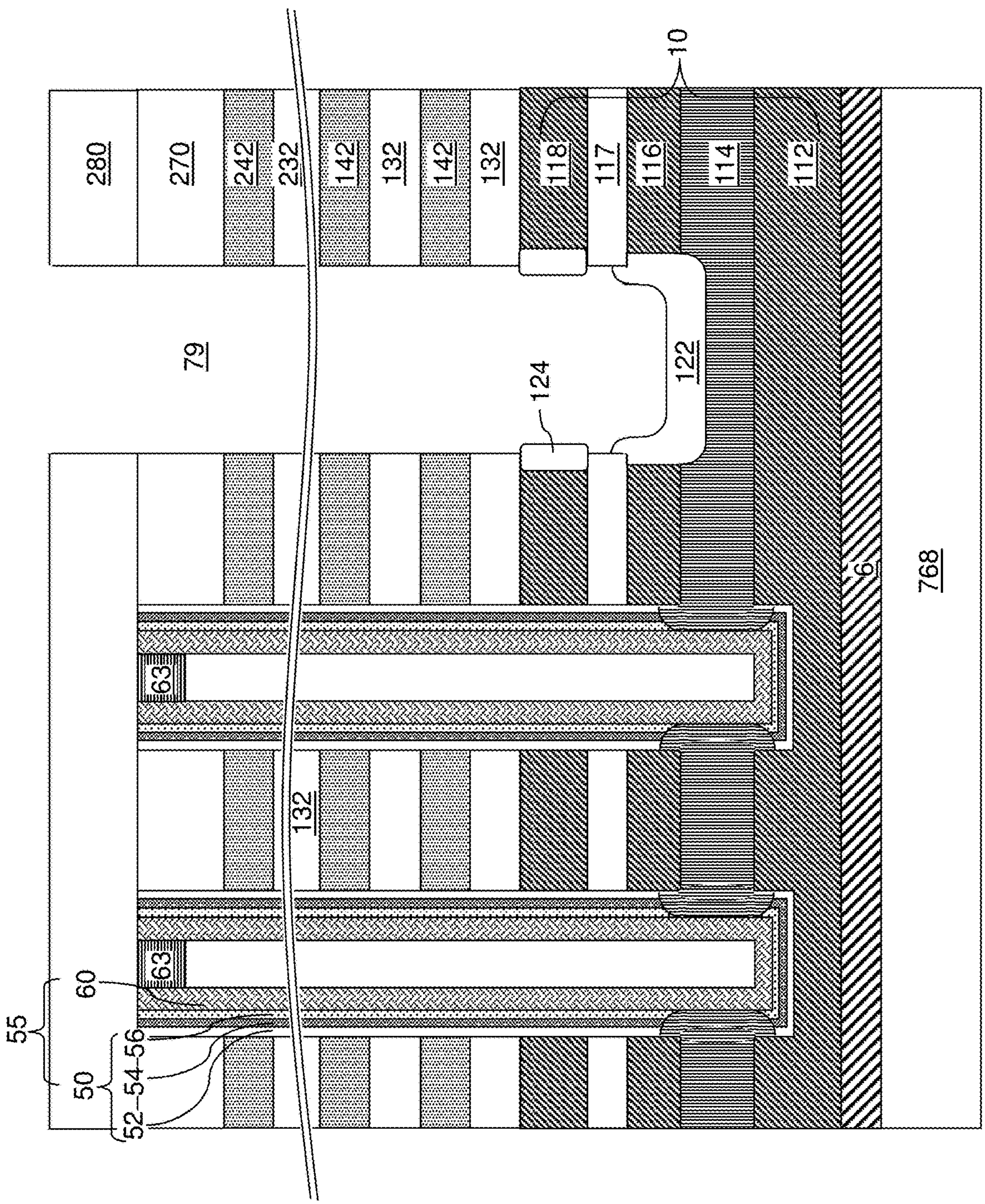
Figure 14:
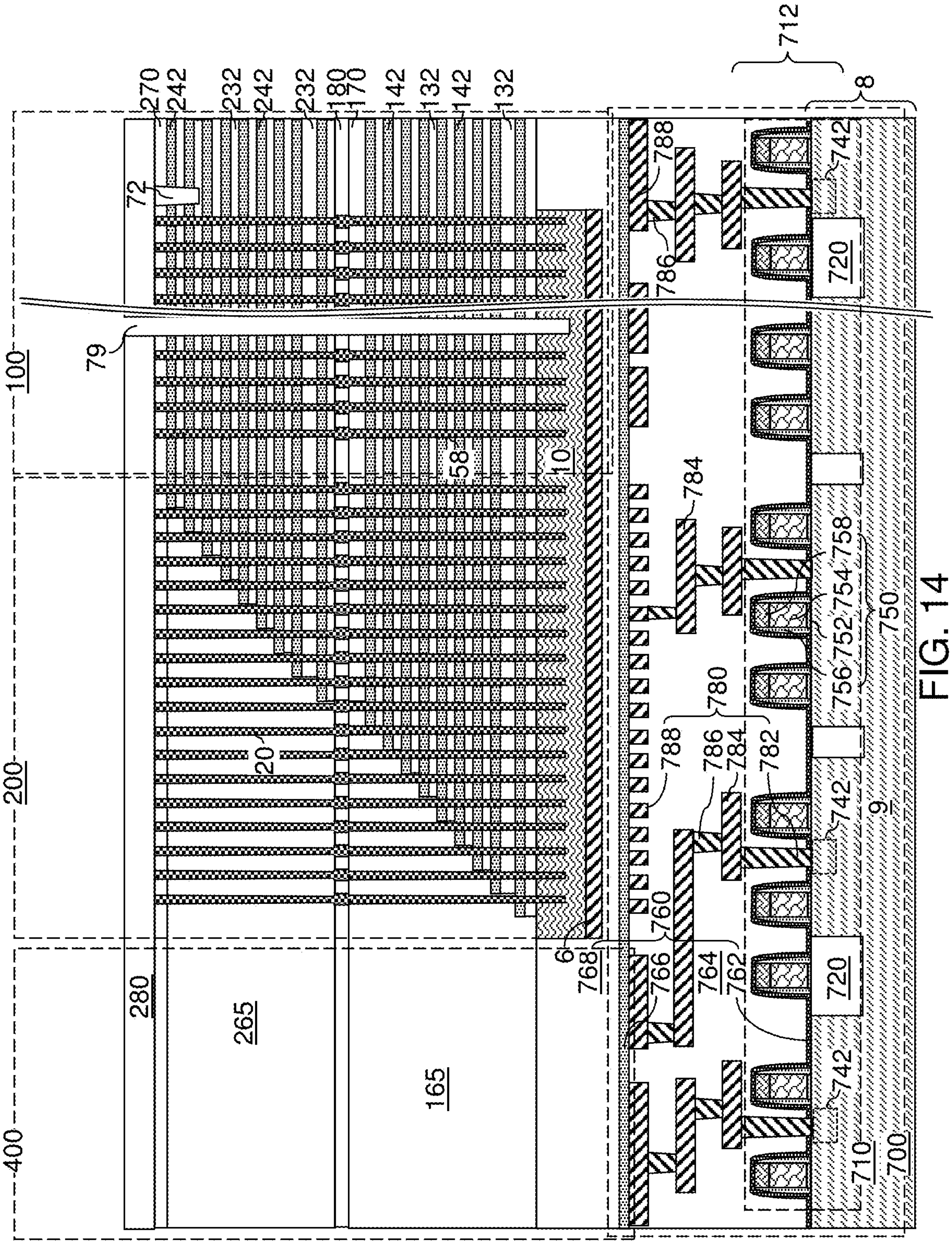
FIG. 14 is a vertical cross-sectional view of the first exemplary structure after formation of source-level material layers according to the first embodiment of the present disclosure.

Referring to FIGS. 13E and 14, the backside trench spacers 74 can be removed selective to the insulating layers (132, 232), the first and second insulating cap layers (170, 270), the first contact level dielectric layer 280, and the source contact layer 114 using an isotropic etch process. For example, if the backside trench spacers 74 include silicon nitride, a wet etch process using hot phosphoric acid can be performed to remove the backside trench spacers 74. In one embodiment, the isotropic etch process that removes the backside trench spacers 74 can be combined with a subsequent isotropic etch process that etches the sacrificial material layers (142, 242) selective to the insulating layers (132, 232), the first and second insulating cap layers (170, 270), the first contact level dielectric layer 280, and the source contact layer 114.

An oxidation process can be performed to convert physically exposed surface portions of semiconductor materials into dielectric semiconductor oxide portions. For example, surfaces portions of the source contact layer 114 and the upper source-level semiconductor layer 116 can be converted into dielectric semiconductor oxide plates 122, and surface portions of the source-select-level conductive layer 118 can be converted into annular dielectric semiconductor oxide spacers 124.

Figure 15:
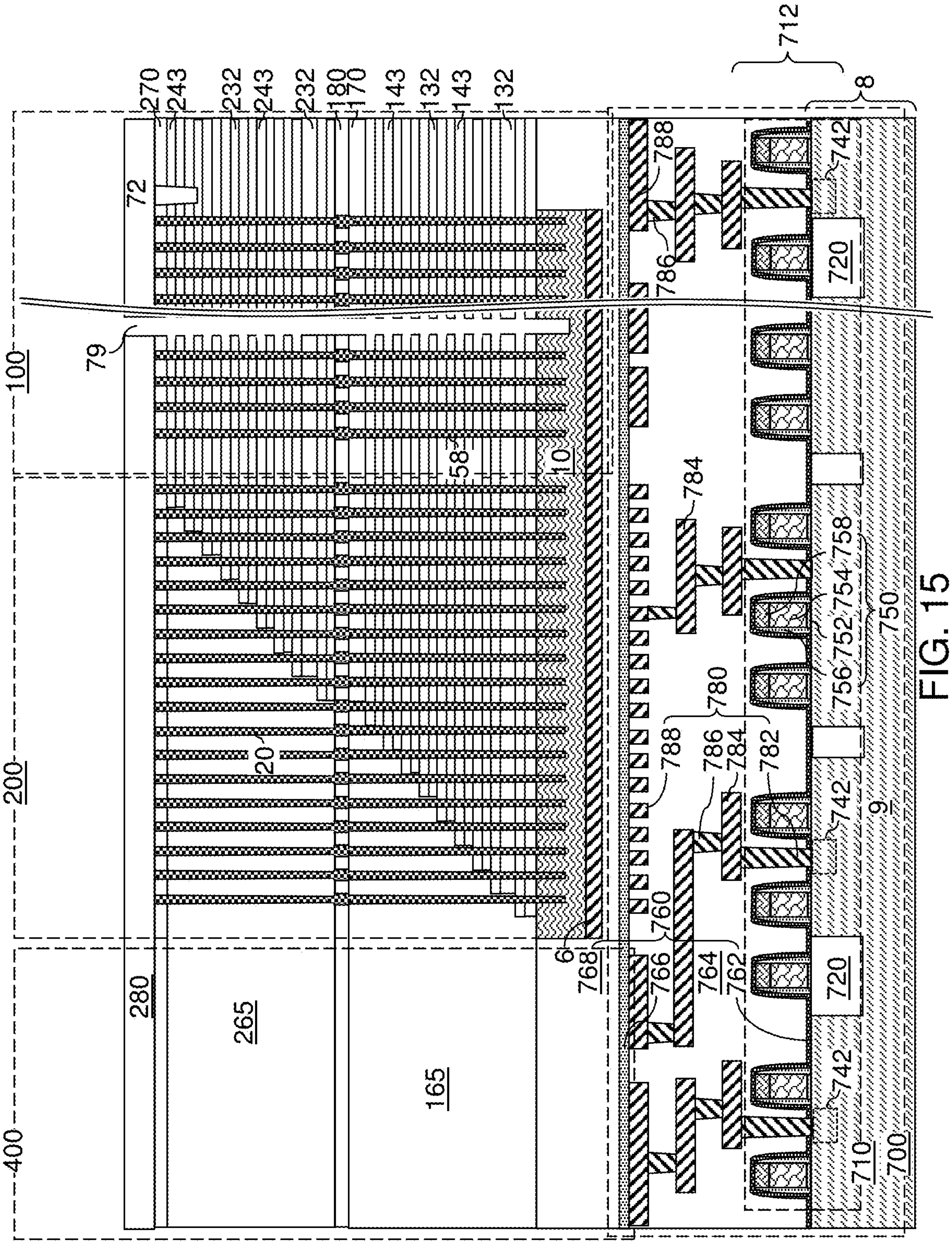
FIG. 15 is a vertical cross-sectional view of the first exemplary structure after formation of backside recesses according to the first embodiment of the present disclosure.

Referring to FIG. 15, the sacrificial material layers (142, 242) can be removed selective to the insulating layers (132, 232), the first and second insulating cap layers (170, 270), the first contact level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 can be introduced into the backside trenches 79, for example, using an isotropic etch process. For example, the sacrificial material layers (142, 242) can include silicon nitride, the materials of the insulating layers (132, 232), the first and second insulating cap layers (170, 270), the retro-stepped dielectric material portions (165, 265), and the outermost layer of the memory films 50 can include silicon oxide materials.

The isotropic etch process can be a wet etch process using a wet etch solution, or can be a gas phase (dry) etch process in which the etchant is introduced in a vapor phase into the backside trench 79. For example, if the sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) can be a laterally extending cavity having a lateral dimension that is greater than the vertical extent of the cavity. In other words, the lateral dimension of each of the backside recesses (143, 243) can be greater than the height of the respective backside recess (143, 243). A plurality of backside recesses (143, 243) can be formed in the volumes from which the material of the sacrificial material layers (142, 242) is removed. Each of the backside recesses (143, 243) can extend substantially parallel to the top surface of the substrate semiconductor layer 9. A backside recess (143, 243) can be vertically bounded by a top surface of an underlying insulating layer (132, 232) and a bottom surface of an overlying insulating layer (132, 232). In one embodiment, each of the backside recesses (143, 243) can have a uniform height throughout.

Figure 16:
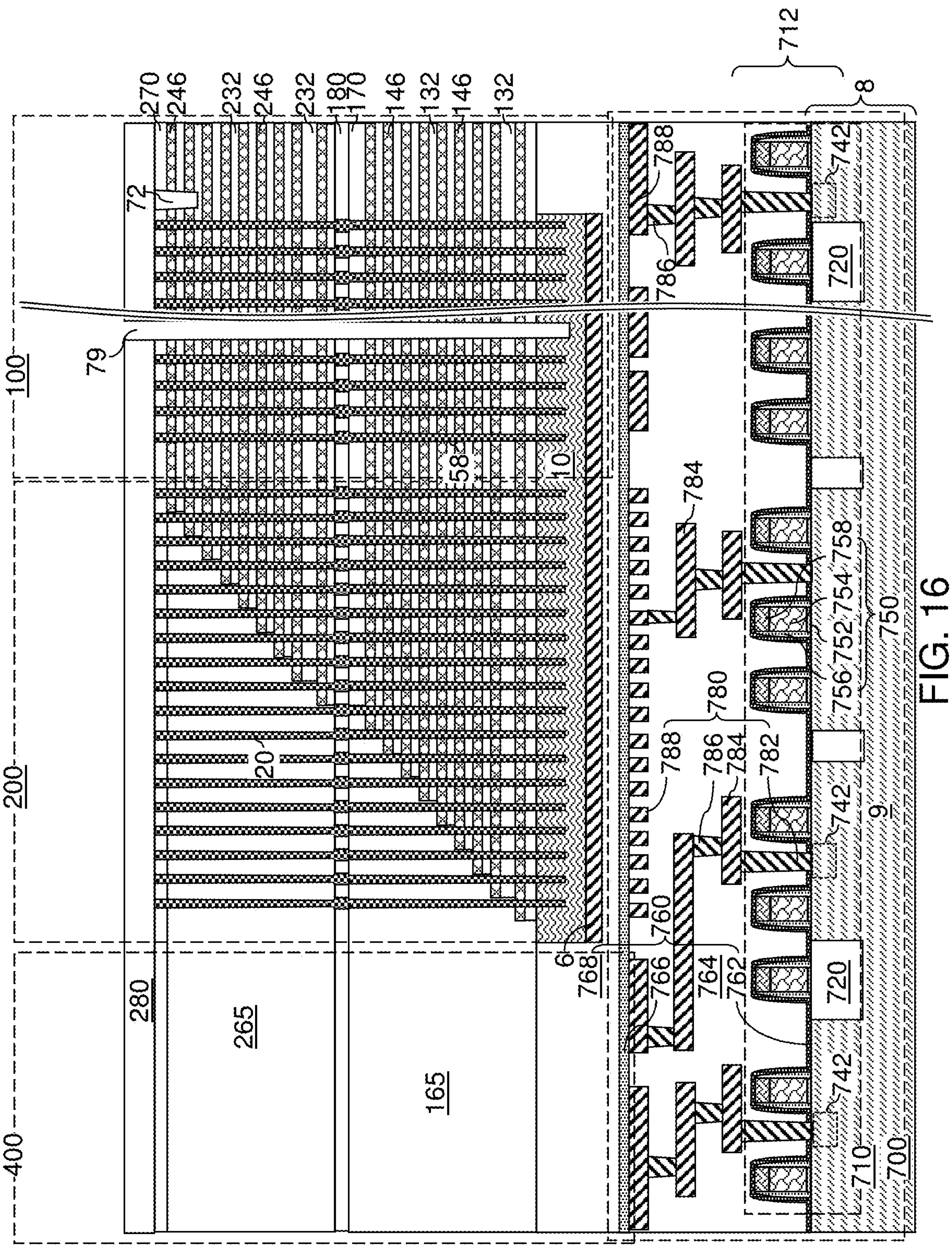
FIG. 16 is a vertical cross-sectional view of the first exemplary structure after formation of electrically conductive layers according to the first embodiment of the present disclosure.
Figure 17A:
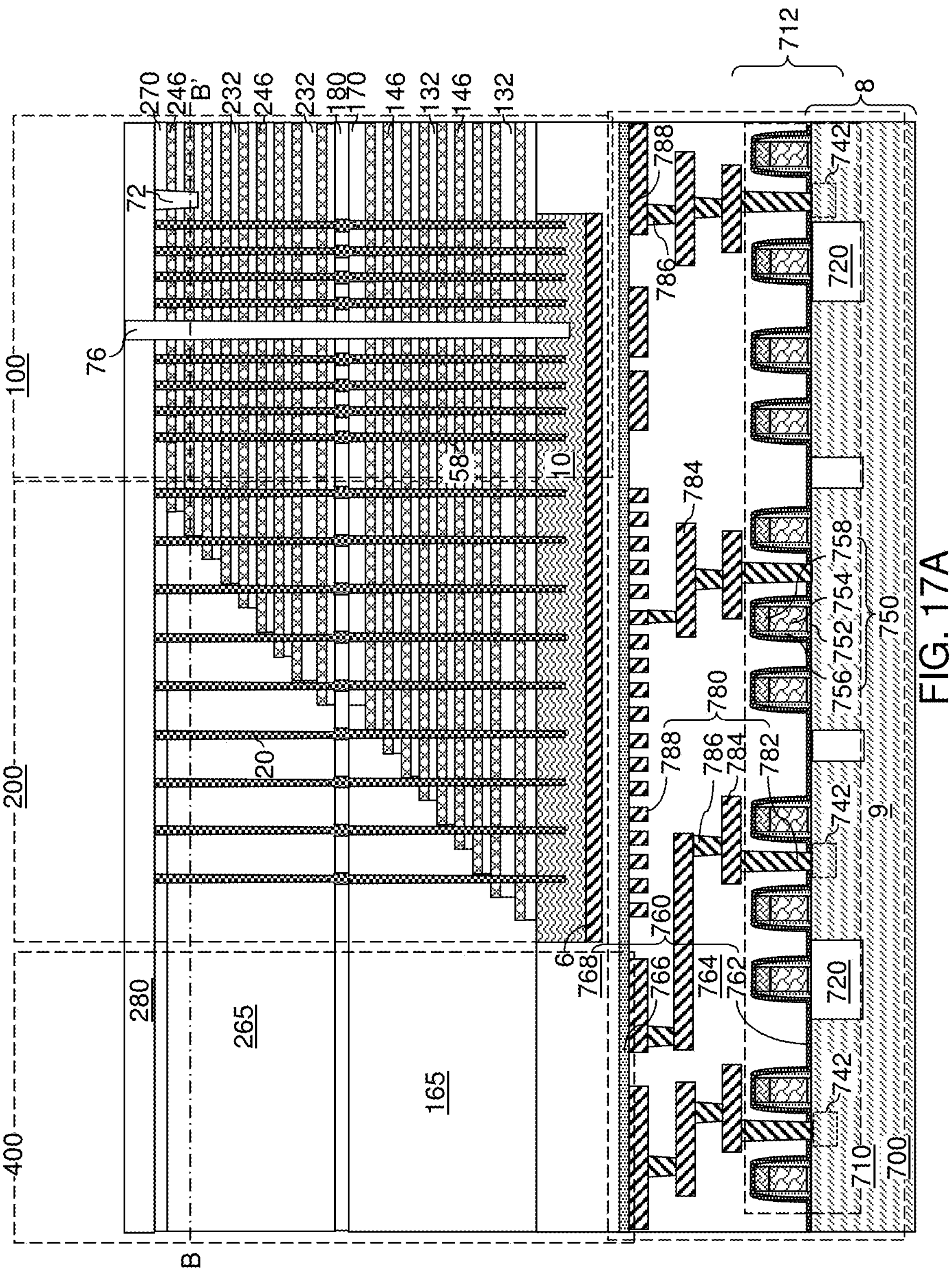
FIG. 17A is a vertical cross-sectional view of the first exemplary structure after formation of backside trench fill structures in the backside trenches according to the first embodiment of the present disclosure.
Figure 17B:
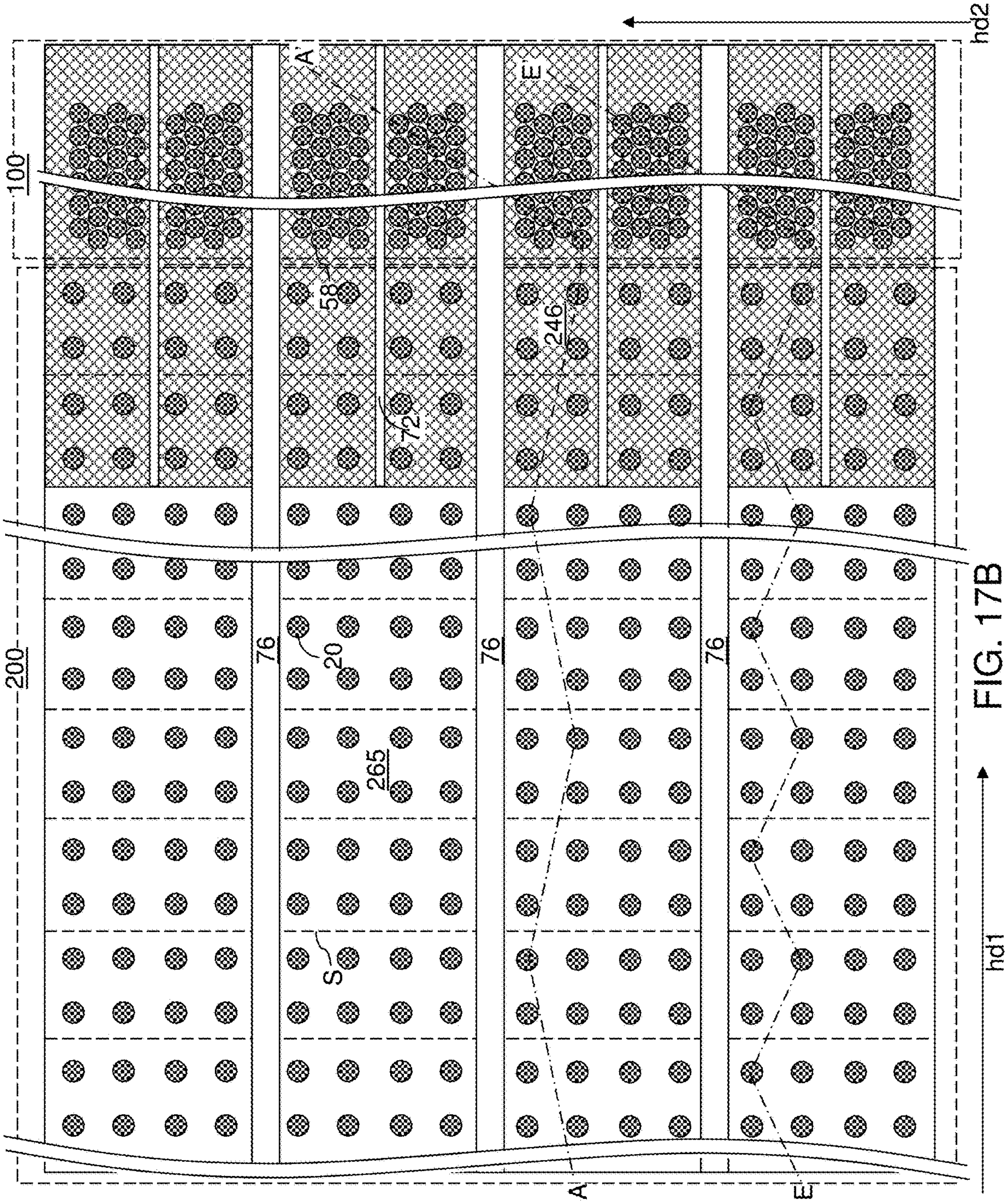
FIG. 17B is a horizontal cross-sectional view of the first exemplary structure along the horizontal plane B-B' of FIG. 17A. The hinged vertical plane A-A' corresponds to the plane of the vertical cross-sectional view of FIG. 17A.
Figure 17C:
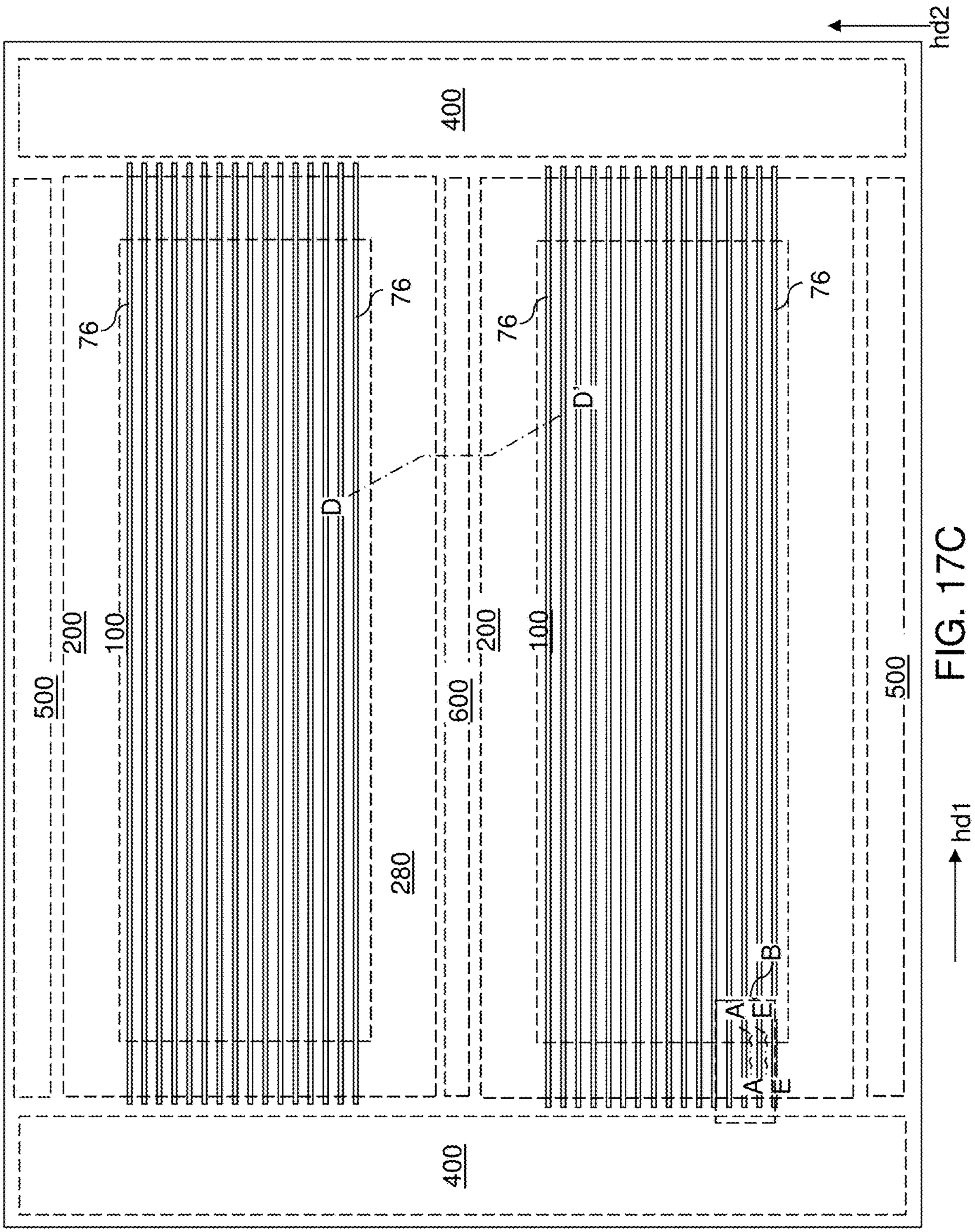
FIG. 17C is a top-down view of the first exemplary structure of FIGS. 17A and 17B over a larger area than the area shown in FIG. 17B. The area B corresponds to the area illustrated in FIG. 17B. The hinged vertical plane A-A' corresponds to the plane of the vertical cross-sectional view of FIG. 17A.
Figure 17D:
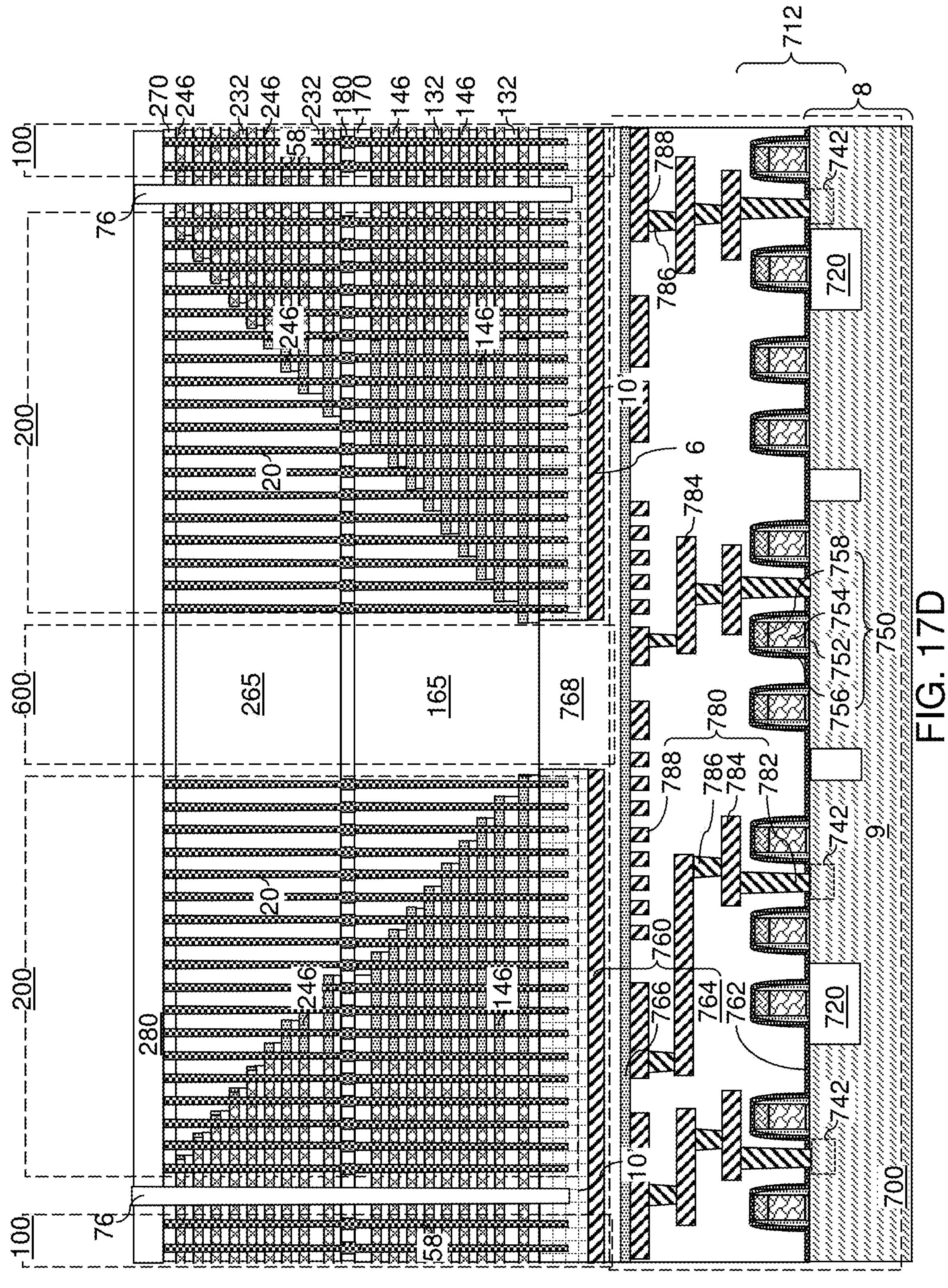
FIG. 17D is a vertical cross-sectional view of the first exemplary structure along the hinged vertical plane D-D' of FIG. 17C.
Figure 17E:
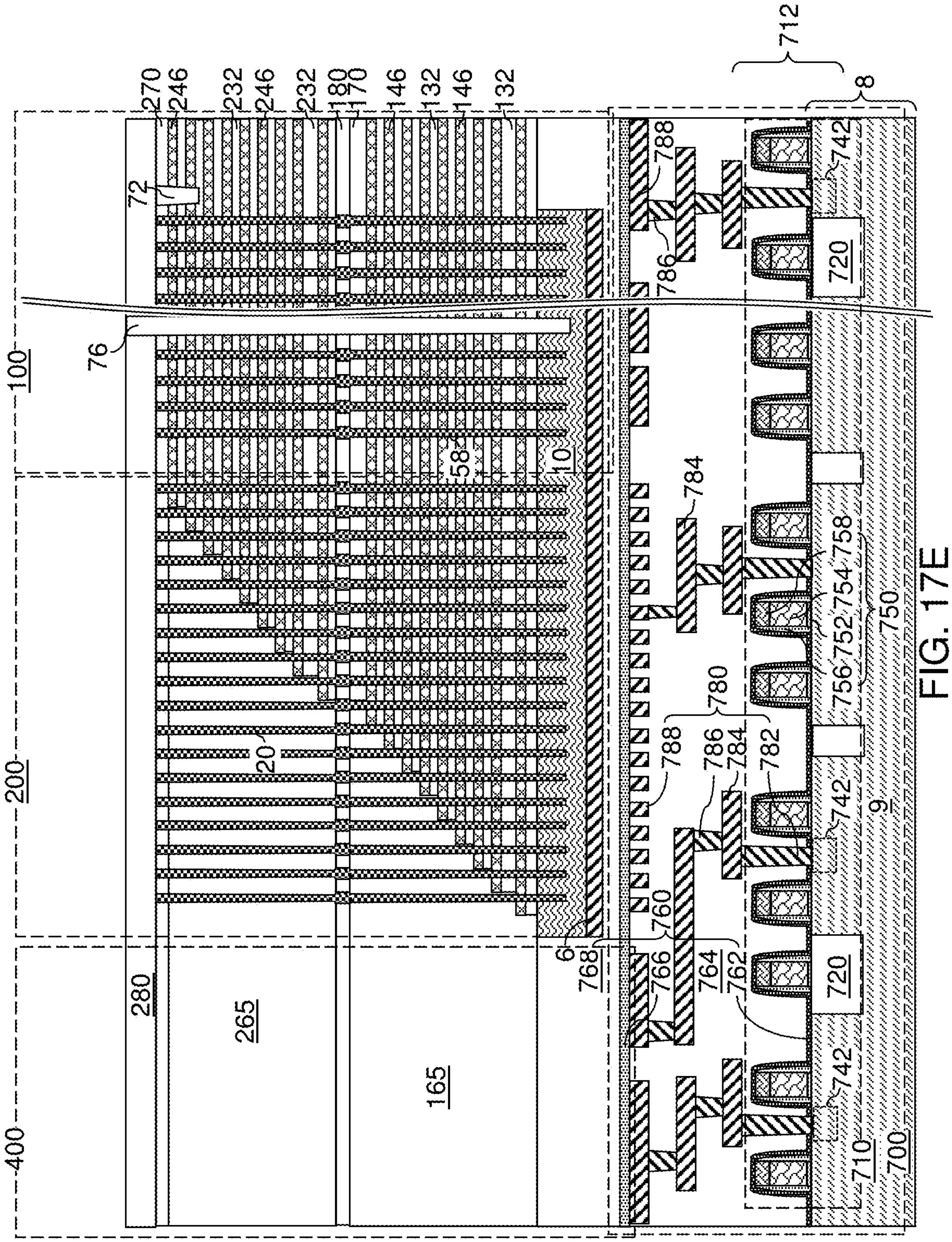
FIG. 17E is a vertical cross-sectional view of the first exemplary structure along the vertical plane E-E' of FIG. 17B.

Referring to FIG. 16, a backside blocking dielectric layer (not shown) can be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer can include aluminum oxide. The backside blocking dielectric layer can be formed by a conformal deposition process such as atomic layer deposition or chemical vapor deposition. The thickness of the backside blocking dielectric layer can be in a range from 1 nm to 20 nm, such as from 2 nm to 10 nm, although lesser and greater thicknesses can also be used.

At least one conductive material can be deposited in the plurality of backside recesses (243, 243), on the sidewalls of the backside trenches 79, and over the first contact level dielectric layer 280. The at least one conductive material can be deposited by a conformal deposition method, which can be, for example, chemical vapor deposition (CVD), atomic layer deposition (ALD), electroless plating, electroplating, or a combination thereof. The at least one conductive material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material can include at least one metallic material, i.e., an electrically conductive material that includes at least one metallic element. Non-limiting exemplary metallic materials that can be deposited in the backside recesses (143, 243) include tungsten, tungsten nitride, titanium, titanium nitride, tantalum, tantalum nitride, cobalt, and ruthenium. For example, the at least one conductive material can include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) can be a combination of titanium nitride layer and a tungsten fill material.

Electrically conductive layers (146, 246) can be formed in the backside recesses (143, 243) by deposition of the at least one conductive material. A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the first contact level dielectric layer 280. Each of the first electrically conductive layers 146 and the second electrically conductive layers 246 can include a respective conductive metallic nitride liner and a respective conductive fill material. Thus, the first and second sacrificial material layers (142, 242) can be replaced with the first and second electrically conductive layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

Residual conductive material can be removed from inside the backside trenches 79. Specifically, the deposited metallic material of the continuous metallic material layer can be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers can be physically exposed to a respective backside trench 79. The backside trenches can have a pair of curved sidewalls having a non-periodic width variation along the first horizontal direction hd1 and a non-linear width variation along the vertical direction.

Each electrically conductive layer (146, 246) can be a conductive sheet including openings therein. A first subset of the openings through each electrically conductive layer (146, 246) can be filled with memory opening fill structures 58. A second subset of the openings through each electrically conductive layer (146, 246) can be filled with the support pillar structures 20. Each electrically conductive layer (146, 246) can have a lesser area than any underlying electrically conductive layer (146, 246) because of the first and second stepped surfaces. Each electrically conductive layer (146, 246) can have a greater area than any overlying electrically conductive layer (146, 246) because of the first and second stepped surfaces.

In some embodiment, drain-select-level isolation structures 72 can be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying support device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

An alternating stack of insulating layer (132, 232) and electrically conductive layers (146, 246) is formed between each neighboring pair of backside trenches 79. Two groups of alternating stacks {(132, 146), (232, 246)} of insulating layers (132, 232) and electrically conductive layers (146, 246) can be formed over the substrate 8, and clusters of memory stack structures 55 can vertically extend through a respective one of the alternating stacks {(132, 146), (232, 246)}. Each memory stack structure 55 comprises a memory film 50 and a vertical semiconductor channel 60. Neighboring pairs of the two groups of alternating stacks {(132, 146), (232, 246)} are laterally spaced apart from each other by a respective backside trench 79 that laterally extends along the first horizontal direction hd1.

Referring to FIGS. 17A-17E, a dielectric wall structure 76 can be formed within each backside trench 79, for example, by depositing a dielectric material such as silicon oxide in the backside trenches 79. Excess portions of the dielectric material can be removed from above the horizontal plane including the top surface of the first contact level dielectric layer 280. Each remaining portion of the dielectric material in a respective backside trench 79 constitutes a dielectric wall structure 76. Each dielectric wall structure 76 can have a uniform width that is invariant with translation along the first horizontal direction hd1.

Figure 18A:
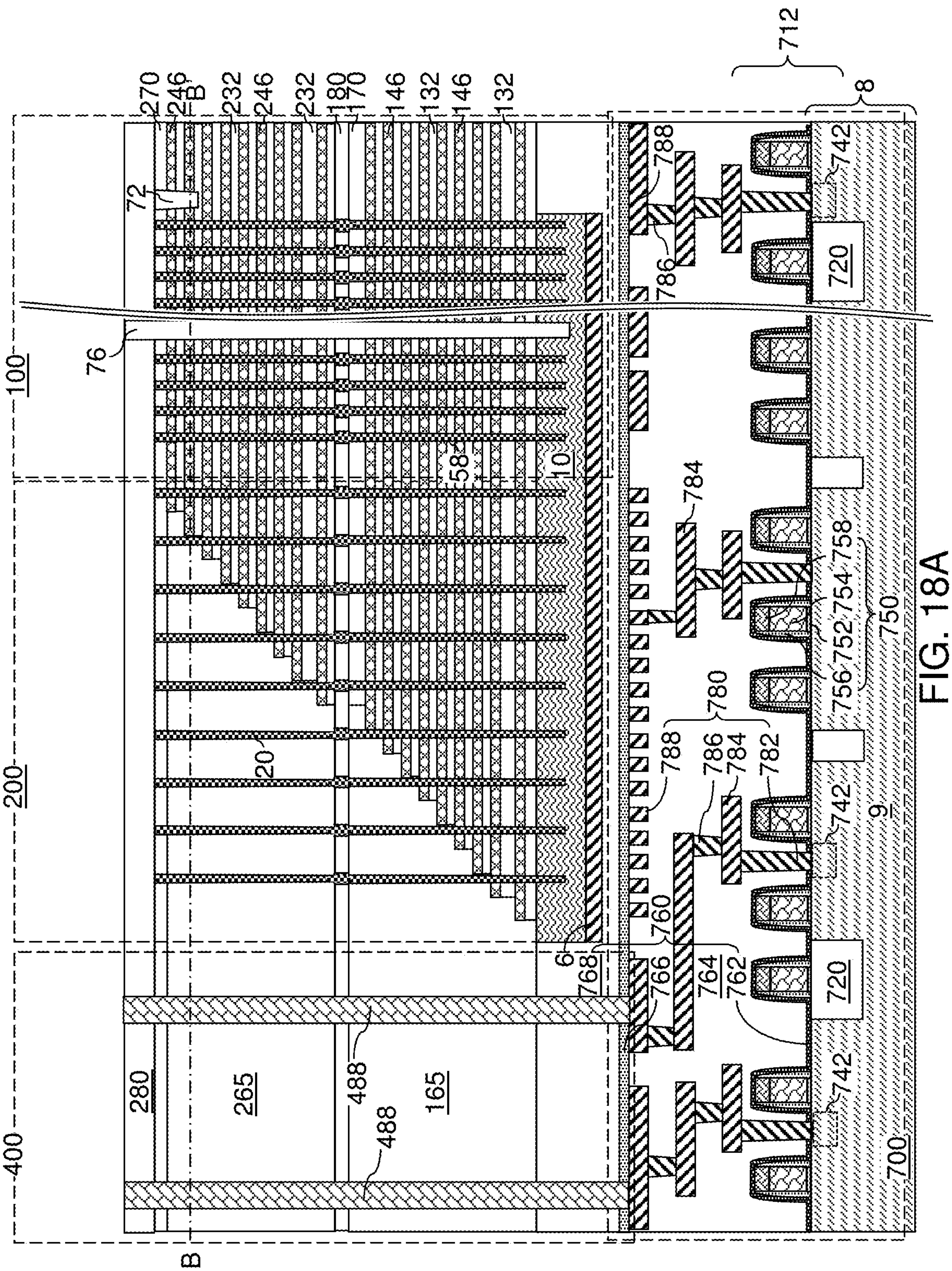
FIG. 18A is a vertical cross-sectional view of the first exemplary structure after formation of through-memory-level via structures according to the first embodiment of the present disclosure.
Figure 18B:
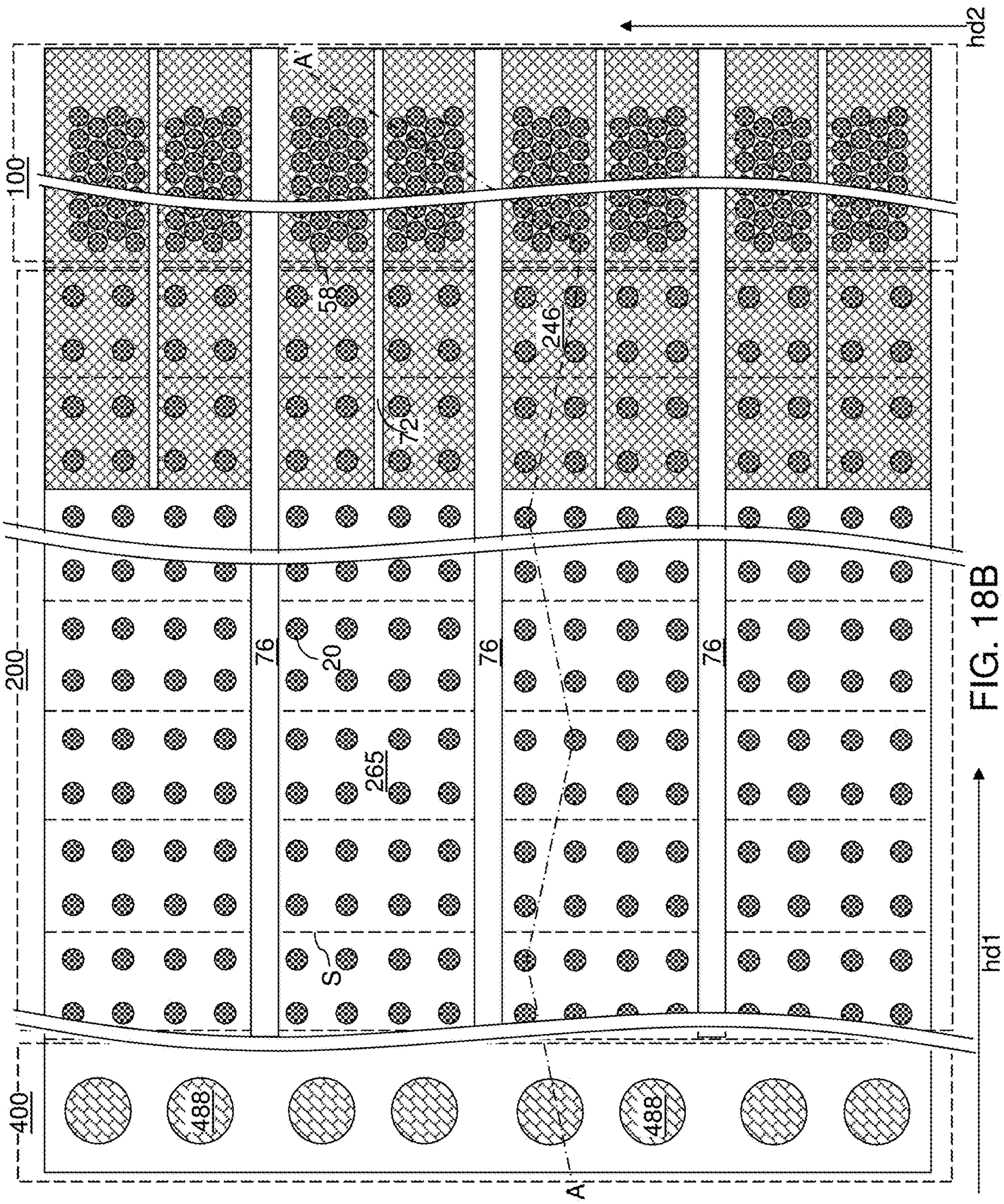
FIG. 18B is a horizontal cross-sectional view of the first exemplary structure along the horizontal plane B-B' of FIG. 18A. The hinged vertical plane A-A' corresponds to the plane of the vertical cross-sectional view of FIG. 18A.
Figure 18C:
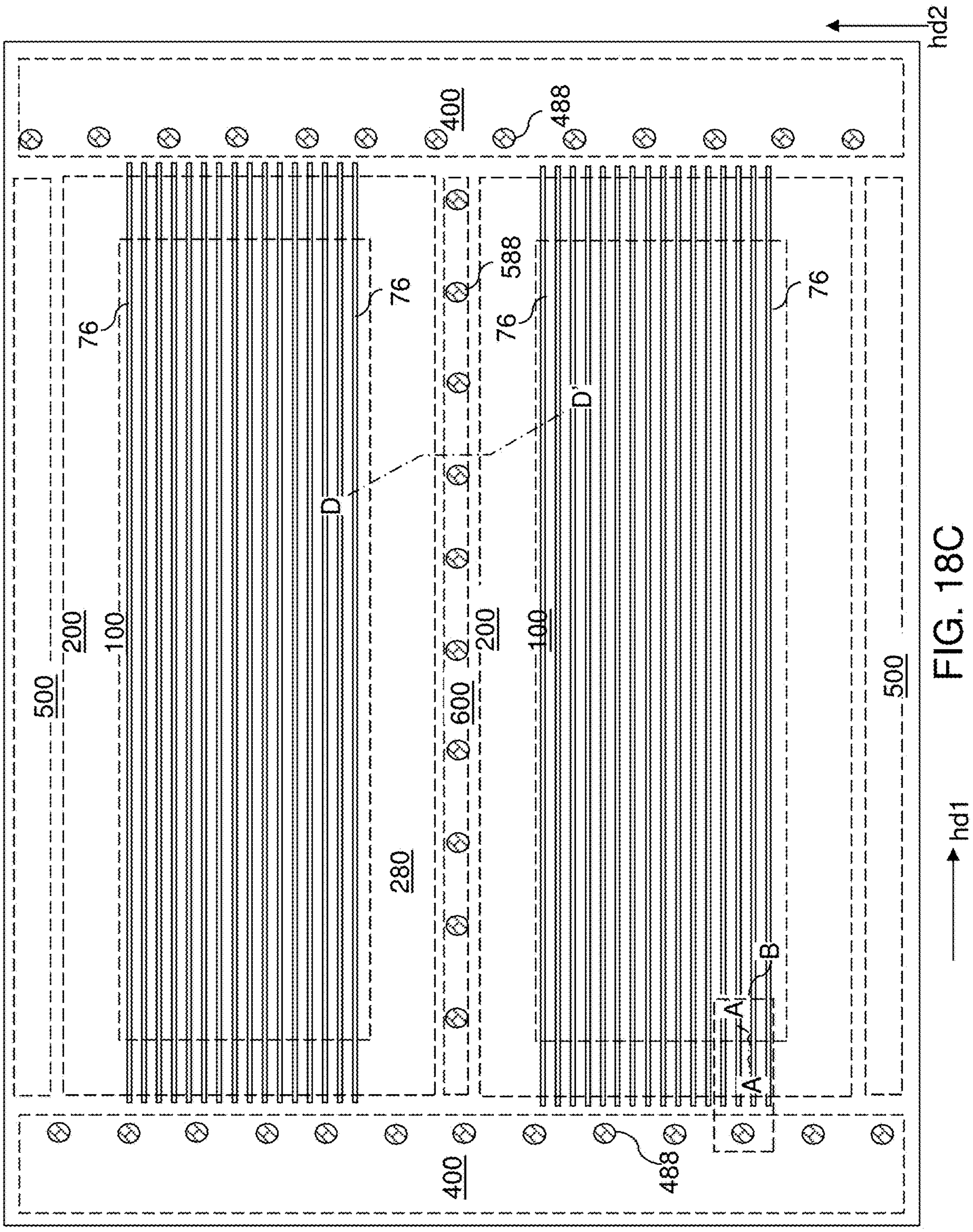
FIG. 18C is a top-down view of the first exemplary structure of FIGS. 18A and 18B over a larger area than the area shown in FIG. 18B. The area B corresponds to the area illustrated in FIG. 18B. The hinged vertical plane A-A' corresponds to the plane of the vertical cross-sectional view of FIG. 18A.
Figure 18D:
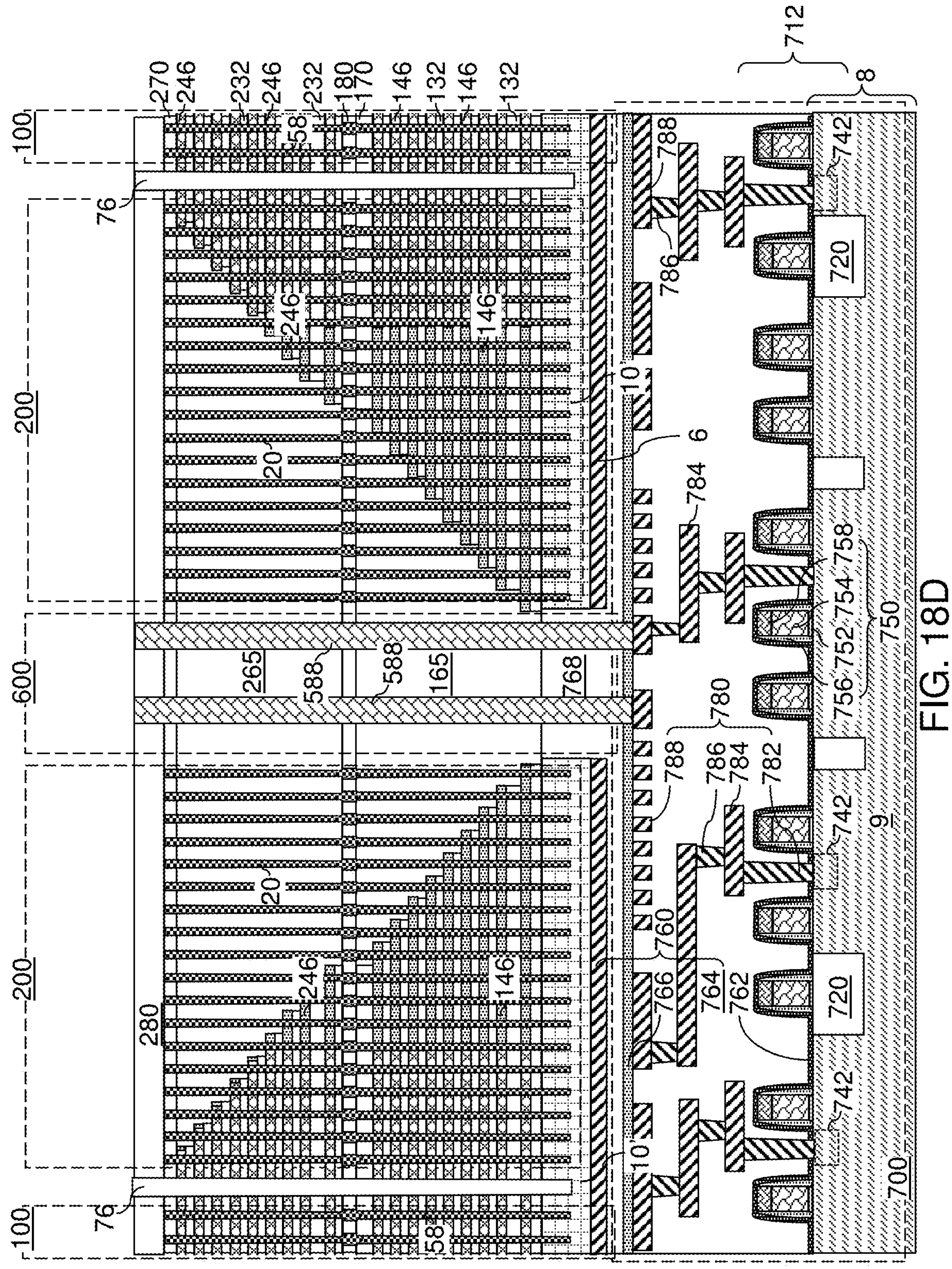
FIG. 18D is a vertical cross-sectional view of the first exemplary structure along the hinged vertical plane D-D' of FIG. 18C.

Referring to FIGS. 18A-18D, through-memory-level via cavities can be formed through the first contact level dielectric layer 280, the second and first retro-stepped dielectric material portions (265, 165), and the second dielectric material layers 768 to top surfaces of a first subset of the lower-level metal interconnect structure 780 in the peripheral connection regions 400, the inter-array connection via regions 600, and the bit line hookup regions 500. The through-memory-level via cavities extend to top surfaces of a respective one of the lower-level metal interconnect structure 780. At least one conductive material can be deposited in the through-memory-region via cavities. Excess portions of the at least one conductive material can be removed from above the horizontal plane including the top surface of the first contact level dielectric layer 280. Each remaining portion of the at least one conductive material in a through-memory-level via cavity constitutes a through-memory-level via structure (488, 588). The through-memory-level via structures (488, 588) include peripheral connection via structures 488 formed in the peripheral connection regions 400, inter-array connection via structures 588 formed in the inter-array connection via regions 600, and bit line connection via structures (not expressly illustrated) formed in the bit line hookup regions 500. The general location of the through-memory-level via structures (488, 588) is shown in FIG. 18C. However, the relative size of the through-memory-level via structures (488, 588) is increased to show their general location and these structures are not drawn to scale.

The through-memory-level via structures (488, 588) provide electrical connection that vertically extends through all layers at the memory level, i.e., the set of all layers between the horizontal plane including the optional conductive plate layer 6 (or the source-level material layers 10 in case the optional conductive plate layer 6 is not present) and the second insulating cap layer 270. The through-memory-level via structures (488, 588) vertically extend from below the second dielectric material layers 768 that underlie the source-level material layers 10 to a top surface of the first contact level dielectric layer 280 that overlie the memory stack structures 55. Each inter-array connection via structures 588 extends through a dielectric region that is located between the two neighboring groups of alternating stacks {(132, 146), (232, 246)} that are laterally spaced apart along the second horizontal direction hd2. Thus, etching dedicated openings for the inter-array connection via structures 588 through the layers of the alternating stacks can be avoided to simplify the manufacturing process.

Figure 19A:
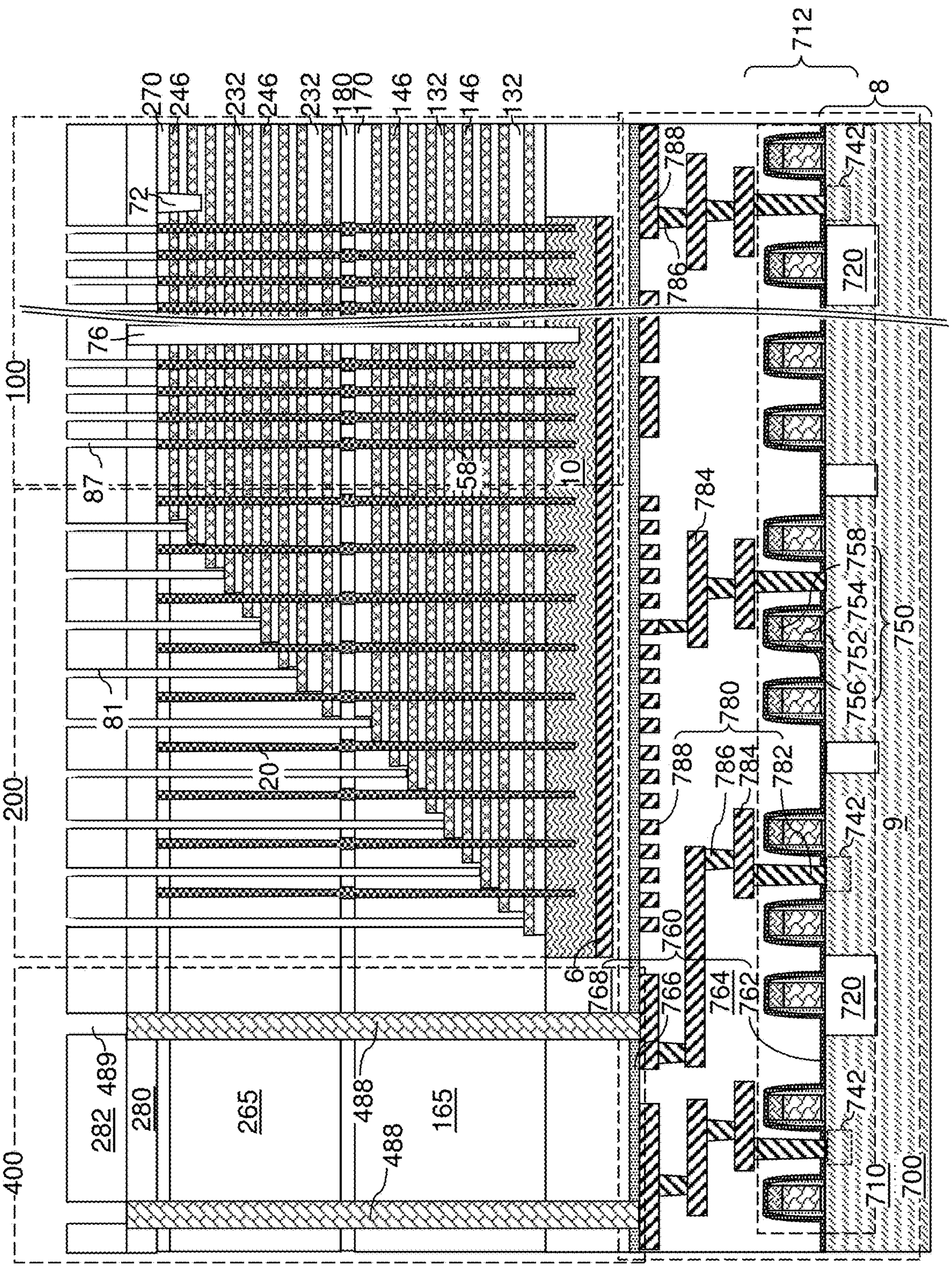
FIG. 19A is a vertical cross-sectional view of the first exemplary structure after formation of a second contact-level dielectric layer and contact via cavities according to the first embodiment of the present disclosure.
Figure 19B:
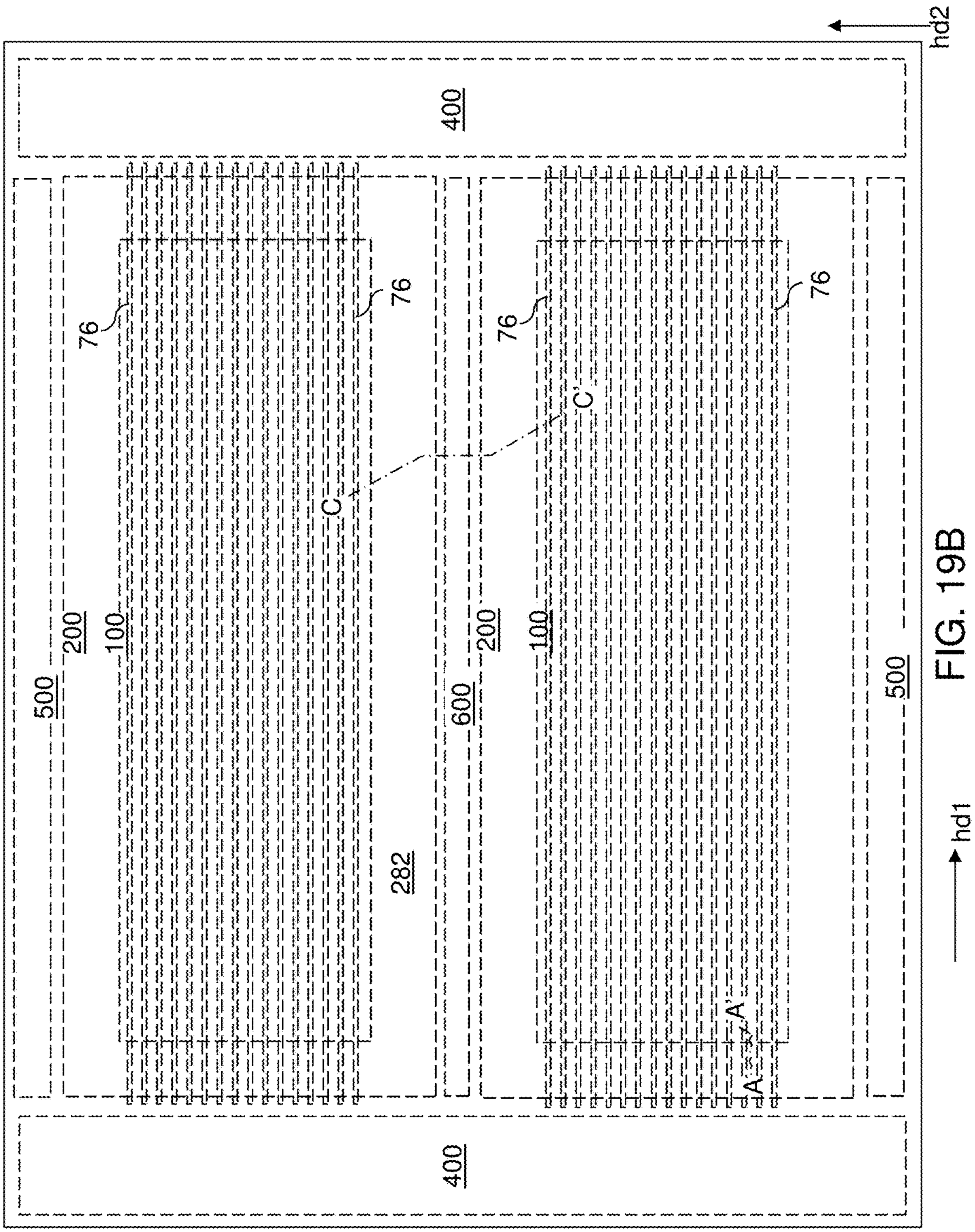
FIG. 19B is a top-down view of the first exemplary structure of FIG. 19A. The hinged vertical plane A-A' is the plane of the vertical cross-sectional view of FIG. 19A.
Figure 19C:
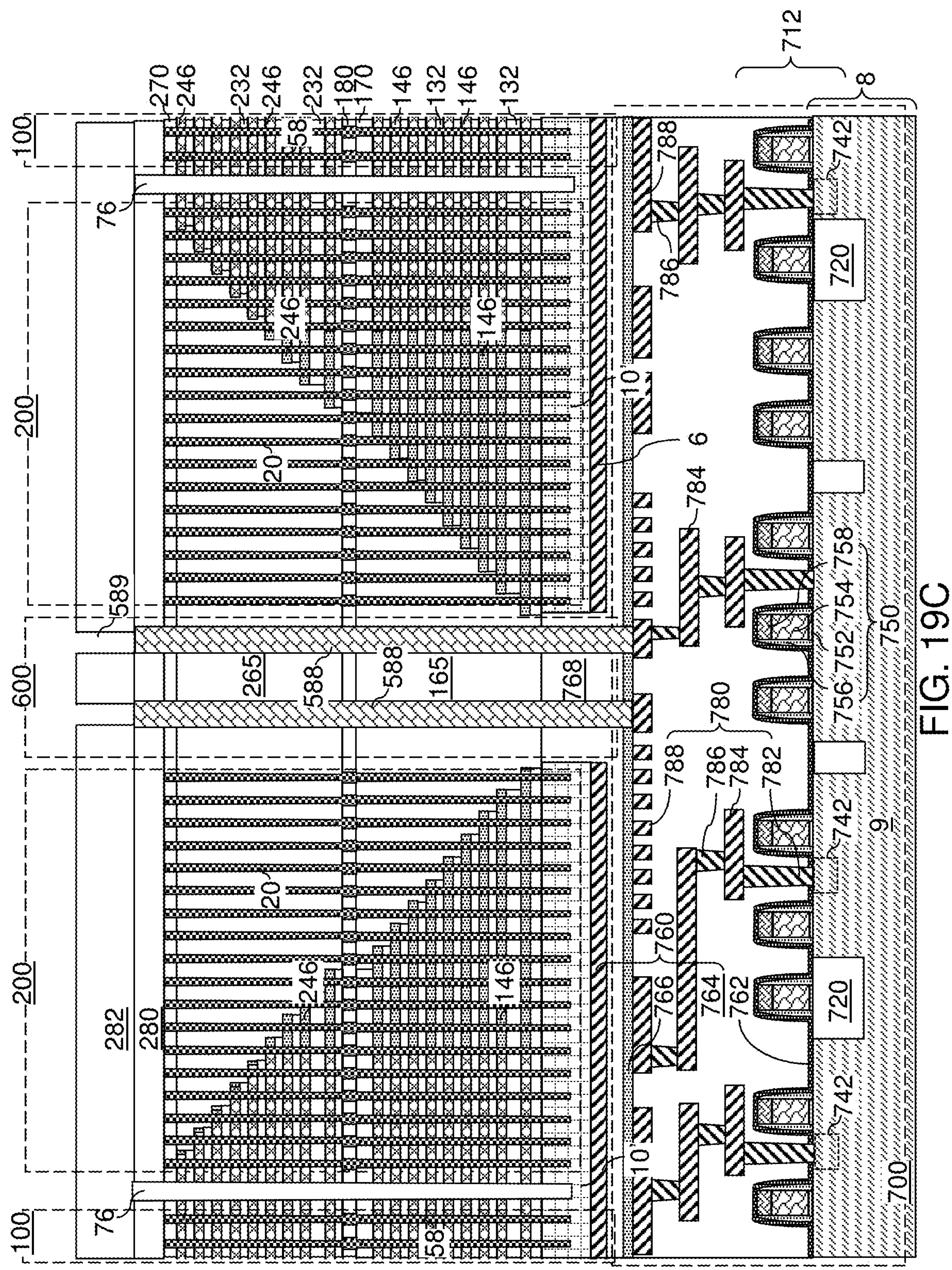
FIG. 19C is a vertical cross-sectional view of the first exemplary structure along the hinged vertical plane C-C' of FIG. 19B.

Referring to FIGS. 19A-19C, a second contact level dielectric layer 282 can be formed over the first contact level dielectric layer 280. The second contact level dielectric layer 282 includes a dielectric material such as silicon oxide. The thickness of the second contact level dielectric layer 282 can be in a range from 200 nm to 1,000 nm, although lesser and greater thicknesses can also be used.

A contact-level photoresist layer (not shown) can be applied over the second contact level dielectric layer 282, and is lithographically patterned to form opening at locations at which contact via structures are to be subsequently formed. The pattern in the contact-level photoresist layer is transferred through the second contact level dielectric layer 282, the first contact level dielectric layer 280, the second retro-stepped dielectric material portion 265, the inter-tier dielectric layer 180, and the first retro-stepped dielectric material portion 165 to form contact via cavities. The contact via cavities can include word line contact via cavities 81 that extend to a respective one of the first and second electrically conductive layers (146, 246), drain contact via cavities 87 that extend to a respective one of the first and second electrically conductive layers (146, 246), peripheral contact via cavities 489 that extend to a respective one of the peripheral connection via structure 488 and inter-array region contact via cavities 589 that extend to a respective one of the inter-array connection via structures 588. The contact-level photoresist layer can be subsequently removed, for example, by ashing.

Referring to FIG. 20A-20D, a first line-level photoresist layer can be applied over the second contact level dielectric layer 282, and can be lithographically patterned to form line patterns. The line patterns include a first subset of line patterns that overlie a respective one of the contact via cavities (81, 87, 489, 589) and a second subset of line patterns that do not overlie any of the contact via cavities (81, 87, 489, 589) formed across a respective inter-array connection via regions 600 between a neighboring pair of staircase regions 200 between two groups of alternating stacks {(132, 146), (232, 246)}.

The line patterns are transferred into an upper region of the second contact level dielectric layer 282 by an anisotropic etch process. First line-level trenches are formed underneath the openings in the first line-level photoresist layer. A first subset of the first line-level trenches can be adjoined to underlying contact via trenches to provide integrated line-and-via cavities (85, 591, 491). For example, the integrated line-and-via cavities (85, 591, 491) can include integrated word line connection cavities 85 that include a respective one of the word line via cavities 81 and an overlying first line-level cavity, integrated inter-array cavities 591 that include a respective one of the inter-array region contact via cavities 589 and an overlying first line-level cavity, and integrated peripheral cavities 491 that include a respective one of the peripheral contact via cavities 489 and an overlying first line-level cavity.

Figure 20A:
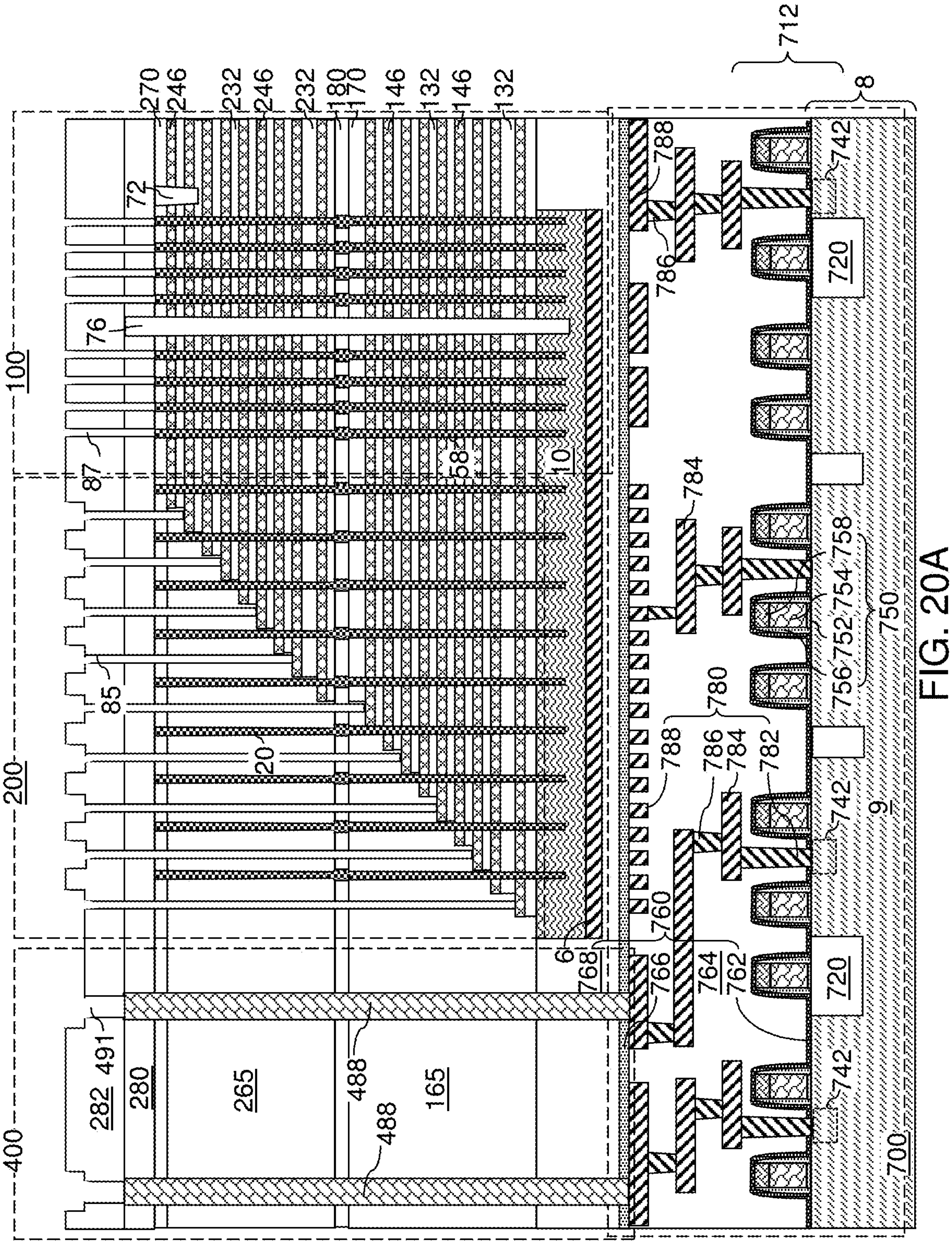
FIG. 20A is a vertical cross-sectional view of the first exemplary structure after formation of first line-level trenches according to the first embodiment of the present disclosure.
Figure 20B:
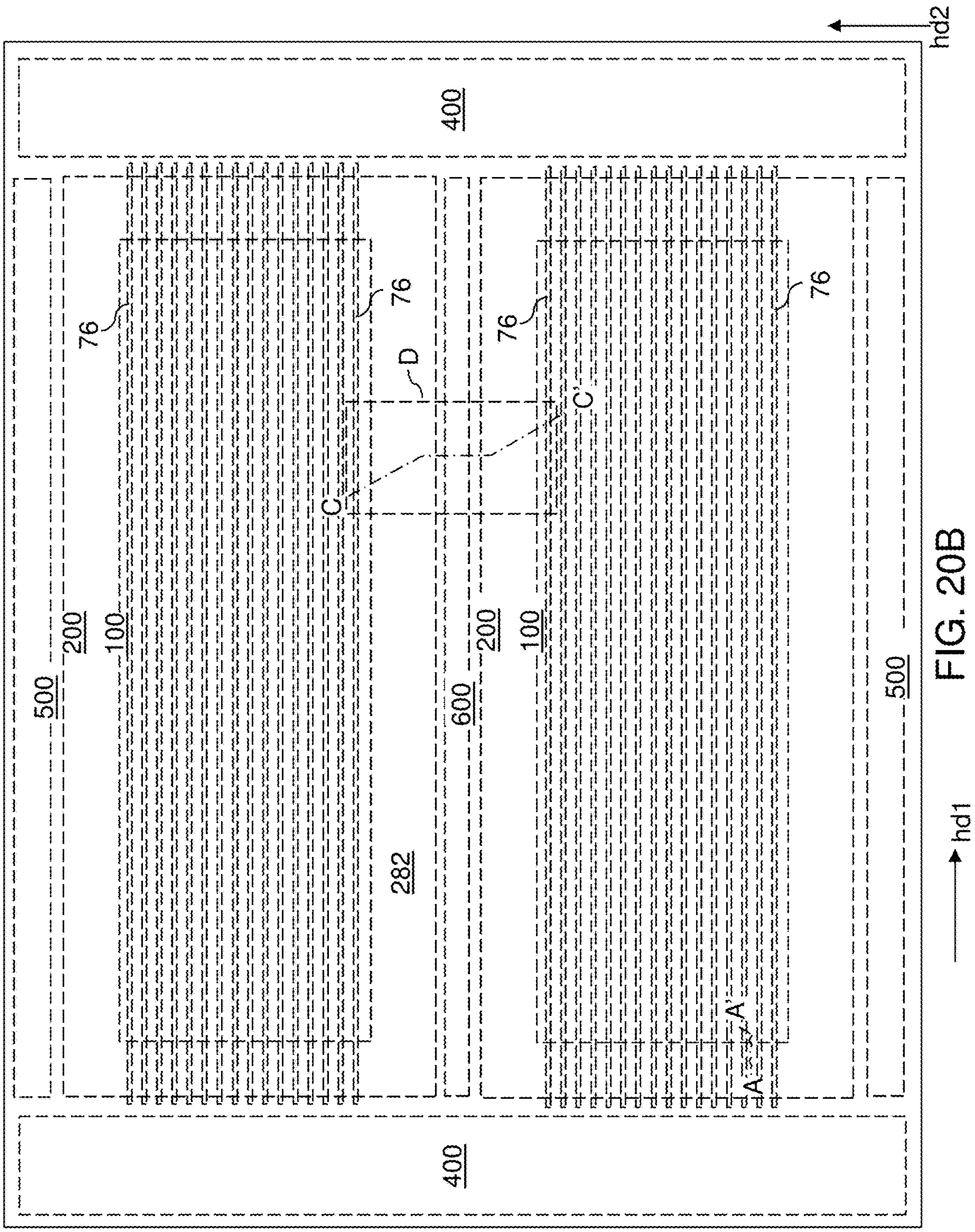
FIG. 20B is a top-down view of the first exemplary structure of FIG. 20A. The hinged vertical plane A-A' is the plane of the vertical cross-sectional view of FIG. 20A.
Figure 20C:
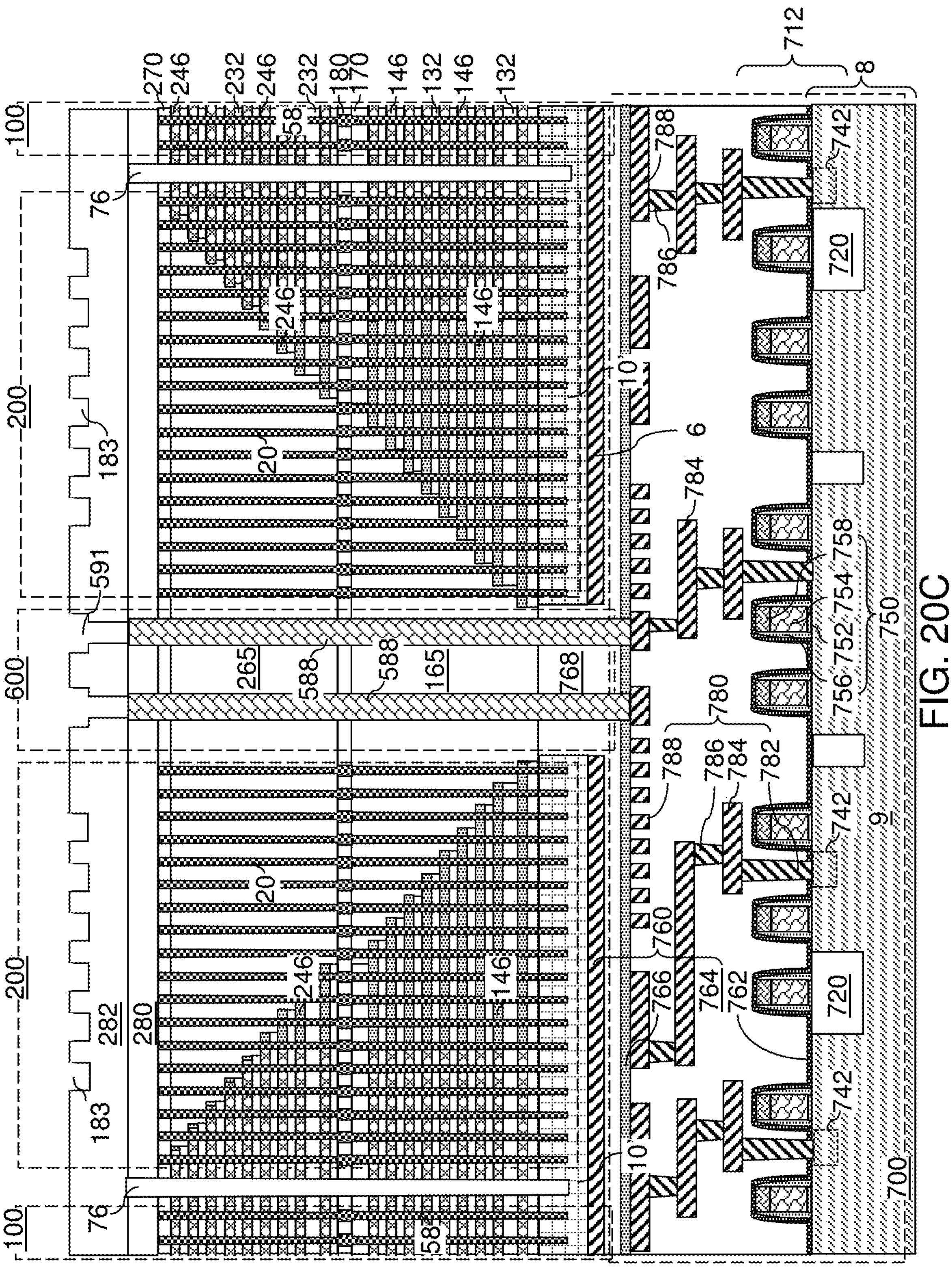
FIG. 20C is a vertical cross-sectional view of the first exemplary structure along the hinged vertical plane C-C' of FIG. 20B.
Figure 20D:
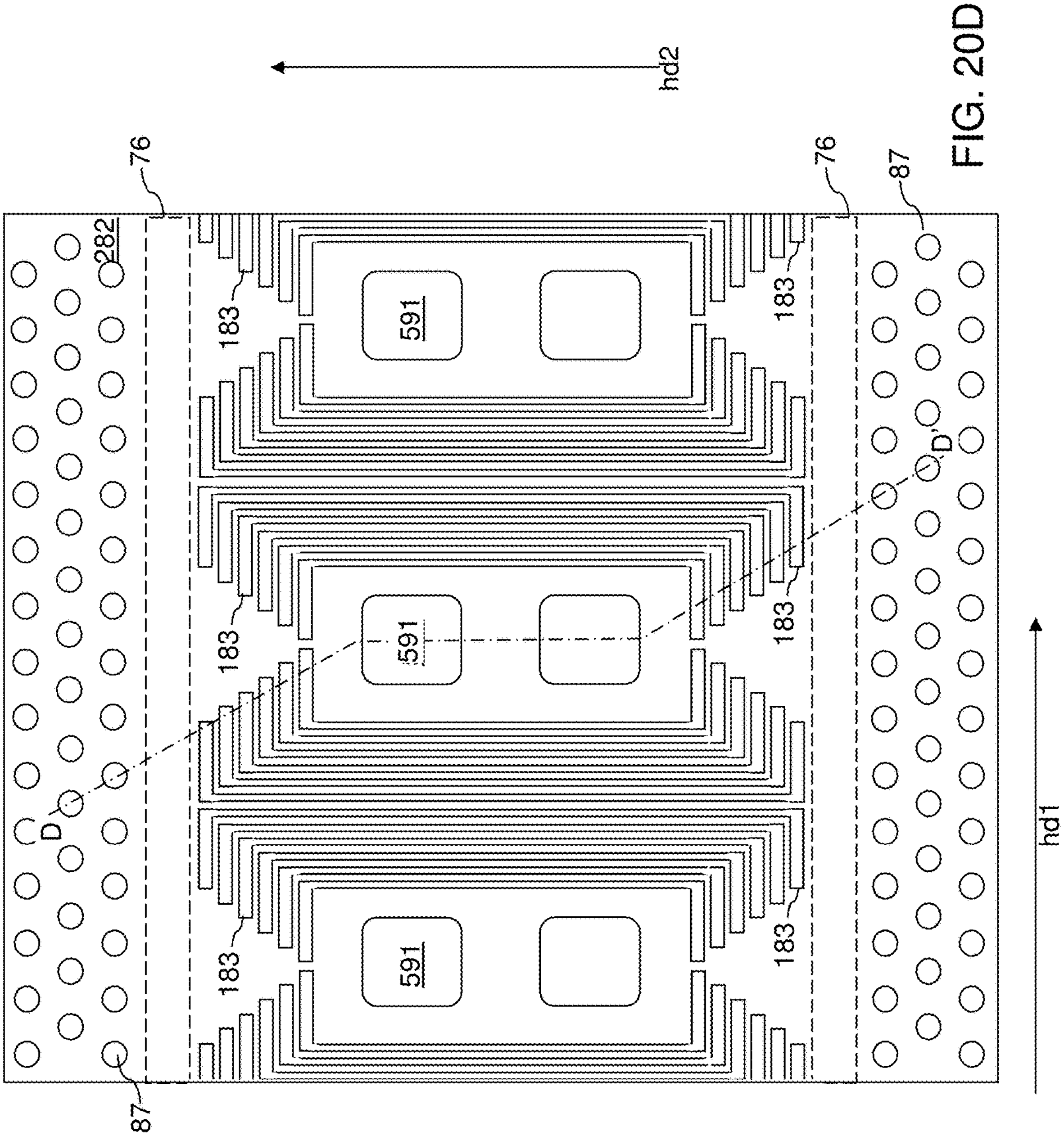
FIG. 20D is a magnified view of a region D of FIG. 20B.

According to an embodiment of the present disclosure shown in FIGS. 20C and 20D, the first line-level trenches include interconnection line trenches 183, which are a second subset of line patterns that do not overlie any of the contact via cavities (81, 87, 489, 589) formed across a respective inter-array connection via regions 600 between a neighboring pair of staircase regions 200 between two groups of alternating stacks {(132, 146), (232, 246)}. In one embodiment, the interconnection lines trenches 183 can be formed around the integrated inter-array cavities 591 such that each interconnection line trench 183 provides a detour path between a point overlying a first staircase region surrounding a first group of alternating layers {(132, 146), (232, 246)} to another point overlying a second staircase region 200 surrounding a second group of alternating layers {(132, 146), (232, 246)}. The bottom surfaces of the interconnection lines trenches 183 can be between the top surface of the second contact level dielectric layer 282 and the bottom surface of the second contact level dielectric layer 282. The layout of the interconnection line trenches 183 can be configured such that the interconnection line trenches 183 are formed entirely between neighboring pairs of memory array regions 100. In one embodiment, the interconnection line trenches 183 do not overlie areas of memory stack structures 55 so that overlaps with the drain contact via cavities 87 are avoided.

Referring to FIGS. 21A-21D, at least one conductive material is deposited within the drain contact via cavities 87, the integrated word line connection cavities 85, the integrated inter-array cavities 591, and the integrated peripheral cavities 491. Excess portions of the at least one conductive material overlying the top surface of the second contact level dielectric layer 282 can be removed, for example, by a planarization process. Each remaining portion of the at least one conductive material in the drain contact via cavities 87 constitute drain contact via structures 88. Each drain contact via structure 88 can be formed on a top surface of a respective one of the drain regions 63. Remaining portions of the at least one conductive material in the integrated word line connection cavities 85 include word line contact via structures 86 and first word-line-interconnect metal lines 186. Remaining portions of the at least one conductive material in the integrated inter-array cavities 591 include inter-array region contact via structures 596 and first inter-array region metal pads 598. Remaining portions of the at least one conductive material in the integrated peripheral cavities 491 include peripheral region contact via structures 496 and first peripheral region metal pads 498. In case an integrated word line connection cavity 85 is connected to an integrated peripheral cavity 491, a word-line-interconnect metal line 186 can be connected to a first peripheral region metal pad 498. The first inter-array region metal pads 598 and the first peripheral region metal pads 498 are interconnection metal pads, and are herein collectively referred to as first interconnection metal pads (598, 498).

According to an embodiment of the present disclosure shown in FIGS. 20C and 20D, the respective remaining portions of the at least one conductive material in the interconnection line trenches 183 constitute interconnection line segments 184. The interconnection line segments 184 can be formed over portions of the retro-stepped dielectric material portions (165, 265) that extend along the first horizontal direction hd1 in inter-array connection via regions 600 between two memory regions 100. A group of interconnection line segments 184 can laterally surround an area of at least one first inter-array region metal pad 598. Each group of interconnection line segments 184 can include a first subgroup of interconnection line segments 184 located on one side of the at least one first inter-array region metal pad 598, and a second subgroup of interconnection line segments 184 located on another side of the at least one first inter-array region metal pad 598. The bottom surfaces of the interconnection line segments 184 can be located between the top surface of the second contact level dielectric layer 282 and the bottom surface of the second contact level dielectric layer 282. The interconnection line segments 184, the first word-line-interconnect metal lines 186 and the first inter-array region metal pads (498, 598) are not shown in FIG. 21B for clarity and due to the relative scale of the elements.

Figure 21A:
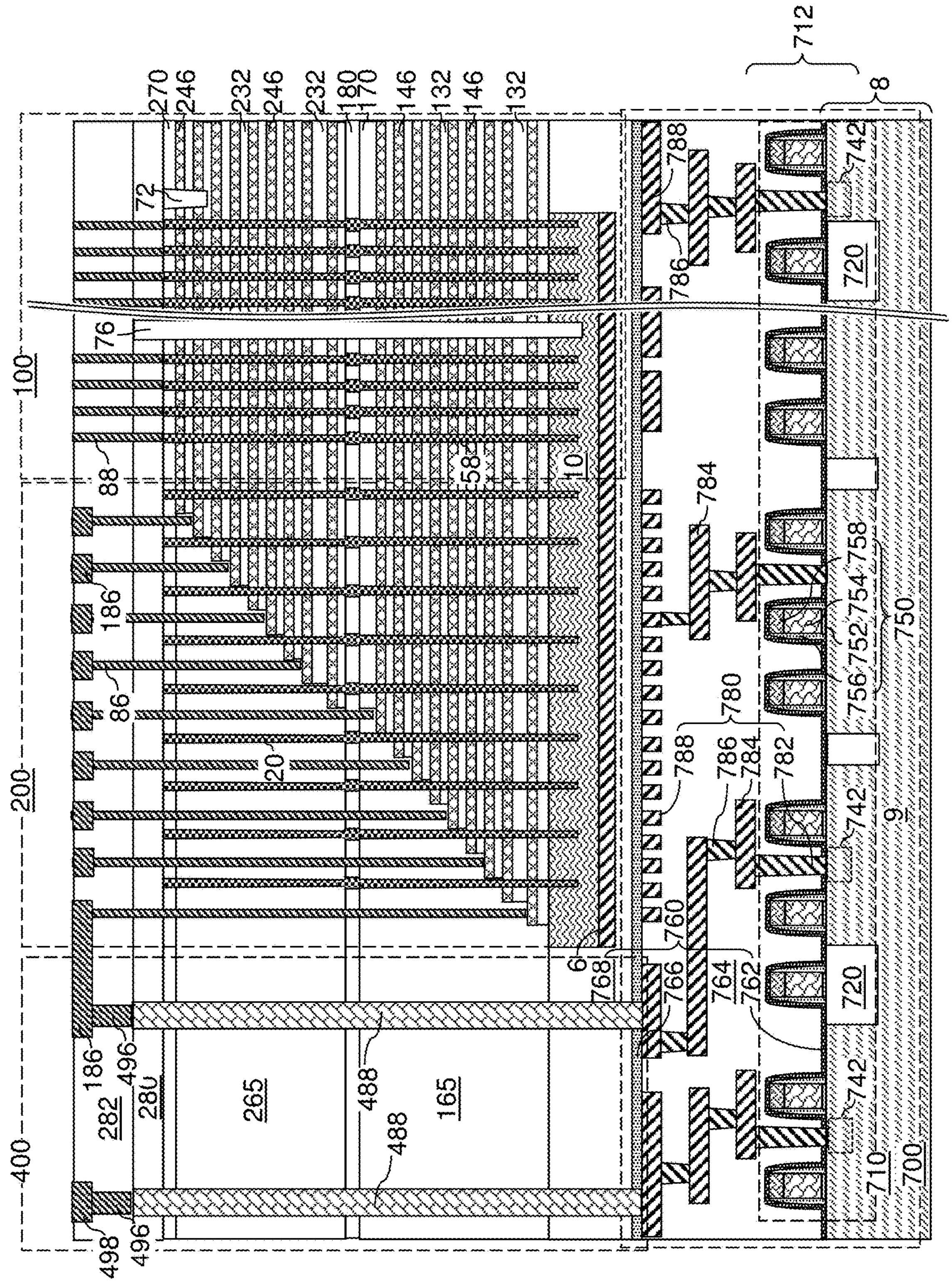
FIG. 21A is a vertical cross-sectional view of the first exemplary structure after formation of contact via structures and first line-level structures according to the first embodiment of the present disclosure.
Figure 21B:
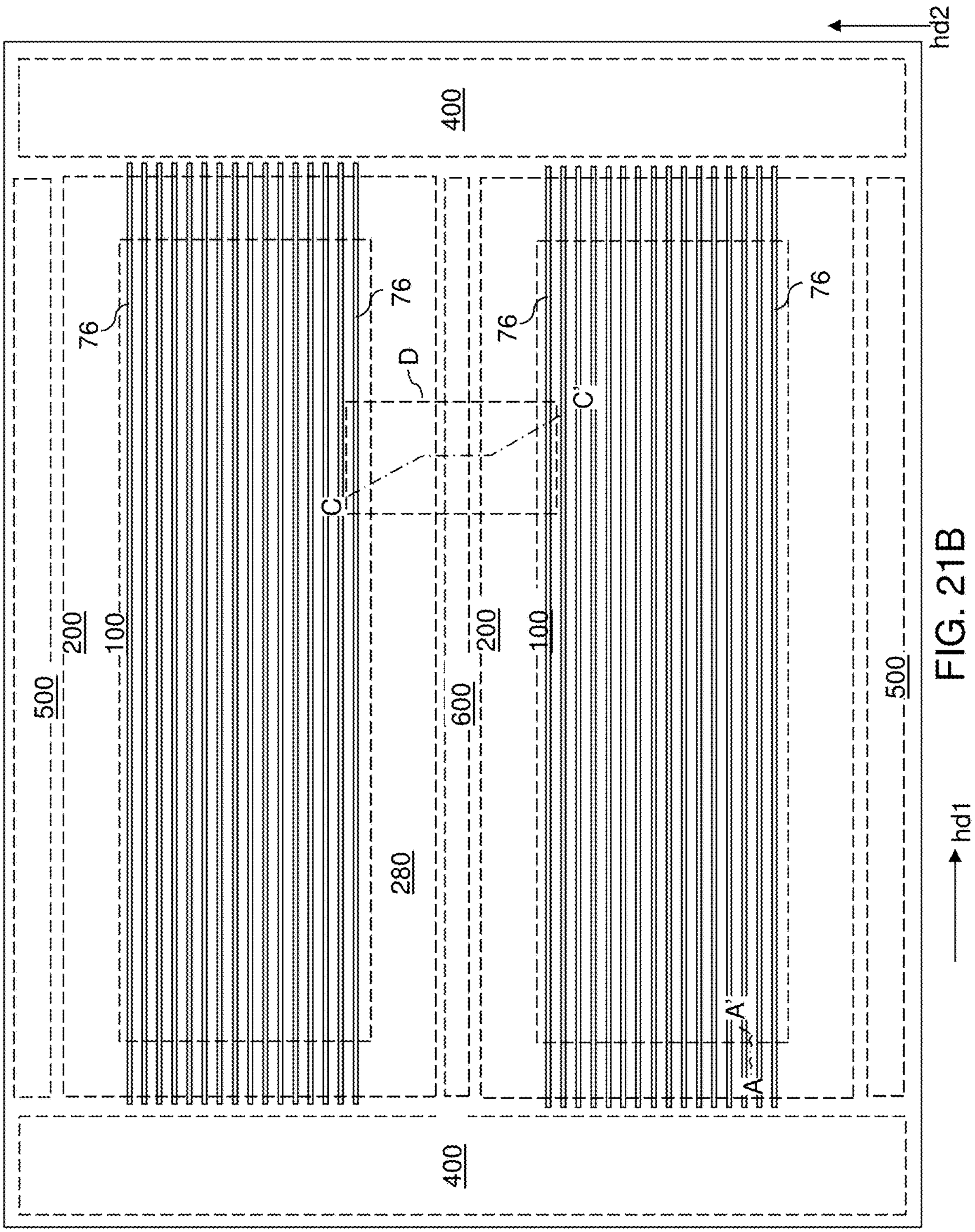
FIG. 21B is a top-down view of the first exemplary structure of FIG. 21A. The hinged vertical plane A-A' is the plane of the vertical cross-sectional view of FIG. 21A.
Figure 21C:
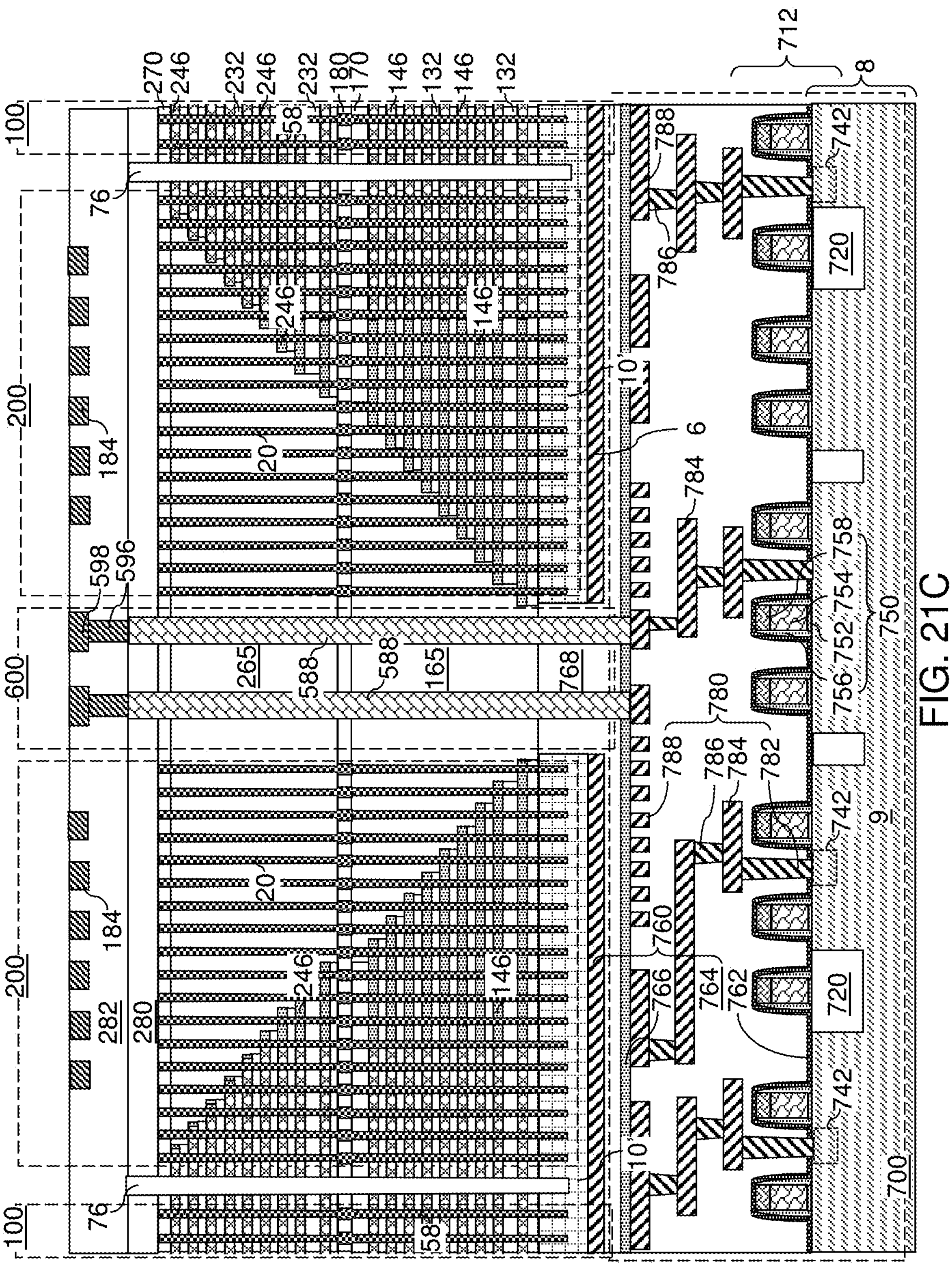
FIG. 21C is a vertical cross-sectional view of the first exemplary structure along the hinged vertical plane C-C' of FIG. 21B.
Figure 21D:
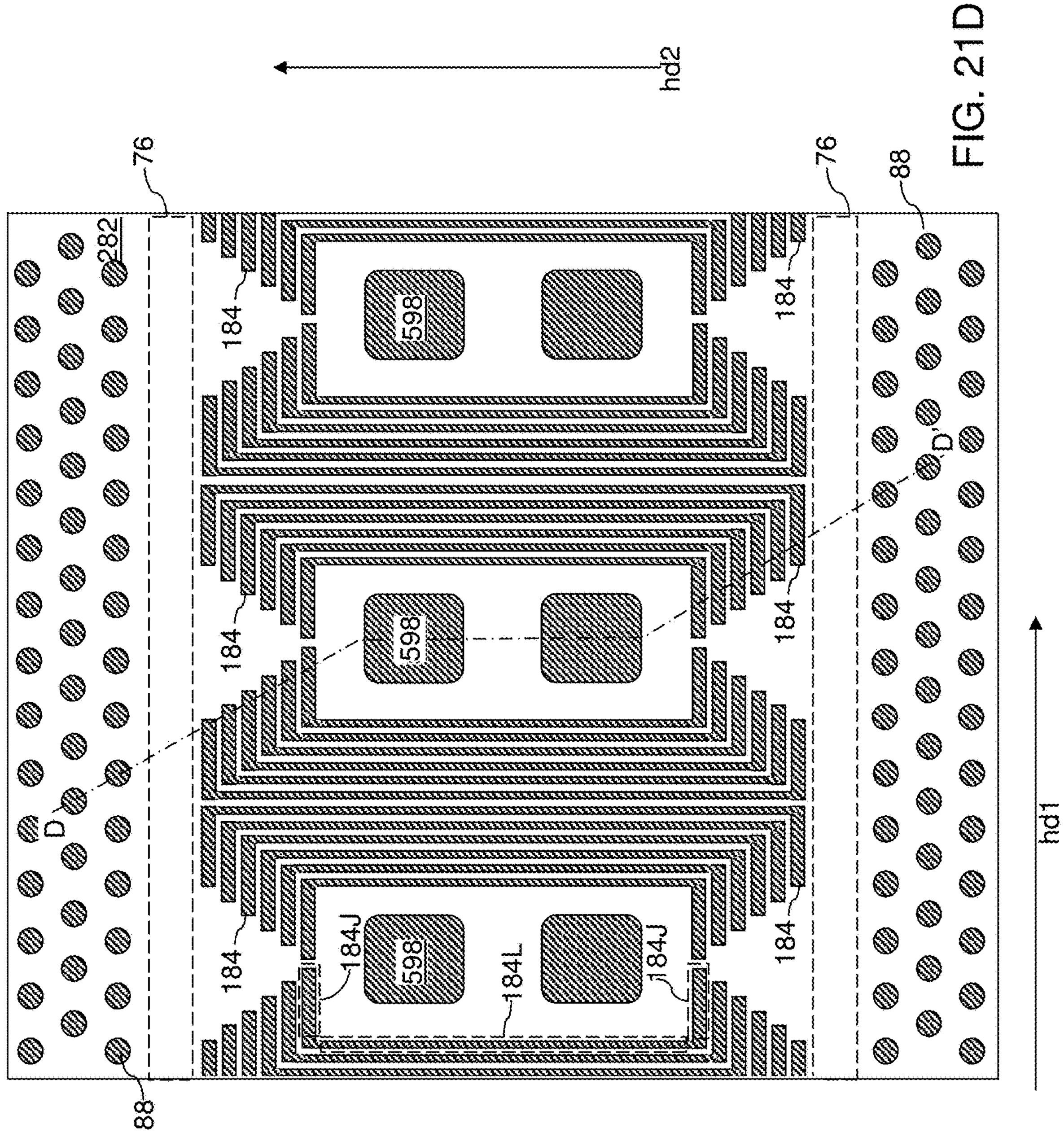
FIG. 21D is a magnified view of a region D of FIG. 21B.

As shown in FIG. 21D, each interconnection line segment 184 can include a linear portion 184L that extends along the second horizontal direction (e.g., bit line direction) hd2 and laterally offset from a most proximal one of the first inter-array region metal pads 598, and a pair of lateral-jog portions 184J that extend along the first horizontal direction (e.g., word line direction) hd1 and adjoined to end regions of the linear portion 184L. In one embodiment, the interconnection line segments 184 can be located in an area that that surrounds the area of a respective subset of the first inter-array region metal pads 598.

Referring to FIGS. 22A-22E, a first interconnect-level dielectric layer 290 can be formed over the second contact level dielectric layer 282. Various integrated line and via cavities can be formed by a combination of two lithographic patterning processes and two anisotropic etch processes. For example, via cavities can be formed by application and patterning of a first via-level photoresist layer and an anisotropic etch that forms first via cavities in the first interconnect-level dielectric layer 290. Line cavities can be formed by application and patterning of a second line-level photoresist layer and an anisotropic etch that forms second line cavities that overlap with an upper portion of a respective one of the first via cavities. Formation of the line cavities can follow, or precede, formation of the via cavities. Each combination of at least one first via cavity and a line cavity constitutes an integrated line and via cavity.

A dual damascene process can be used to form integrated line and via structures that include a respective set of a metal line and at least one via structure. At least one conductive material can be deposited in the integrated line and via cavities. Excess portions of the at least one conductive material can be removed from above the horizontal plane including the top surface of the first interconnect-level dielectric layer 290. Each remaining portion of the at least one conductive material in the integrated line and via cavities constitute an integrated line and via structure that includes a combination of a second line-level structure and at least one first via-level structure.

Alternatively, a via-level dielectric layer and a line-level dielectric layer can be formed in lieu of the first interconnect-level dielectric layer 290. In this case, via structures can be formed in the via-level dielectric layer using a first single damascene process, and metal lines can be formed in the line-level dielectric layer in a second single damascene process.

Generally, the via structures in the first interconnect-level dielectric layer 290 can be provided as standalone via structures or as a lower portion of an integrated line and via structure. The via structures in the first interconnect-level dielectric layer 290 can be concurrently by deposition of a same set of at least one conductive material. The via structures in the first interconnect-level dielectric layer 290 can include drain-connection via structures 308, first peripheral via structures 404, first inter-array region via structure 504, and bit-line-interconnection via structures 302. The drain-connection via structures 308 contact a top surface of a respective one of the drain contact via structures 88. The first peripheral via structures 404 contact a top surface of a respective one of the first peripheral region metal pads 498.

The first inter-array region via structure 504 contacts a top surface of a respective one of the first inter-array region metal pads 598. The bit-line-interconnection via structures 302 are formed at an end of each lateral-jog portion 184J of each interconnection line segment 184.

The metal lines in the first interconnect-level dielectric layer 290 can be provided as standalone metal lines or as an upper portion of an integrated line and via structure. The metal lines in the first interconnect-level dielectric layer 290 can be formed in an upper portion of the first interconnect-level dielectric layer 290 after formation of the via structures, or can be formed concurrently with formation of the via structures as a component in integrated line and via structures. The metal lines in the first interconnect-level dielectric layer 290 can be concurrently by deposition of a same set of at least one conductive material.

The metal lines in the first interconnect-level dielectric layer 290 can include bit-line-level bit line segments 318, second peripheral region metal pads 414, and second inter-array region metal pads 514. Elements 318, 414 and 514 are not shown in FIG. 21B for clarity and due to the relative scale of the elements.

A first subset of the bit-line-level bit line segments 318 can comprise a set of entire bit lines, where each bit-line-level bit line segment 318 in the first subset comprises an entire bit line. The first subset of the bit-line-level bit line segments 318 can extend straight along the second horizontal direction (e.g., bit line direction) hd2 across two memory array regions 100 and an intervening inter-array connection via region 600. Thus, the first subset of the bit-line-level bit line segments 318 can extend straight along the second horizontal hd2 over a first group of alternating stacks {(132, 146), (232, 246)} separated by a first group of backside trenches 79 and located in a first memory array region 100, over a first staircase region 200 surrounding the first group of alternating stacks {(132, 146), (232, 246)}, over segments of retro-stepped dielectric material portions (165, 265) located in an inter-array connection via region 600, over a second group of alternating stacks {(132, 146), (232, 246)} separated by a second group of backside trenches 79 and located in a second memory array region 100, and over a second staircase region 200 surrounding the second group of alternating stacks {(132, 146), (232, 246)} and adjoining the inter-array connection via region 600.

A second subset of the bit-line-level bit line segments 318 can be formed on a respective subset of the bit-line-interconnection via structures 302, and can extend straight along the second horizontal direction hd2 across one memory array regions 100 and an adjoined staircase region 200. The second subset of the bit-line-level bit line segments 318 may, or may not, extend into an adjoining inter-array connection via region 600. Thus, the second subset of the bit-line-level bit line segments 318 can extend straight along the second horizontal hd2 over one group of alternating stacks {(132, 146), (232, 246)} separated by a group of backside trenches 79 and located in a memory array region 100, and over a staircase region 200 surrounding the group of alternating stacks {(132, 146), (232, 246)}. Thus, each of the bit-line-level bit line segments 318 in the second subset comprises a portion of an entire bit line.

Figure 22A:
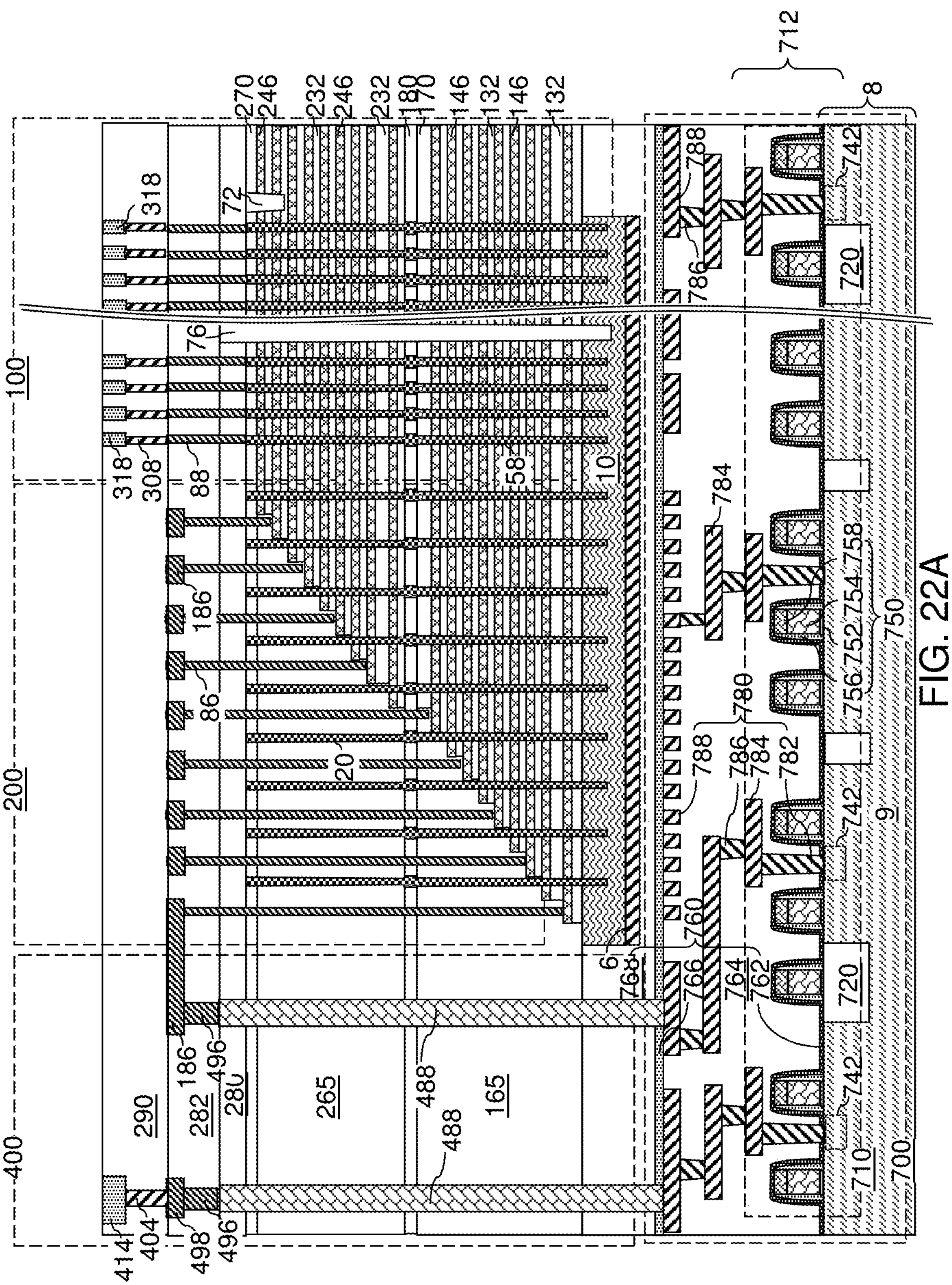
FIG. 22A is a vertical cross-sectional view of the first exemplary structure after formation of a first interconnect-level dielectric layer, first via-level structures, and second line-level structures according to the first embodiment of the present disclosure.
Figure 22B:
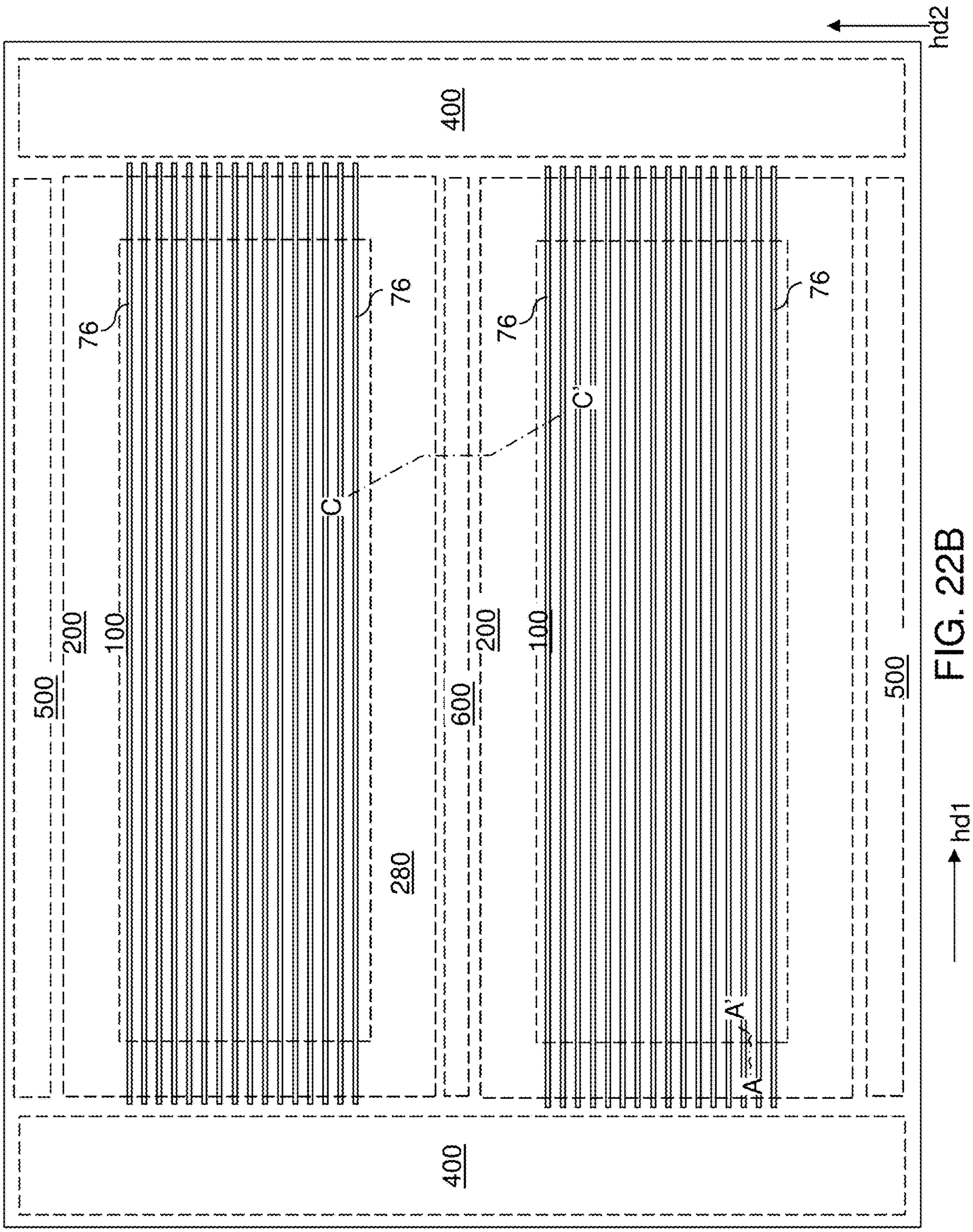
FIG. 22B is a top-down view of the first exemplary structure of FIG. 22A. The hinged vertical plane A-A' is the plane of the vertical cross-sectional view of FIG. 22A.
Figure 22C:
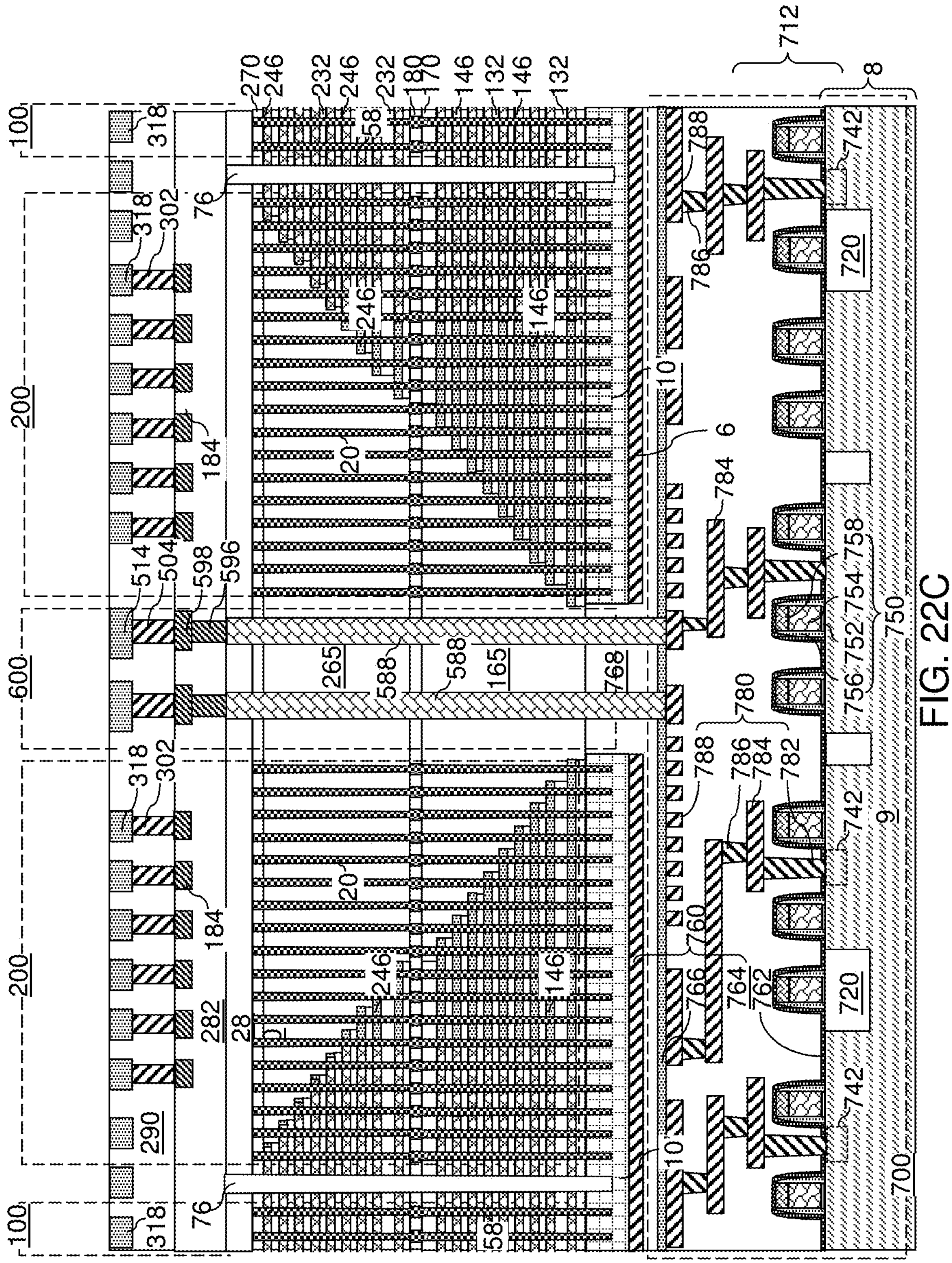
FIG. 22C is a vertical cross-sectional view of the first exemplary structure along the hinged vertical plane C-C' of FIG. 22B.
Figure 22D:
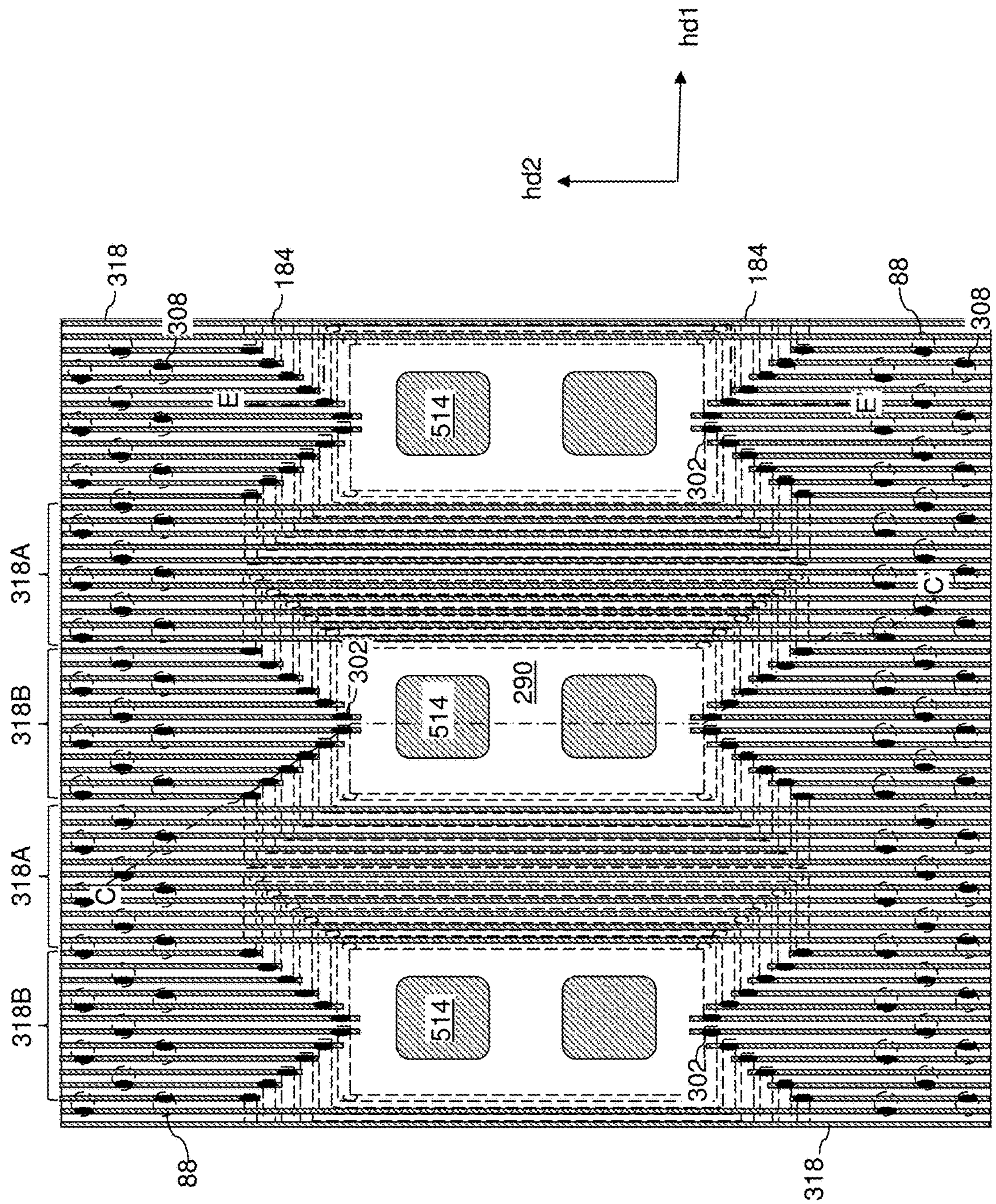
FIG. 22D is a partial see-through magnified view of a region D of FIG. 22B.
Figure 22E:
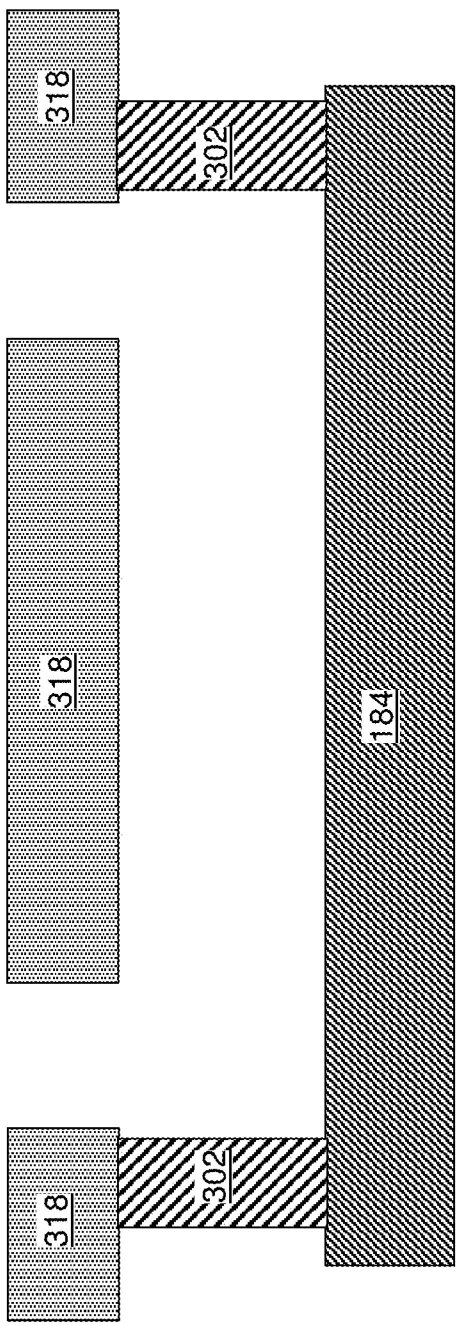
FIG. 22E is a schematic vertical cross-sectional view of an bit line along the zig-zag vertical cross-sectional plane E-E' of FIG. 22D.

The bit-line-level bit line segments 318 are electrically connected to an upper end of a respective subset of the vertical semiconductor channels 60 through respective drain regions 63 and electrically conductive elements 88 and 308. Bit lines including the bit-line-level bit line segments 318 are provided. The bit lines include a first subset of bit lines 318A (which are herein referred to as first bit lines) and a second subset of bit lines 318B (which are herein referred to as second bit lines), as shown in FIG. 22D. Each first bit line in the first subset of bit lines consists 318A of a single one of the bit-line-level bit line segments 318. Each first bit line extends over the two groups of alternating stacks {(132, 146), (232, 246)} as a continuous line structure having straight edges throughout (i.e., from one end to another end), and is vertically spaced from the substrate by a first interconnect-level separation distance sd1 (shown in FIGS. 23A and 23B). Each second bit line in the second subset of bit lines 318B comprises a respective multi-level structure. Each multi-level structure includes bit-line-level bit line segments 318 spaced from the substrate 8 by the first interconnect-level separation distance, an interconnection line segment 184 that is spaced from the substrate by a distance that is different from the first interconnect-level separation distance, and at least two bit-line-interconnection via structures 302, as shown in FIG. 22E. The bit lines (318, 184, 302) do not overlie any area of the through-memory-level via structures (488, 588).

The second peripheral region metal pads 414 and second inter-array region metal pads 514 are formed concurrently with formation of the first subset of the bit lines 318A (each bit line in this subset consists of a respective one of the bit-line-level bit line segments 318) and the bit-line-level bit line segments 318 of the second subset of the bit lines 318B using a same metallic material deposition step and a same patterning step. The bit-line-interconnection via structures 302 connect each lateral-jog portion 184J of a respective one of the interconnection line segments 184 to a respective one of the bit-line-level bit line segments 318 of the second subset of bit lines 318B. The interconnection line segments 184 of the multi-level structures (318, 302, 184) can be located in an area that that surrounds the area of the through-memory-array via structures 588. In one embodiment, the interconnection via structures 302 can overlie, a respective dielectric wall structure 76.

Figure 23A:
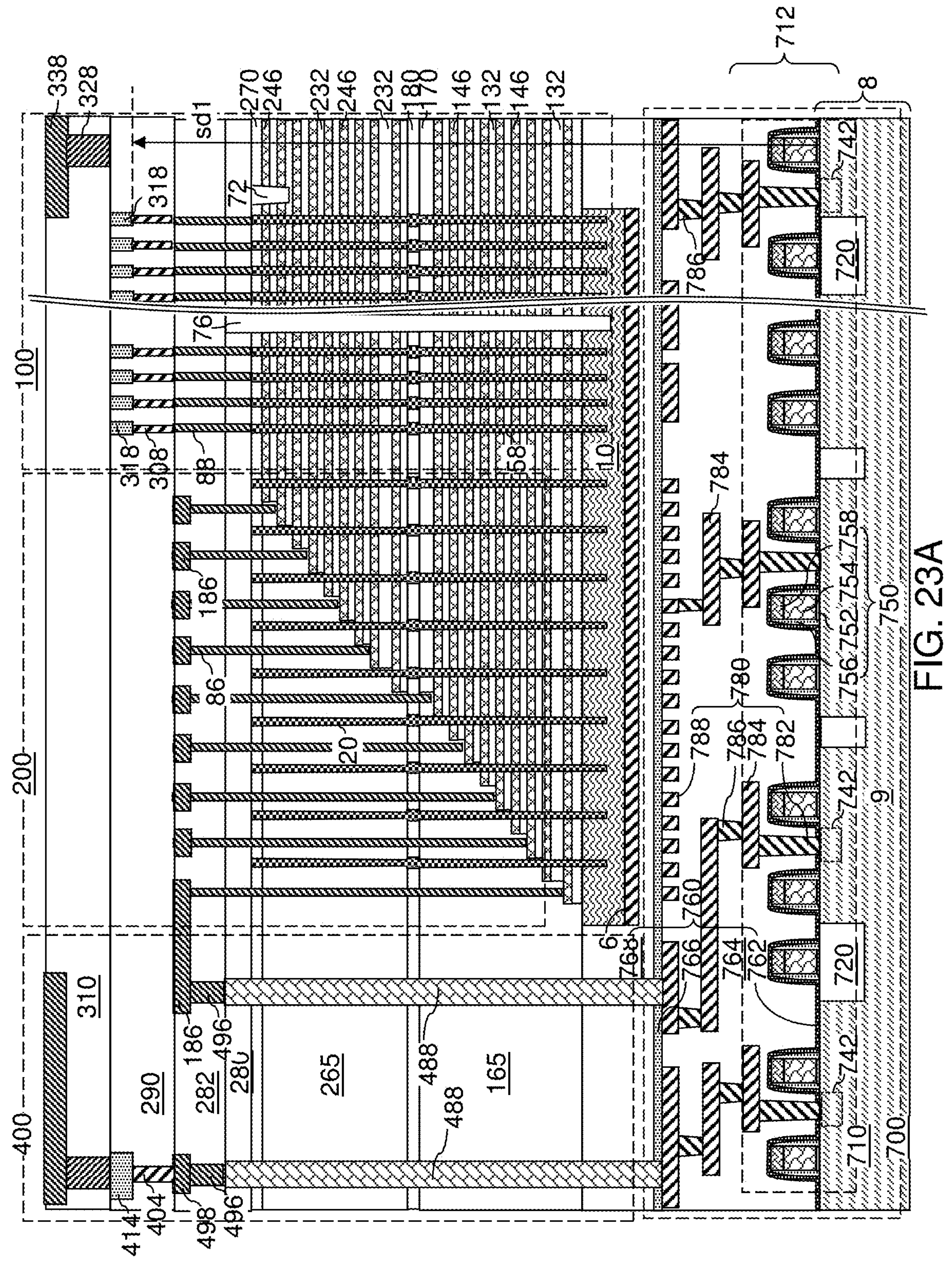
FIG. 23A is a vertical cross-sectional view of the first exemplary structure after formation of additional dielectric layers, additional metal interconnect structures, and bonding pads according to the first embodiment of the present disclosure.
Figure 23B:
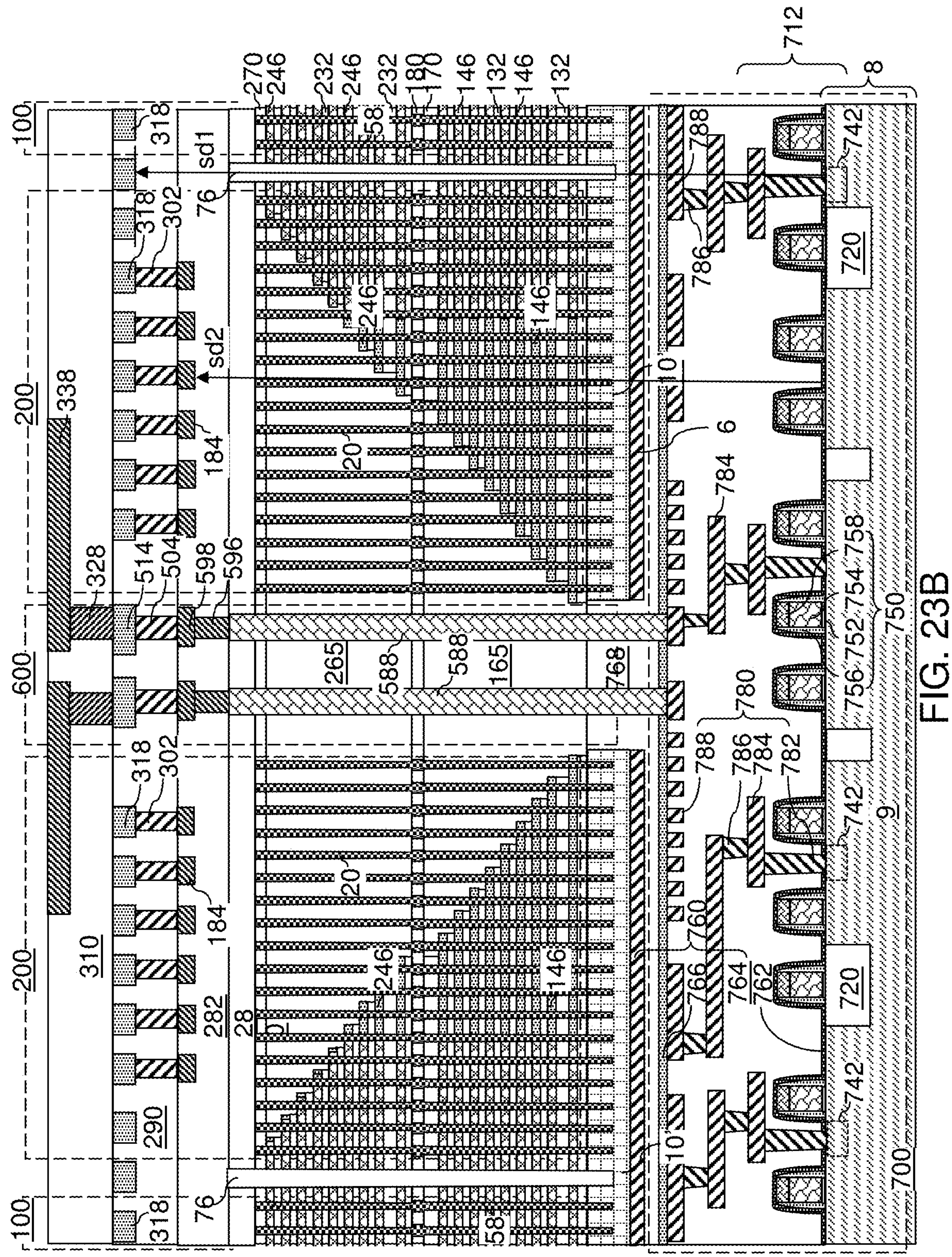
FIG. 23B is another vertical cross-sectional view of the first exemplary structure of FIG. 23A.
Figure 23C:
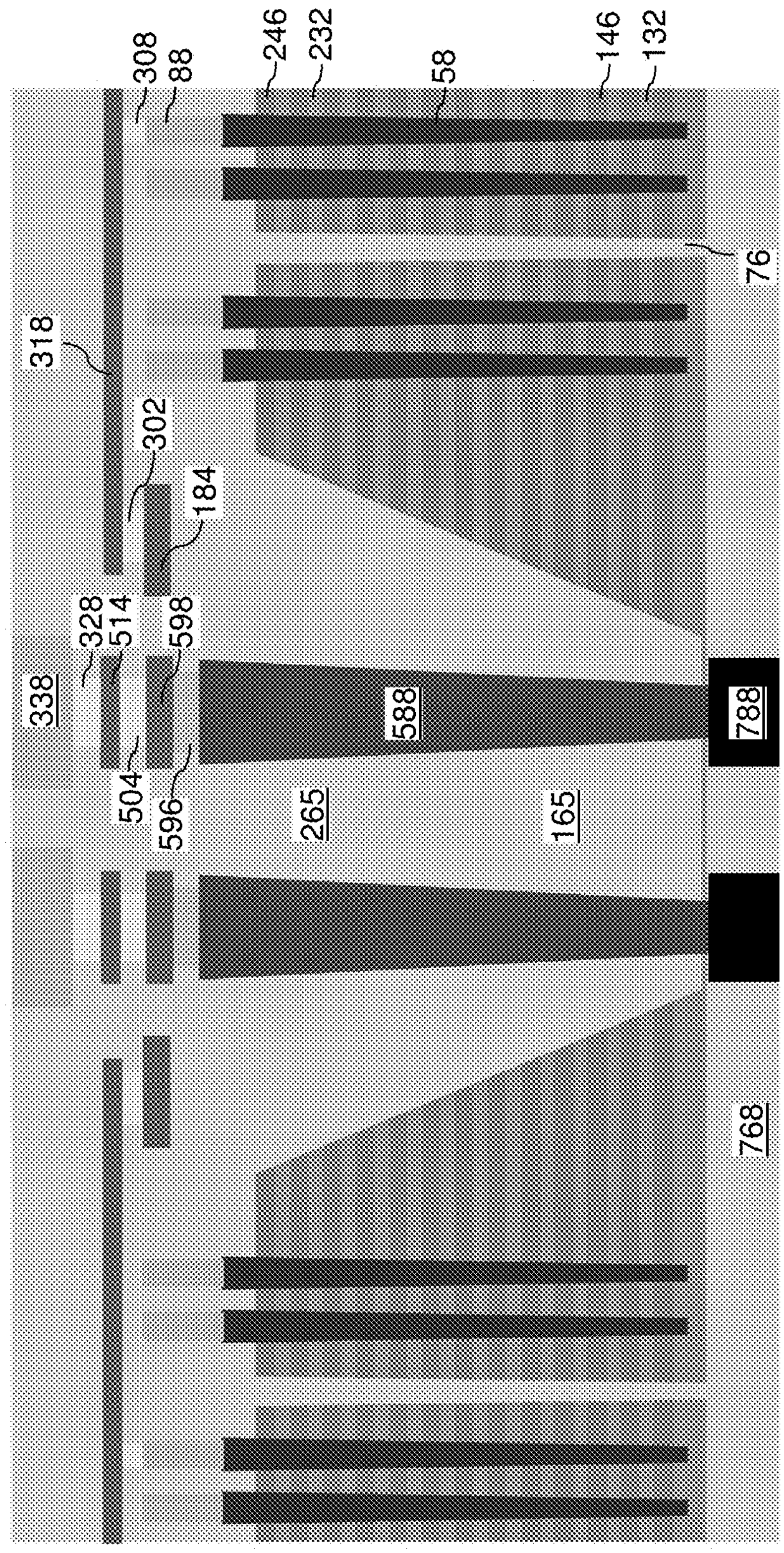
FIG. 23C is another schematic vertical cross-sectional view of the first exemplary structure of FIGS. 23A and 23B.

Referring to FIGS. 23A-23C, additional dielectric layers 310, additional metal interconnect structures 328, and bonding pads 338 can be formed over the first interconnect-level dielectric layer 290. The additional dielectric layers 310 can include at least one additional interconnect-level dielectric layer such as a second interconnect-level dielectric layer, a third interconnect-level dielectric layer, etc. The additional metal interconnect structures 328 can include various interconnect via structures and/or interconnect metal lines. The bonding pads 338 can be formed on a topmost subset of the metal interconnect structures 328.

Figure 23D:
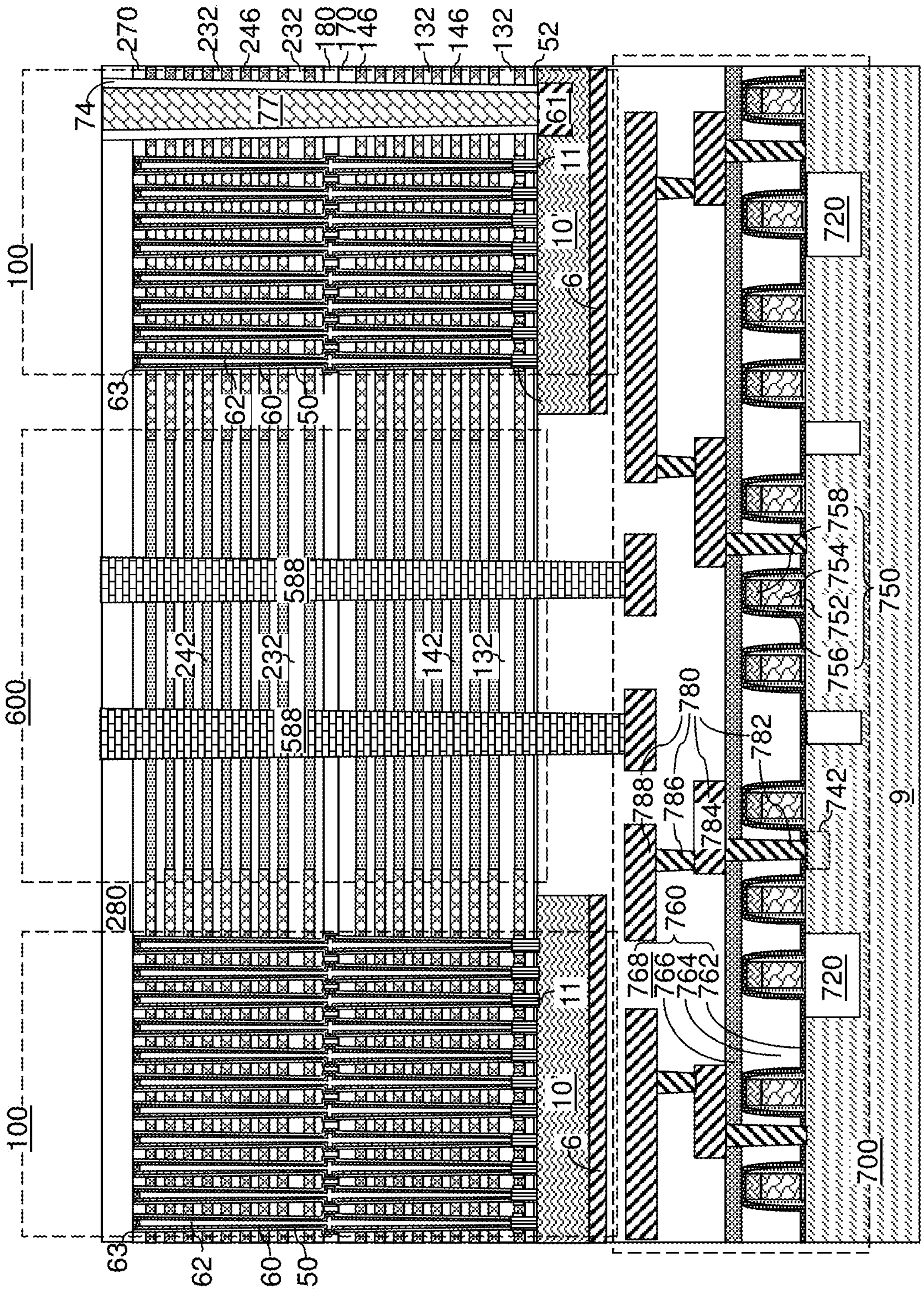
FIG. 23D is a vertical cross-sectional view of an alternative configuration of the first exemplary structure.

FIG. 23D illustrates an alternative configuration of the first exemplary structure of the first embodiment. In this embodiment, instead of forming the inter-array connection via region 600 in the retro-stepped dielectric regions (165, 265) shown in FIG. 23 and located between two staircase regions 200 the inter-array connection via region 600 is formed through an alternating stack of the insulating layers (132, 232) and dielectric spacer layers (142, 242). In this alternative method, rather than forming the staircase regions 200 as shown in FIG. 3, a portion of the dielectric first and second spacer material layers (142, 242) are not replaced with the respective electrically conductive layers (146, 246) in the inter-array connection via region 600. The dielectric first and second spacer material layers (142, 242), such as silicon nitride layers, remain as dielectric spacer layers in the inter-array connection via region 600 and form an alternating stack {(132, 142), (232, 242)} of the insulating layers (132, 232) and dielectric spacer layers (142, 242) between first and second alternating stacks {(132, 146), (232, 246)} of insulating layers and electrically conductive layers. The through-memory-array via structures 588 extend through the alternating stack {(132, 142), (232, 242)} of the insulating layers (132, 232) and dielectric spacer layers (142, 242) in the inter-array connection via region 600. The additional layers are then formed over the first contact level dielectric layer 280 as shown in FIGS. 23A and 23B.

In another alternative configuration of the first exemplary structure of the first embodiment shown in FIG. 23D, instead of forming the dielectric wall structure 76 in each backside trench 79, a dielectric spacer 74 and a source contact via 77 (e.g., source electrode or local interconnect) are formed in each in each backside trench 79. A source region 61 may be formed by ion implantation into the semiconductor material layer 10 through the backside trench 79, followed by forming the source contact via 77 in electrical contact with the source region 76. In this embodiment, an optional epitaxial semiconductor pedestal 11 may be formed on the semiconductor material layer 10 in contact with a bottom part of the vertical semiconductor channel 60. The pedestal 11 forms the channel of the source select transistor located below the word lines.

Referring to FIGS. 1A-23D collectively and according to the first embodiment of the present disclosure, a three-dimensional memory device is provided, which comprises: first and second alternating stacks of insulating layers (132, 232) and electrically conductive layers (146, 246) located over a substrate 8 and spaced apart from each other, clusters of memory stack structures 55 vertically extending through the first and second alternating stacks {(132, 146), (232, 246)}, wherein each memory stack structure 55 comprises a memory film 50 and a vertical semiconductor channel 60, and bit lines (318, 302, 184) electrically connected to an upper end of a respective subset of the vertical semiconductor channels 60. Each bit line 318 in a first subset of the bit lines 318A extends over the first and second alternating stacks as a continuous line structure (comprising a single bit-line-level bit line segment 318) and is vertically spaced from the substrate 8 by a first interconnect-level separation distance sd. Each bit line (318, 302, 184) in a second subset of the bit lines 318B comprises a respective multi-level structure (318, 302, 184), each multi-level structure (318, 302, 184) including bit-line-level bit line segments 318 spaced from the substrate 8 by the first interconnect-level separation distance sd1 and an interconnection line segment 184 that is spaced from the substrate 8 by a separation distance sd2 that is different (e.g., smaller) than the first interconnect-level separation distance sd1. Each group of memory stack structures 55 can vertically extend through a respective one of the alternating stacks {(132, 146), (232, 246)}.

In one embodiment shown in FIG. 23D, the first and second alternating stacks {(132, 146), (232, 246)} are laterally spaced apart from each other in the second horizontal direction (e.g., bit line direction) hd2 by the alternating stack {(132, 142), (232, 242)} of the insulating layers and dielectric spacer layers.

In another embodiment shown in FIG. 23B, the first and second alternating stacks {(132, 146), (232, 246)} are laterally spaced apart from each other in the second horizontal direction (e.g., bit line direction) hd2 by a retro-stepped dielectric material portion (165, 265) that laterally extends along a first horizontal direction (e.g., word line direction) hd1 over stepped surfaces of the first and second alternating stacks. In one embodiment, the bit-line-level bit line segments 318 of each multi-level structure (318, 302, 184) laterally extend along a second horizontal direction hd1 that is perpendicular to the first horizontal direction hd1; and the interconnection line segment 184 of each multi-level structure includes at least one portion (such as a lateral jog portion 184J) that laterally extends along a horizontal direction that is different from the second horizontal direction hd2.

In one embodiment, the bit-line-level bit line segments of each multi-level structure comprises: a first bit-line-level bit line segment 318 that overlies the first alternating stacks {(132, 146), (232, 246)}, and a second bit-line-level bit line segment 318 that overlies a second alternating stack {(132, 146), (232, 246)}, wherein lengthwise sidewalls of the first bit-line-level bit line segment and lengthwise sidewalls of the second bit-line-level bit line segment are located within a pair of two-dimensional Euclidean planes (i.e., two vertical planes that are perpendicular to the first horizontal direction hd1).

In one embodiment, the interconnection line segment 184 of each multi-level structure (318, 302, 184) comprises: a linear portion 184L that extends along the second horizontal direction hd2 and laterally offset from the bit-line-level bit line segments 318 of the respective multi-level structure (318, 302, 184); and a pair of lateral-jog portions 184J that extend along the first horizontal direction hd1 and adjoined to end regions of the linear portion.

In one embodiment, the pair of lateral-jog portions 184J are connected to a first bit-line-level bit line segment 318 and to the second bit-line-level bit line segment 318 by a pair of bit-line-interconnection via structures 302 that contact a respective one of the first bit-line-level bit line segment 318 and to the second bit-line-level bit line segment 318. In one embodiment, the three-dimensional memory device comprises: drain regions 63 contacting an upper end of a respective one of the vertical semiconductor channels 60; drain contact via structures 88 contacting a top surface of a respective one of the drain regions 63; and drain-connection via structures 308 contacting a top surface of a respective one of the drain contact via structures 88 and vertically spaced from the substrate 8 by a same vertical separation distance as the bit-line-interconnection via structures 302 are from the substrate 8. In one embodiment, top surfaces of the drain contact via structures 88 are located within a same horizontal plane as top surfaces of the interconnection line segments 184.

In one embodiment, the interconnection line segments 184 underlie the first subset of the bit lines 318A and have an areal overlap with the first subset of the bit lines 318A in a plan view (such as the view of FIG. 22E) along a direction perpendicular to a top surface of the substrate 8. In one embodiment, the interconnection line segment 184 of each multi-level structure (318, 302, 184) is more proximal to the substrate 8 than the bit-line-level bit line segments 318 of each multi-level structure (318, 302, 184) are to the substrate 8.

In one embodiment, three-dimensional memory device comprises a through-memory-level via structure (such as a through-memory-array via structure 588) comprises of at least one metallic material and vertically extending through the retro-stepped dielectric material portion (165, 265). The bit lines do not overlie an area of the through-memory-level via structure, and the interconnection line segments 184 of the multi-level structures (318, 302, 184) are located in an area that that surrounds the area of the through-memory-level via structure.

In one embodiment, the three-dimensional memory device can comprise an interconnect metal pad (such as a second interconnect metal pad 514) located within the area of, and electrically connected to, the through-memory-level via structure, and is vertically spaced from the substrate 8 by the first interconnect-level separation distance sd1. In one embodiment, the three-dimensional memory device can comprise field effect transistors located over a top surface of the substrate 8 under the alternating stacks, and lower-level metal interconnect structures 780 embedded in lower-level dielectric material layers 760 and located between the field effect transistors and the retro-stepped dielectric material portion (165, 265), wherein the through-memory-level via structure contacts one of the lower-level metal interconnect structures 780.

In one embodiment, the three-dimensional memory device comprises a monolithic three-dimensional NAND memory device, the electrically conductive layers (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon, the electrically conductive layers (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

In various embodiments, the multi-level structures (318, 302, 184) of the second subset of bit lines can be used to provide an area for providing electrical connections to the through-memory-array via structures 588 without reducing the density of bit lines. Bit lines can be formed throughout the entire area of each memory array region 100 without a gap. A subset of the bit lines that extend toward a through-memory-array via structure 588 can be routed over the through-memory-array via structure 588 using the multi-level structures (318, 302, 184), thereby enabling high density bit line wiring.

Figure 24A:
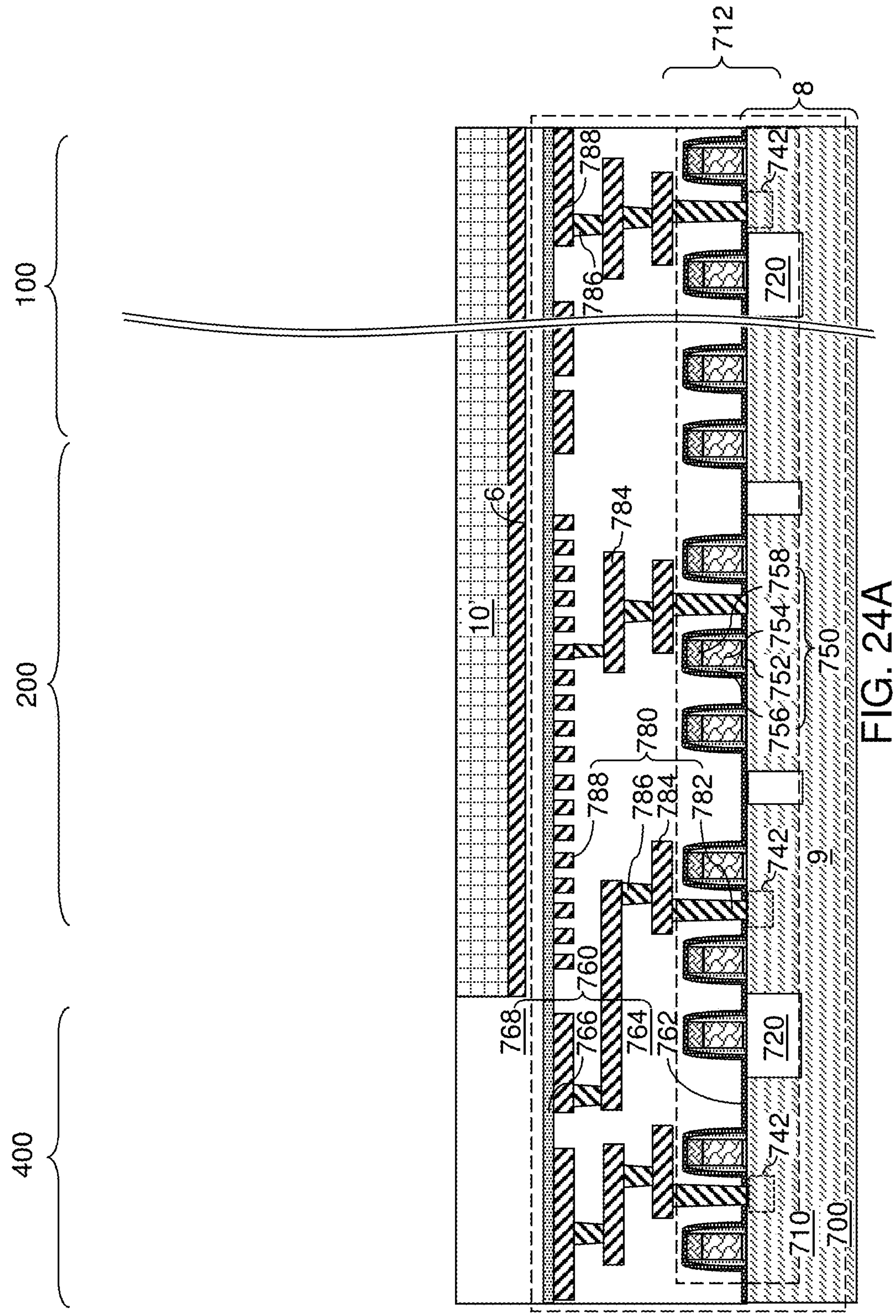
FIG. 24A is a vertical cross-sectional view of a second exemplary structure after the processing steps of FIGS. 1A-1D according to a second embodiment of the present disclosure.
Figure 24B:
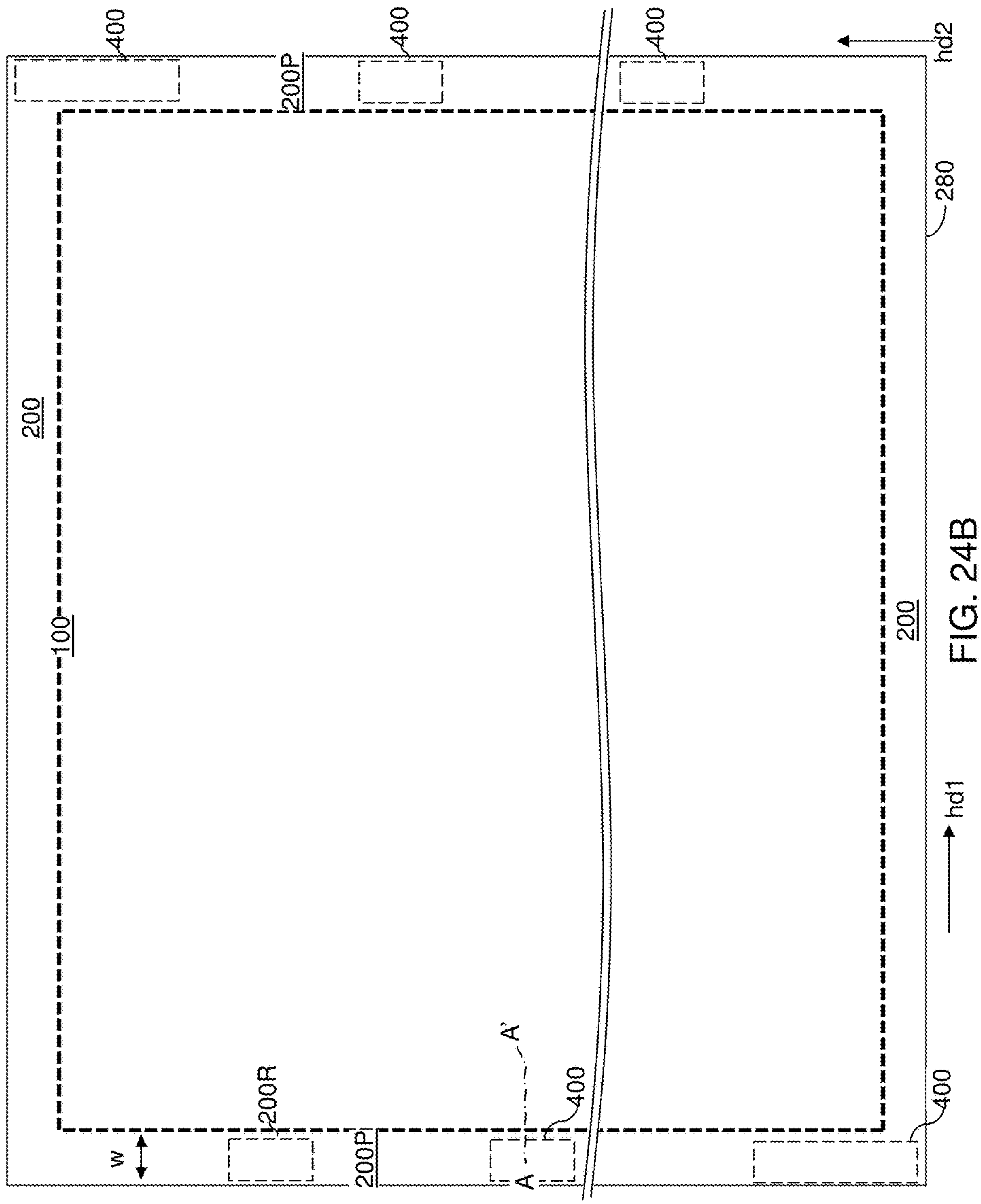
FIG. 24B is a top-down view of the second exemplary structure of FIG. 24A.

Referring to FIGS. 24A and 24B, a second exemplary structure according to a second embodiment of the present disclosure can be derived from the first exemplary structure of the first embodiment by modifying the shape of each staircase region 200. In other words, the layout of the first exemplary structure of FIGS. 1A-1D can be modified without modifying structures of individual components of the first exemplary structure of FIGS. 1A-1D. Thus, a peripheral circuitry 712 comprising semiconductor devices, such as field effect transistors 710 is formed on a substrate 8, and lower-level metal interconnect structures 780 embedded in lower-level dielectric material layers 760 are formed over the field effect transistors. The optional conductive plate layer 6 and the in-process source-level material layers 10' can be patterned with different shapes such that the outer edges of the conductive plate layer 6 and the in-process source-level material layers 10' coincide with the outer edges of each staircase region 200 that laterally encloses a respective memory array region 100.

Specifically, the area of the staircase region 200 can be modified to include a pair of indented lateral boundaries including a set of indented areas around respective peripheral connection regions 400 which include row decoder circuit connections (e.g., word line hook up regions). In one embodiment, staircase region 200 can include a pair of straight edges that laterally extend along a first horizontal direction hd1 and a pair of periodically-indented edges that generally extend along a second horizontal direction hd2 that is perpendicular to the first horizontal direction hd1. Each periodically-indented edge of the staircase region 200 includes a laterally alternating sequence of laterally-protruding staircase segments 200P separated by respective peripheral connection regions 400 along the second horizontal direction (e.g., bit line direction hd2). The laterally-protruding staircase segments 200P may be discrete or may be connected to each other by optional laterally-recessed segments 200R. The laterally-protruding staircase segments 200P may width w. Each of the laterally-protruding staircase segments and each of the laterally-recessed segments can extend along the second horizontal direction hd2. The staircase region 200 can be formed by iterations of an anisotropic etch step and a mask trimming step that trims a trimmable mask layer isotropically. The peripheral connection regions 400 can be formed between neighboring pairs of laterally-protruding staircase segments 200P.

Figure 25A:
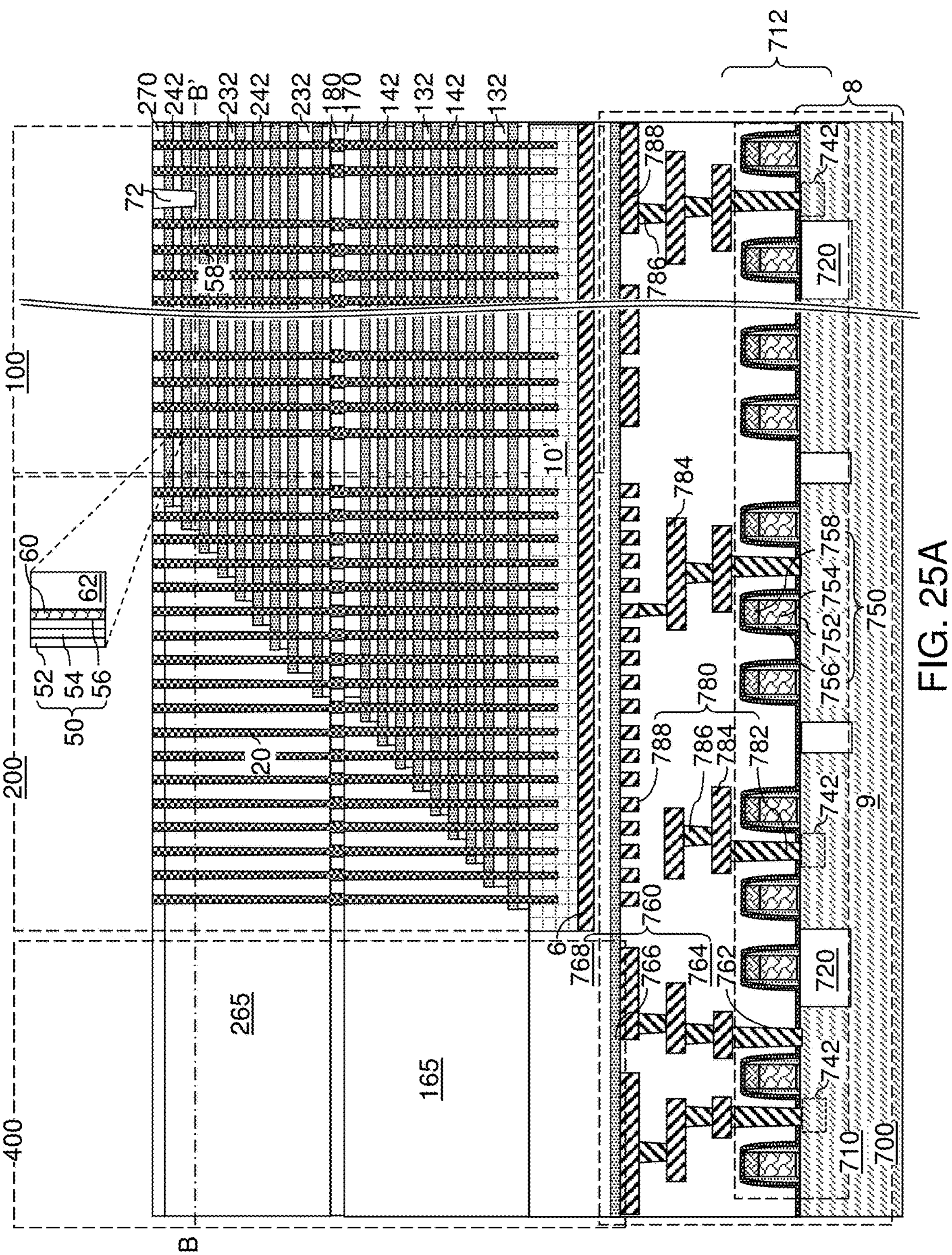
FIG. 25A is a vertical cross-sectional view of the second exemplary structure after the processing steps of FIGS. 10A-10D according to the second embodiment of the present disclosure.
Figure 25B:
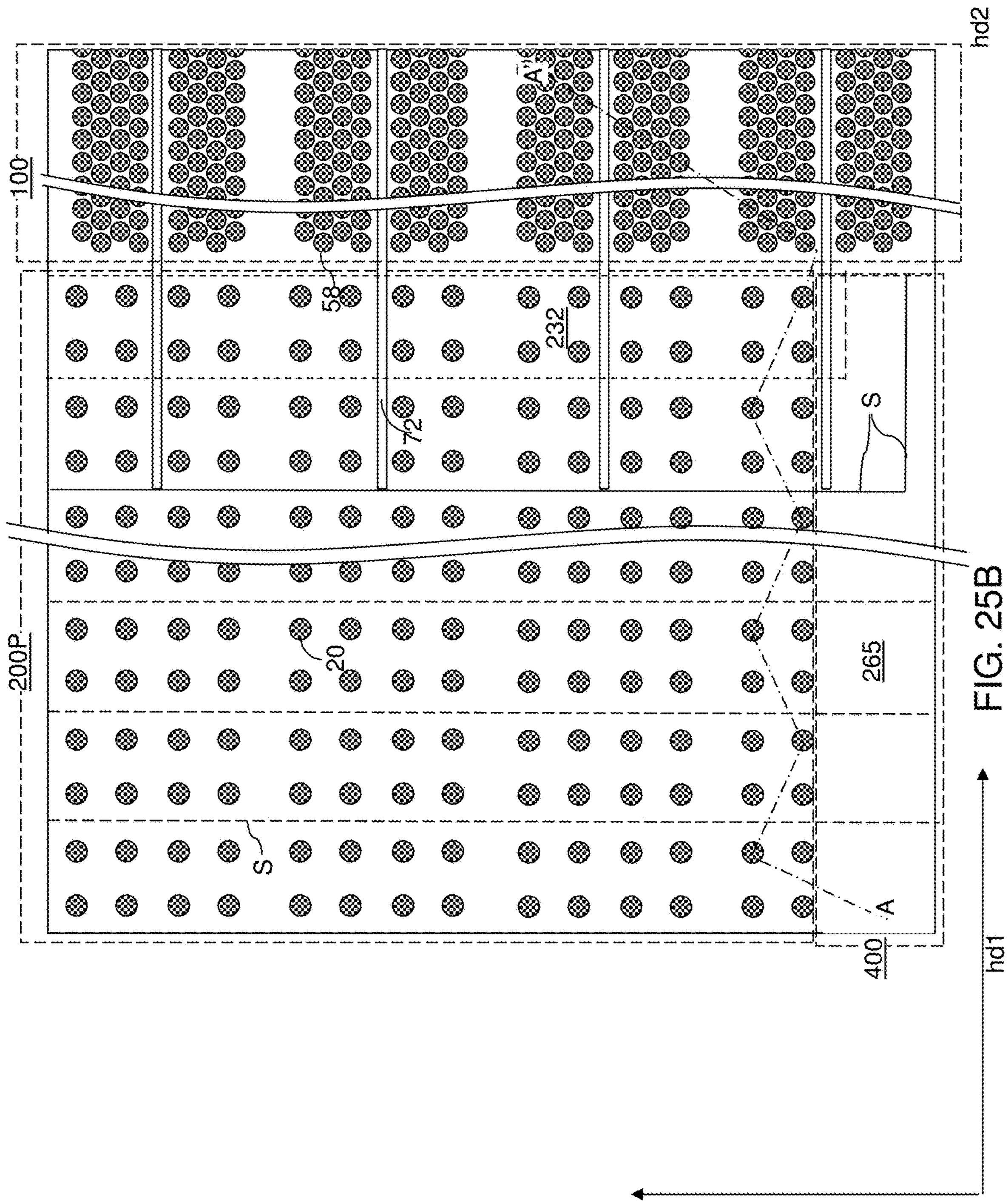
FIG. 25B is a top-down view of the second exemplary structure of FIG. 25A. The hinged vertical plane A-A' corresponds to the plane of the vertical cross-sectional view of FIG. 25A.
Figure 25C:
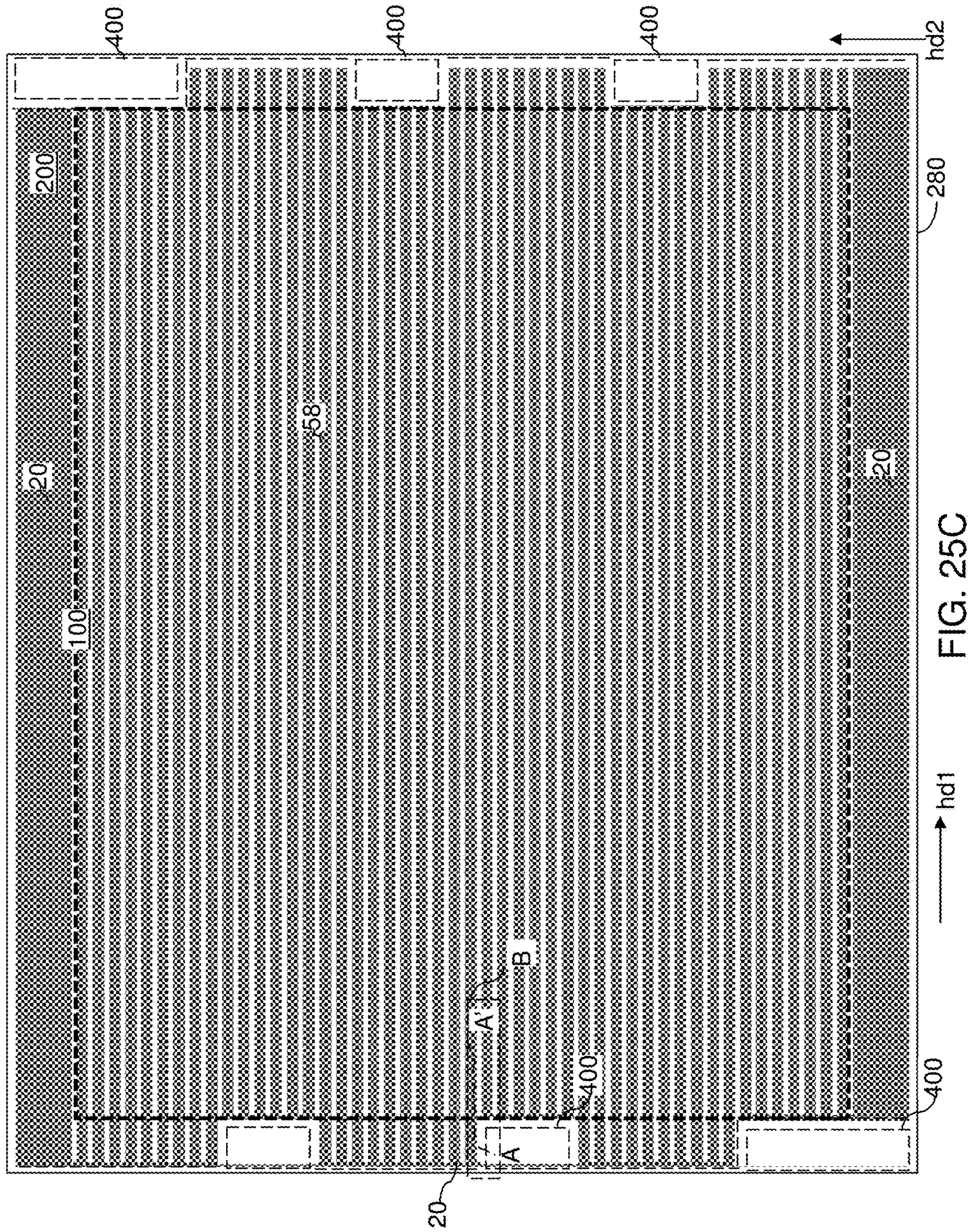
FIG. 25C is a top-down view of the second exemplary structure of FIGS. 25A and 25B over a larger area than the area shown in FIG. 25B. The area B corresponds to the area illustrated in FIG. 25B. The hinged vertical plane A-A' corresponds to the plane of the vertical cross-sectional view of FIG. 10A.

Referring to FIGS. 25A-25C, the processing steps of the first embodiment can be performed up to the processing steps of FIGS. 10A-10D. Memory stack structures 55 can be formed in the same manner as in the first embodiment. Each of the memory stack structures 55 comprises a vertical semiconductor channel 60 and a memory film 50. Drain regions 63 can be formed on a respective one of the vertical semiconductor channels 60 to form memory opening fill structures 58. In the staircase region 200 facing regions 500 and 600 described above, the steps S may step down only in one direction. In contrast, in the laterally-protruding staircase segments 200P of the staircase region 200, the steps S may step down in two different directions, i.e., the first horizontal direction (e.g., in the word line direction) hd1 and in the perpendicular second horizontal direction (e.g., in the bit line direction) hd2 into the indented regions (e.g., the peripheral connection regions) 400, as shown in FIG. 25B. This is shown more clearly in perspective view in FIG. 31B, which will be described in more detail below.

Figure 26A:
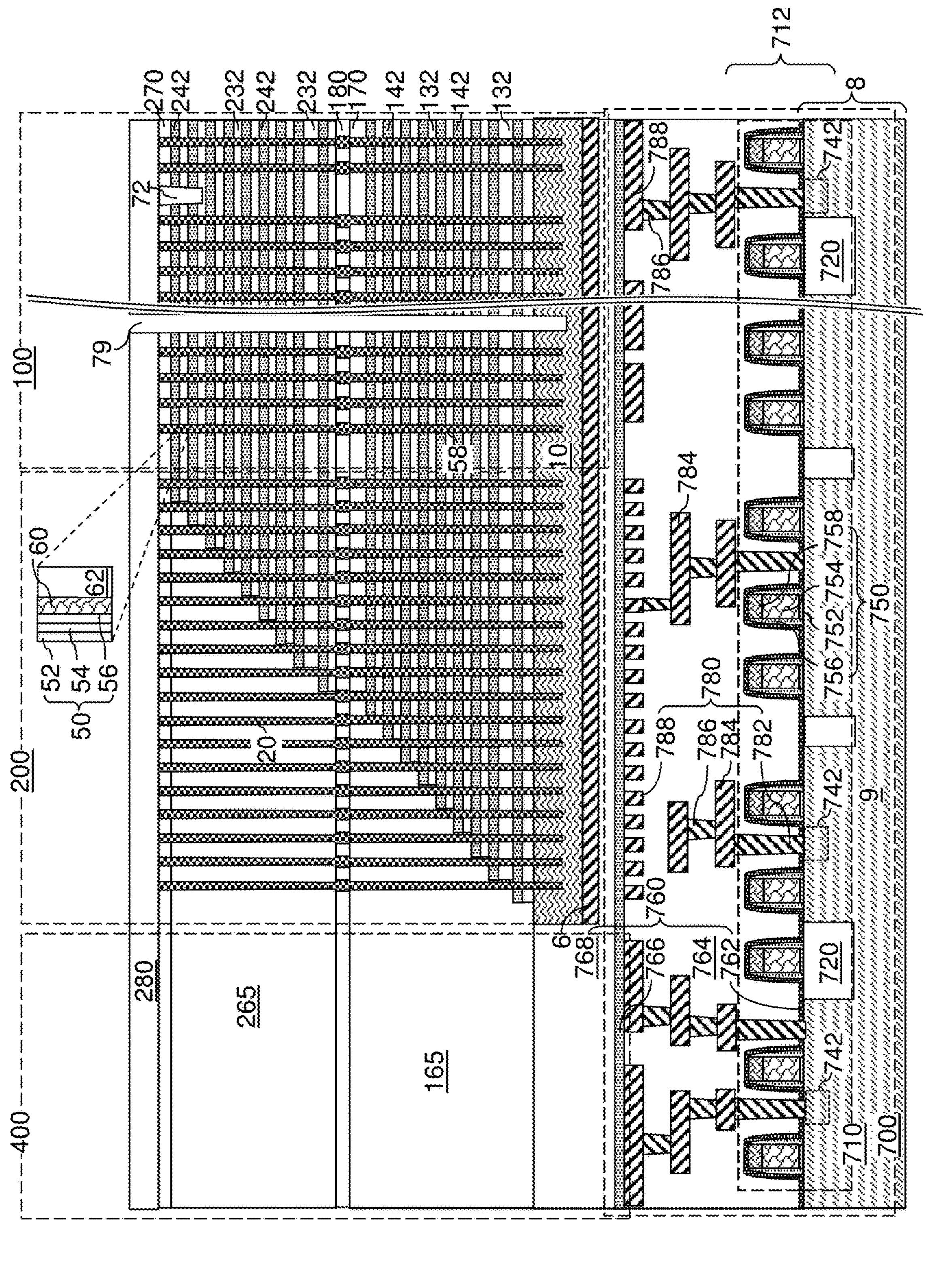
FIG. 26A is a vertical cross-sectional view of the second exemplary structure after formation of backside trenches according to the second embodiment of the present disclosure.
Figure 26B:
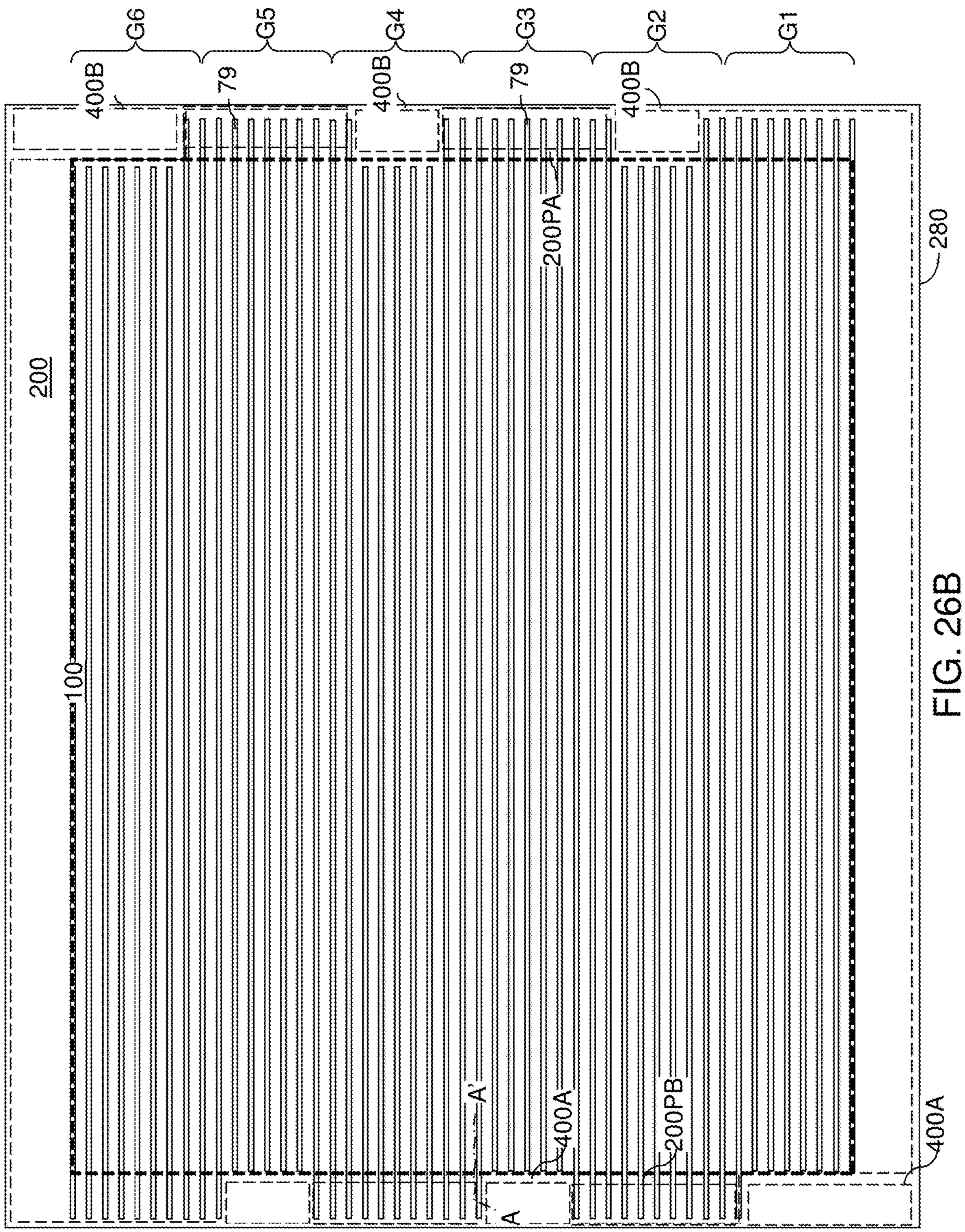
FIG. 26B is a top-down view of the second exemplary structure of FIG. 25A. The hinged vertical plane A-A' corresponds to the plane of the vertical cross-sectional view of FIG. 26A.

Referring to FIGS. 26A-26B, the processing steps of FIGS. 11A-11D can be performed to form backside trenches 79. The backside trenches 79 divide each alternating stack {(132, 142), (232, 242)} of insulating layers (132, 232) and sacrificial material layers (142, 242) into multiple alternating stacks. Groups (G1-G6) of alternating stacks {(132, 142), (232, 242)} of insulating layers (132, 232) and sacrificial material layers (142, 242) and clusters of memory stack structures 55 can be formed over the lower-level dielectric material layers 760 and the in-process source-level material layers 10'. While a configuration including six groups (G1-G6) of alternating stacks {(132, 142), (232, 242)} is illustrated to describe one embodiment of the present disclosure, other embodiments are expressly contemplated herein in which any number of groups of alternating stacks {(132, 142), (232, 242)} is employed. The total number of groups (G1-G6) of alternating stacks {(132, 142), (232, 242)} in a memory array region 100 can be in a range from 2 to 256, such as from 4 to 64. Each alternating stack containing memory stack structures 55 between two adjacent backside trenches 79 may comprise a memory block. Each memory array region 100 may comprise a portion of a memory page or an entire memory page.

Each of the backside trenches 79 can laterally extend along the first horizontal direction (e.g., word line direction) hd1. In one embodiment, each divided alternating stack {(132, 142), (232, 242)} of insulating layers (132, 232) and sacrificial material layers (142, 242) can have a rectangular strip shape that laterally extends along the first horizontal direction hd1. In one embodiment, each cluster of memory stack structures 55 can vertically extend through a respective alternating stack {(132, 142), (232, 242)} of the groups (G1-G6) of alternating stacks.

In one embodiment, each group (G1-G6) of alternating stacks {(132, 142), (232, 242)} comprises a respective set of at least four alternating stacks, {(132, 142), (232, 242)}, such as eight alternating stacks for example. Alternating stacks {(132, 142), (232, 242)} within a same group (G1-G6) of alternating stacks {(132, 142), (232, 242)} can be laterally spaced apart from each other by line trenches (such as the backside trenches 79) that vertically extend through each level of the alternating stacks {(132, 142), (232, 242)} and laterally extend along the first horizontal direction hd1 with a respective pair of straight sidewalls that extend from one end of a respective line trench to another end of the respective line trench. Each line trench (i.e., each backside trench 79) may extend from one outer edge of the staircase region 200 (e.g., the outer edge of segment 200P) to another outer edge of the memory array region 100 that is located on an opposite side.

In one embodiment, the groups (G1-G6) of alternating stacks {(132, 142), (232, 242)} comprise odd-numbered groups (G1, G3, G5) that alternate with even-numbered groups (G2, G4, G6) as numbered from one end to another end along the second horizontal direction hd2. The groups (G1-G6) of alternating stacks {(132, 142), (232, 242)} begin with a group that is labeled as a first group G1. The groups (G1-G6) of alternating stacks have lateral indentations along the first horizontal direction hd1 to provide lateral indentation regions (e.g., peripheral connection regions) 400. Adjacent laterally-protruding staircase segments 200P of the staircase region of each group of alternating stacks include steps S in the sacrificial material layers (142, 242) which step down in two directions, including into the second horizontal direction hd2 extending into the peripheral connection region 400. A remaining space in the peripheral connection regions 400 is filled with dielectric material portions (165, 265). Each alternating stack {(132, 142), (232, 242)} within the groups (G1-G6) of alternating stacks {(132, 142), (232, 242)} is formed with stepped surfaces, S.

Odd-numbered groups (G1, G3, G5) of alternating stacks each comprise first laterally-protruding staircase segment 200PA on a first end (e.g., on the right side of FIG. 26B) and a first indented region (e.g., peripheral connection region) 400A on a second end (e.g., on the left side of FIG. 26B) opposite to the first end along the first horizontal direction hd1. Even-numbered groups (G2, G4, G6) of alternating stacks each comprise a second laterally-protruding staircase segment 200PB on a second end (e.g., on the left side of FIG. 26B) located between two first indented regions 400A, and a second indented region 400B located between two first laterally-protruding staircase segments 200PA on a first end (e.g., on the right side of FIG. 26B) opposite to the second end along the first horizontal direction hd1.

Dielectric material portions (such as retro-stepped dielectric material portions (165, 265)) overlie the stepped surfaces, S. The dielectric material portions have lateral extents that increase stepwise as a function of a vertical distance from the substrate 8 along the first horizontal direction hd1 and along the second horizontal direction hd2 over each stepped surface (i.e., step up in both first and second horizontal directions). In one embodiment, each of the retro-stepped dielectric material portions (165, 265) comprises a first set of stepped surfaces including vertical surfaces that are laterally spaced apart along the first horizontal direction hd1, and a second set of stepped surfaces including vertical surfaces that are laterally spaced apart along the second horizontal direction hd2. In one embodiment, the first set of stepped surfaces and the second set of stepped surfaces contact sidewalls of alternating stacks that are present within a same group (G1-G6) of alternating stacks {(132, 142), (232, 242)}. A peripheral connection region 400 can be present between two neighboring laterally-protruding segments 200P of the staircase region 200. It should be noted that FIG. 26 is a schematic illustration and the number of "left-side" and "right-side" stacks/blocks is preferably the same. For example, if one block is connected through the left side, then the right side can be opened and used as a peripheral connection regions 400 and vice-versa.

Figure 27:
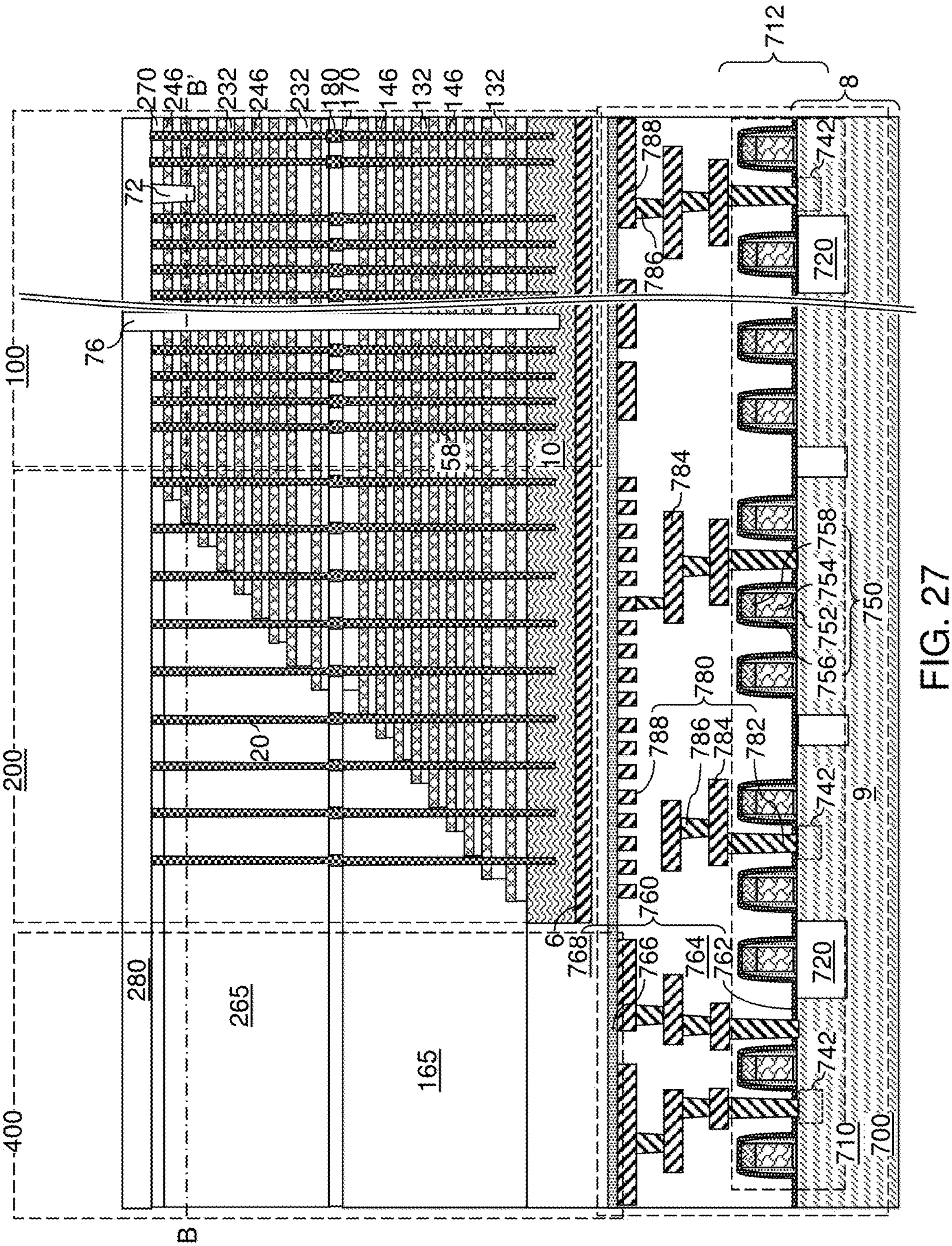
FIG. 27 is a vertical cross-sectional view of the second exemplary structure after the processing steps of FIGS. 17A-17E according to the second embodiment of the present disclosure.
Figure 28A:
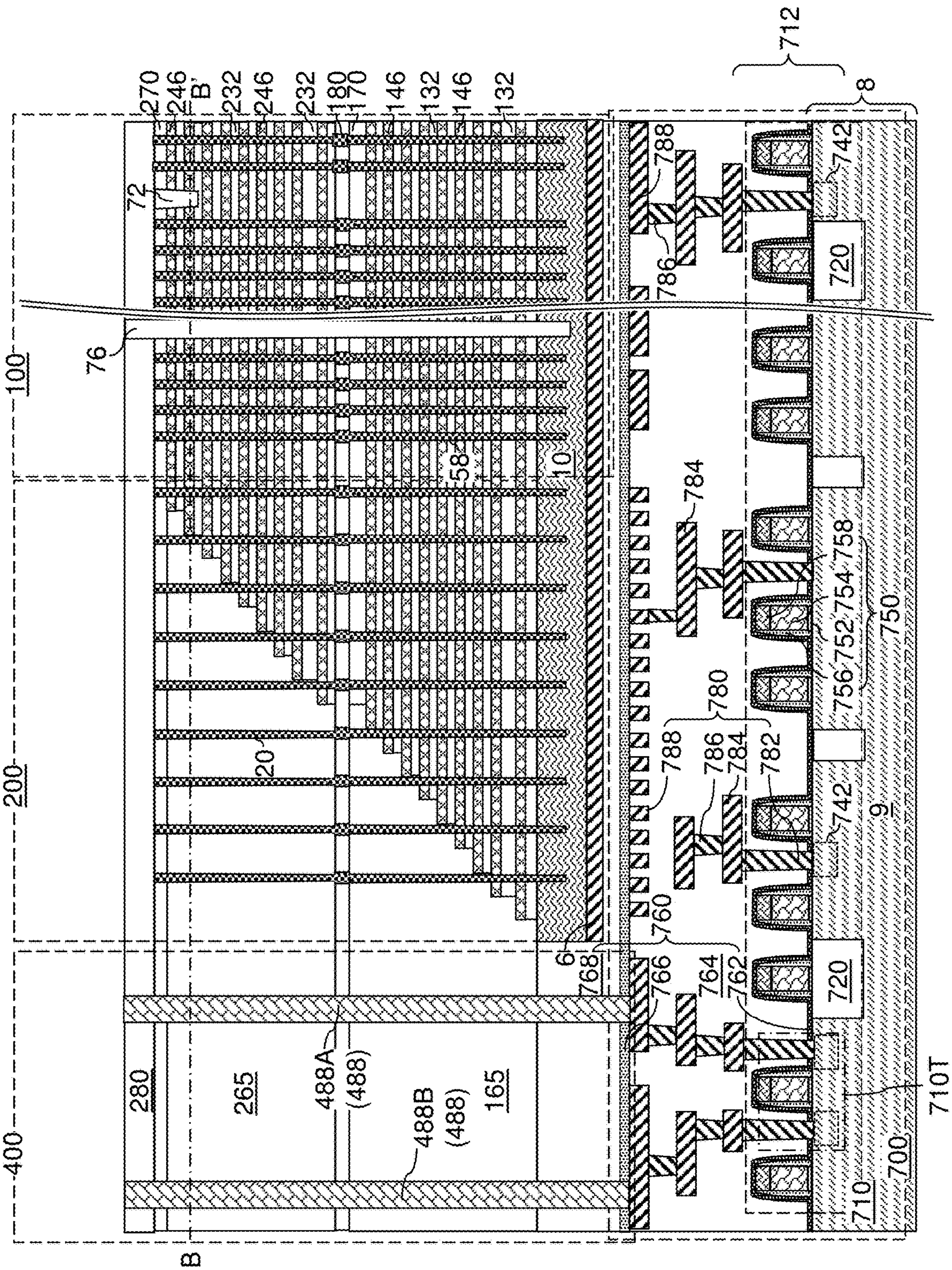
FIG. 28A is a vertical cross-sectional view of the second exemplary structure after formation of through-memory-level via structures according to the second embodiment of the present disclosure.
Figure 28B:
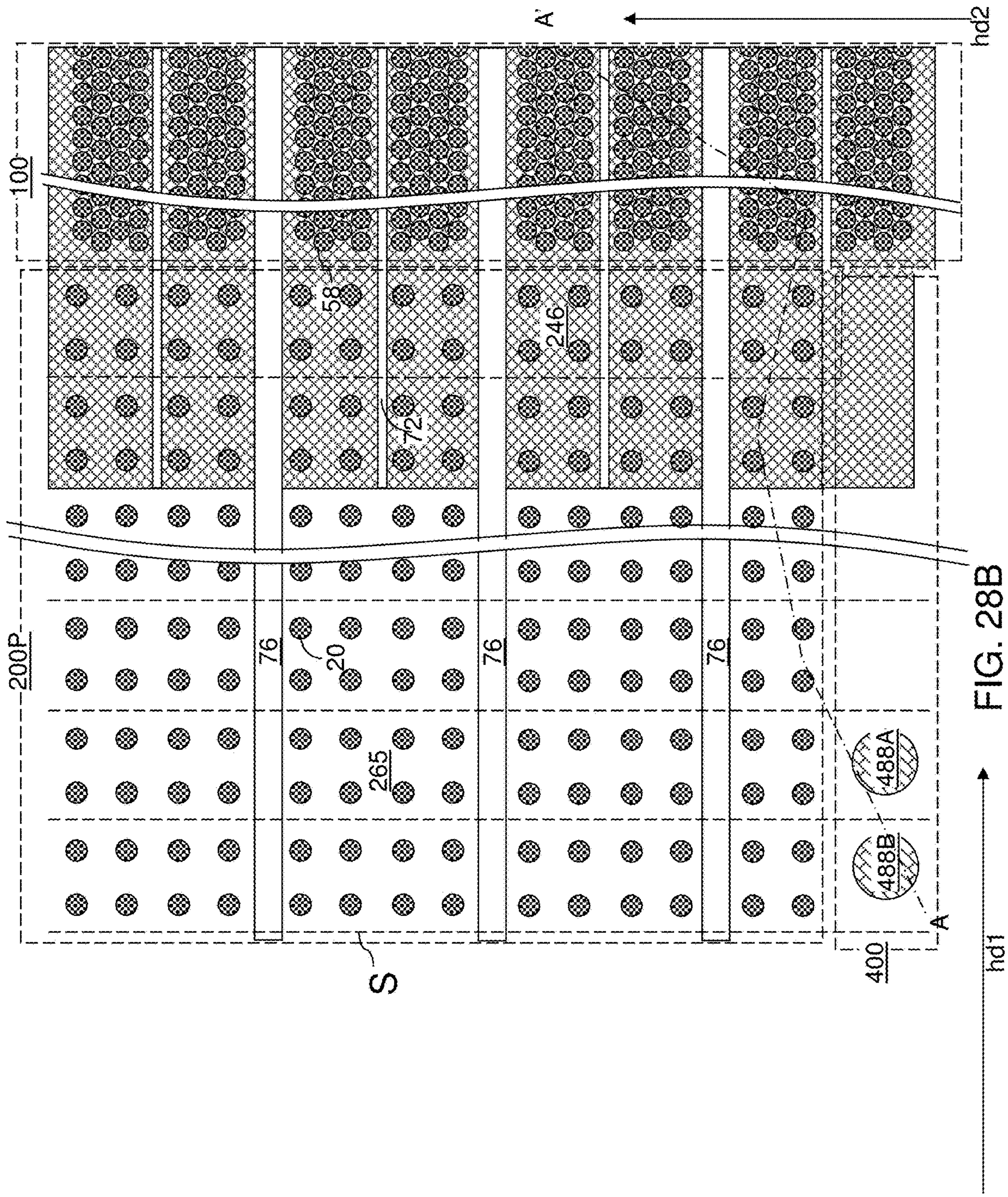
FIG. 28B is a top-down view of the second exemplary structure of FIG. 28A. The hinged vertical plane A-A' corresponds to the plane of the vertical cross-sectional view of FIG. 28A.
Figure 28C:
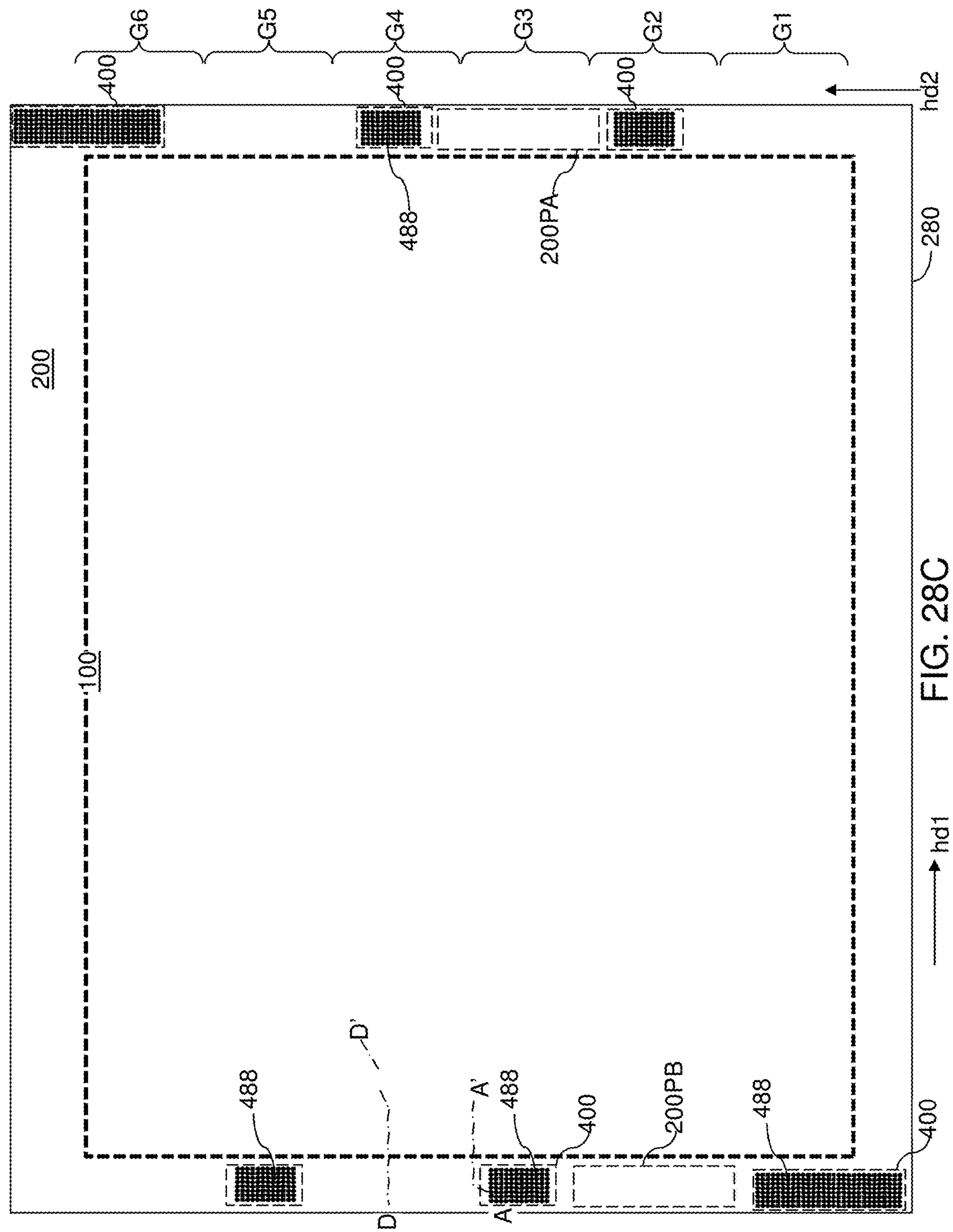
FIG. 28C is a top-down view of the second exemplary structure of FIGS. 25A and 25B over a larger area than the area shown in FIG. 28B. The area B corresponds to the area illustrated in FIG. 25B. The hinged vertical plane A-A' corresponds to the plane of the vertical cross-sectional view of FIG. 10A.
Figure 28D:
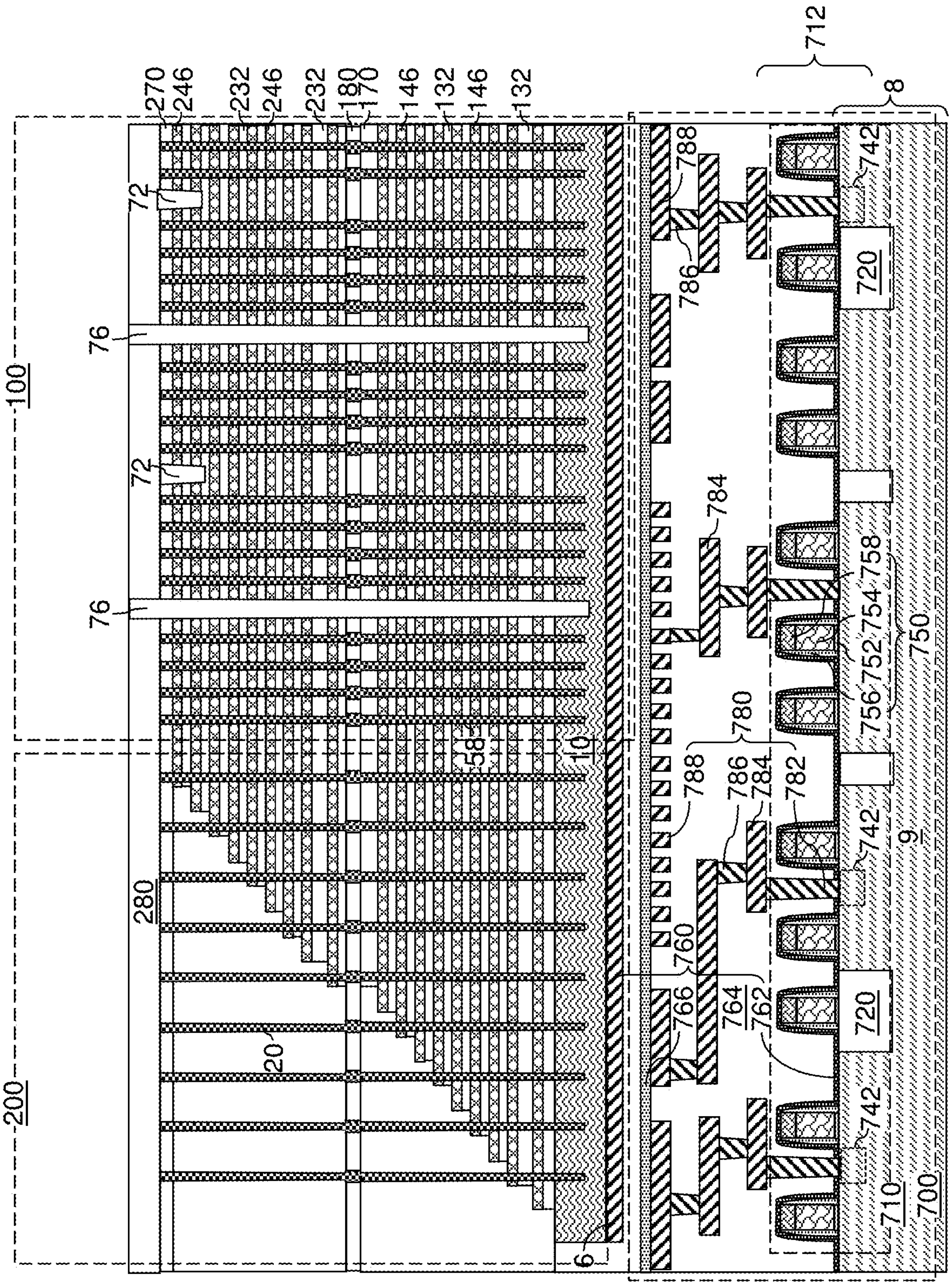
FIG. 28D is a vertical cross-sectional view of the second exemplary structure along the hinged vertical plane D-D' of FIG. 28C.

Referring to FIG. 27, subsequent processing steps of the first embodiment up to the processing steps of FIGS. 17A-17E can be performed. The in-process source-level material layers 10' are replaced with the source-level material layers 10 as in the first embodiment. A semiconductor material layer (such as a buried source layer (112, 114, 116) within the source-level material layers 10) can be located between the lower-level dielectric material layers 760 and the groups (G1-G6) of alternating stacks {(132, 146), (232, 246)} of insulating layers (132, 232) and electrically conductive layers (146, 246). The semiconductor material layer can continuously extend underneath each of the alternating stacks {(132, 146), (232, 246)}. Each bottom end of vertical semiconductor channels 60 is electrically connected to the semiconductor material layer. Each cluster of memory stack structures 55 vertically extends through a respective alternating stack {(132, 146), (232, 246)} among the groups (G1-G6) of alternating stacks {(132, 146), (232, 246)}.

Referring to FIGS. 28A-28D, through-memory-level via cavities can be formed through the first contact level dielectric layer 280, the second and first retro-stepped dielectric material portions (265, 165), and the second dielectric material layers 768 to top surfaces of a first subset of the lower-level metal interconnect structure 780 in the peripheral connection regions 400, and optionally the inter-array connection via regions, and the bit line hookup regions as in the first embodiment. The through-memory-level via cavities extend to top surfaces of a respective one of the lower-level metal interconnect structure 780. At least one conductive material can be deposited in the through-memory-region via cavities. Excess portions of the at least one conductive material can be removed from above the horizontal plane including the top surface of the first contact level dielectric layer 280. Each remaining portion of the at least one conductive material in a through-memory-level via cavity constitutes a through-memory-level via structure. The through-memory-level via structures include peripheral connection via structures 488 formed in the peripheral connection regions 400, and optionally the inter-array connection via structures formed in the inter-array connection via regions, and bit line connection via structures formed in the bit line hookup regions, as in the first embodiment.

The peripheral connection via structures 488 provide electrical connections that vertically extends through all layers at the memory level, i.e., the set of all layers between the horizontal plane including the optional conductive plate layer 6 (or the source-level material layers 10 in case the optional conductive plate layer 6 is not present) and the second insulating cap layer 270. The peripheral connection via structures 488 vertically extend from below the second dielectric material layers 768 that underlie the source-level material layers 10 to a top surface of the first contact level dielectric layer 280 that overlie the memory stack structures 55.

The peripheral connection via structures 488 can include through-memory-level word-line-connection via structures 488A and through-memory-level transistor connection via structures 488B. Each of the through-memory-level word-line-connection via structures 488A and through-memory-level transistor connection via structures 488B can contact a respective one of the lower-level metal interconnect structures 780. In one embodiment, a pair of a through-memory-level transistor-connection via structure 488B and a through-memory-level word-line-connection via structure 488A can be connected to a same word line control transistor 710T shown in FIG. 28A, and can pass through a same subset of dielectric material portions (such as a vertical stack of a first retro-stepped dielectric material portion 165 and a second retro-stepped dielectric material portion 265).

Figure 29A:
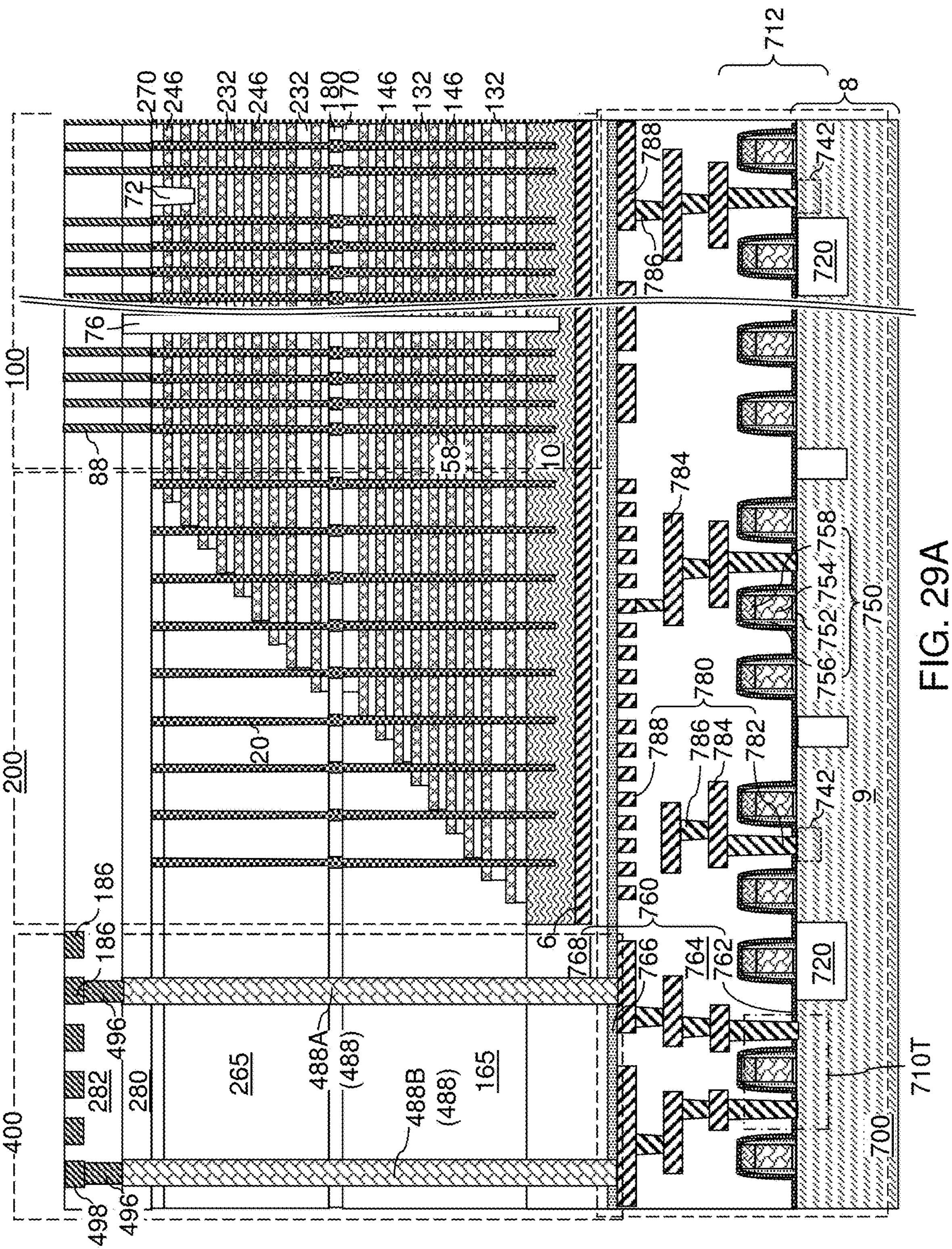
FIG. 29A is a vertical cross-sectional view of the second exemplary structure after formation of contact via structures and first line-level structures according to the second embodiment of the present disclosure.
Figure 29B:
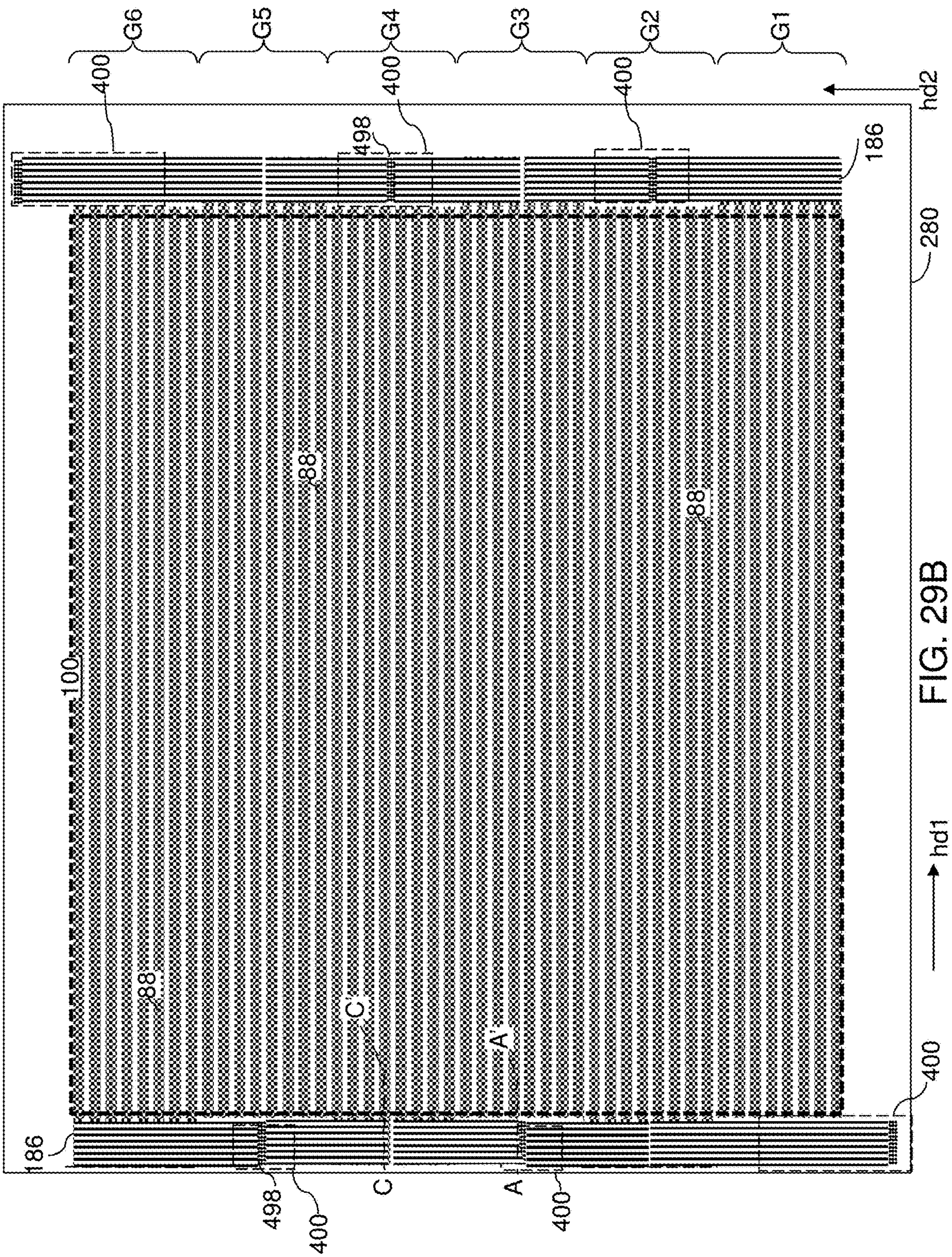
FIG. 29B is a top-down view of the second exemplary structure of FIG. 29A. The hinged vertical plane A-A' corresponds to the plane of the vertical cross-sectional view of FIG. 29A.
Figure 29C:
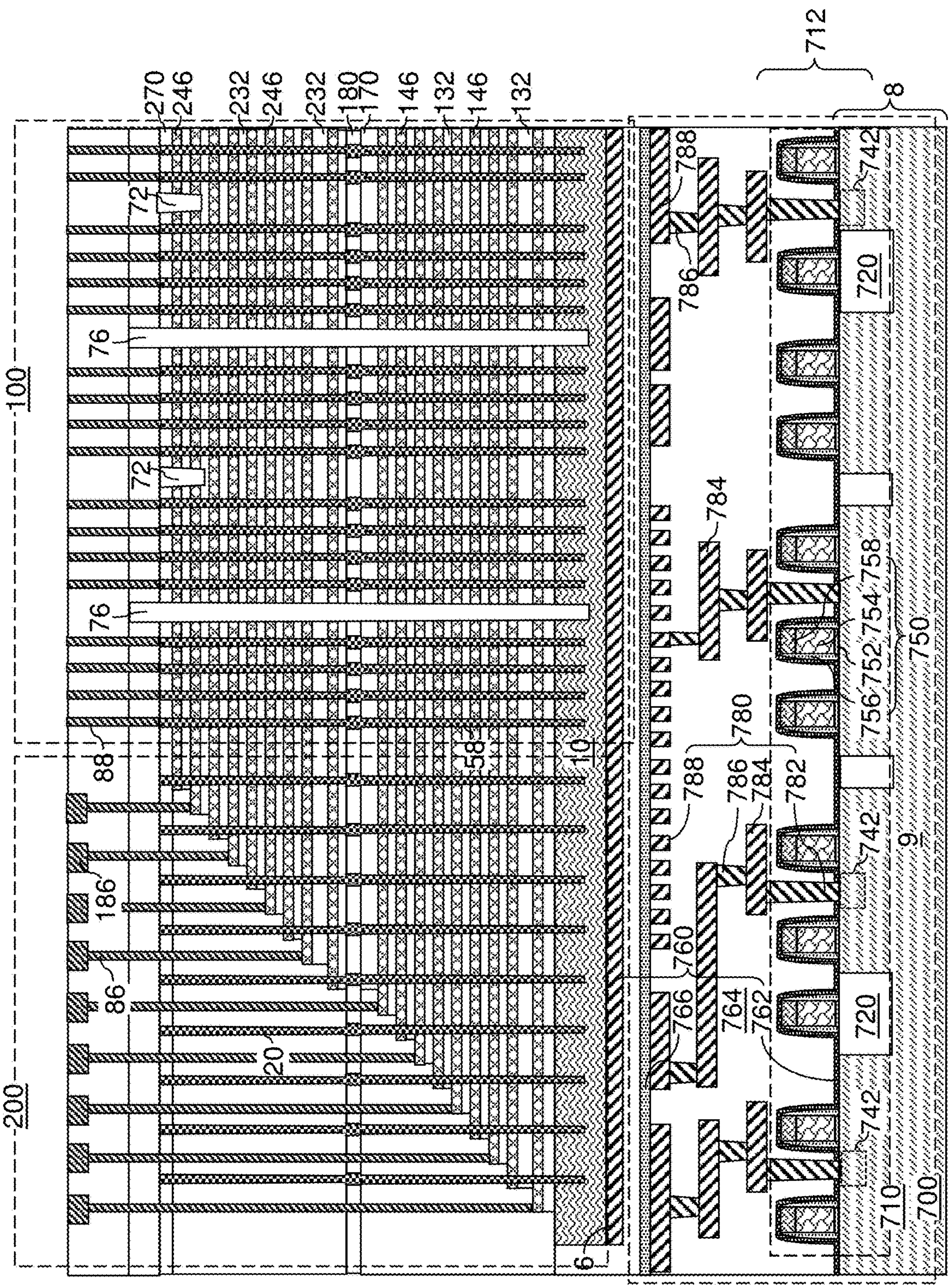
FIG. 29C is a vertical cross-sectional view of the second exemplary structure along the hinged vertical plane C-C' of FIG. 29B.

Referring to FIGS. 29A-29C, the processing steps of FIGS. 19A-19C, 20A-20D, and 21A-21D can be performed to form a second contact level dielectric layer 282 over the first contact level dielectric layer 280, various conductive via structures (88, 86, 496), and various first line-level structures (186, 498). The various conductive via structures (88, 86, 496) can include drain contact via structures 88, word line contact via structures 86, peripheral region contact via structures 496, and additional conducive via structures described in the first embodiment. The first line-level structures (186, 498) include word-line-interconnect metal line 186, first peripheral region metal pads 498, and additional first line-level structures described in the first embodiment.

Each drain contact via structure 88 can be formed on a top surface of a respective one of the drain regions 63. The word line contact via structures 86 can be formed on a respective one of the electrically conducive layers (146, 246). Each of the first word-line-interconnect metal lines 186 can be formed on a respective one of the word line contact via structures 86 and a respective one of a first set of peripheral region contact via structure 496. Each of the peripheral region contact via structures 496 can be formed on a respective one of the peripheral connection via structures 488. Each of the first peripheral region metal pads 498 can be formed on a respective one of the second set of the peripheral region contact via structures 496. In one embodiment, a word-line-interconnect metal line 186 and a first peripheral region metal pad 498 may be formed as an integral structure employing a dual damascene process. Likewise, a first peripheral region metal pad 498 and a peripheral region contact via structure 496 can be formed as an integral structure.

Figure 31A:
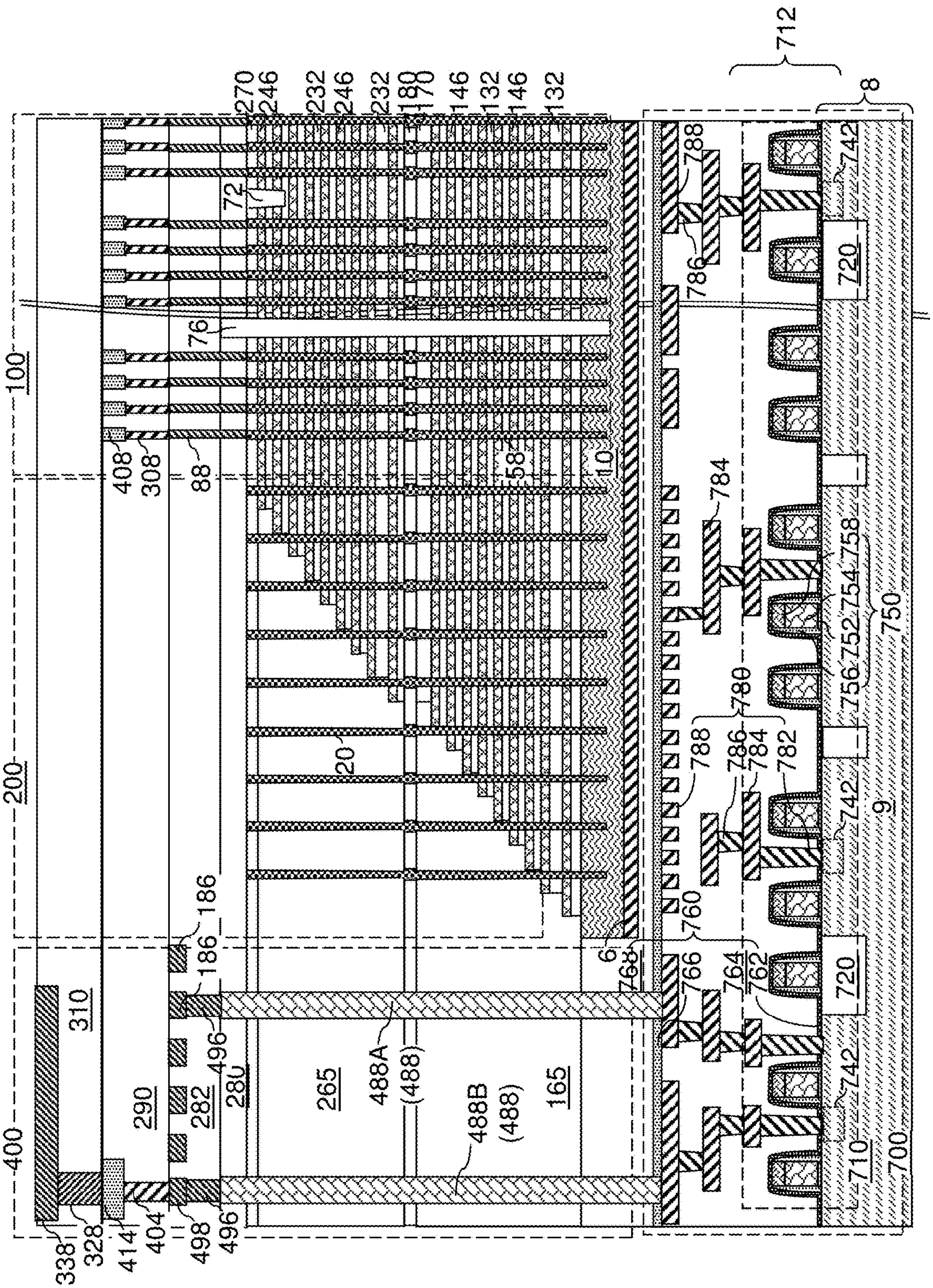
FIG. 31A is a vertical cross-sectional view of the second exemplary structure after formation of additional dielectric layers, additional metal interconnect structures, and bonding pads according to the second embodiment of the present disclosure.
Figure 31B:
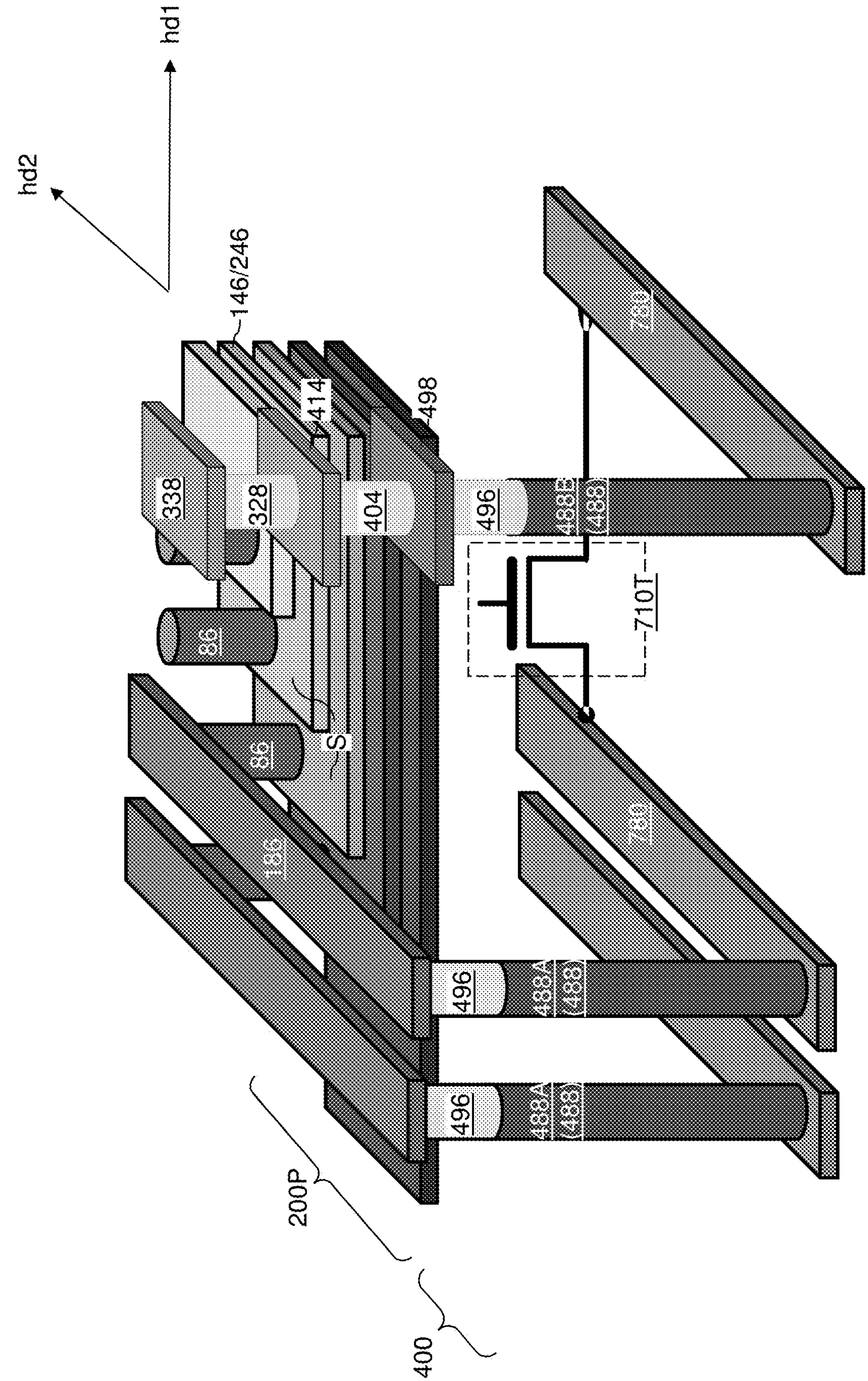
FIG. 31B is a perspective view of a region of the second exemplary structure of FIG. 31A.

In one embodiment, the word-line-interconnect metal lines 186 can be electrically connected to a respective one of the word line contact via structures 86 and a respective one of the through-memory-level word-line-connection via structures 488A through as respective peripheral region contact via structures 496, and can laterally extend along a respective lengthwise direction that is parallel to the second horizontal direction hd2, as shown in FIG. 29B (and in FIG. 31B described below). In one embodiment, the word-line-interconnect metal lines 186 can laterally extend from above the respective one of the word lines (comprising the electrically conductive layers (146, 246)) to which the respective word-line-interconnect metal line 186 is electrically connected into a region overlying a respective one of the dielectric material portions (such as the first and second retro-stepped dielectric material portions (165, 265) located within a peripheral connection region 400) along the second horizontal direction hd2. Each of the through-memory-level word-line-connection via structures 488A can be electrically connected to respective one of the word-line-interconnect metal lines 186, extend through a respective one of the dielectric material portions, and contact a respective one of the lower-level metal interconnect structures 780.

Each of the word line contact via structures 86 and the through-memory-level word-line-connection via structures 488A can be formed through a same subset of the retro-stepped dielectric material portions (such as a vertical stack of the first retro-stepped dielectric material portion 165 and the second retro-stepped dielectric material portion 265). The through-memory-level transistor-connection via structures 488A can be electrically connected to a respective transistor 710T of the word line control transistors 710 in the support device region 700.

The through-memory-level transistor-connection via structures 488B can be electrically connected to the word line control transistors 710 (e.g., 710T). The through-memory-level transistor-connection via structures 488B can extend through a respective subset of the dielectric material portions (such as a vertical stack of the first retro-stepped dielectric material portion 165 and the second retro-stepped dielectric material portion 265). In one embodiment, a pair of a through-memory-level transistor-connection via structure 488B and a through-memory-level word-line-connection via structure 488A connected to a same word line control transistor 710T can pass through a same set of dielectric material portions (such as a vertical stack of the first retro-stepped dielectric material portion 165 and the second retro-stepped dielectric material portion 265).

Figure 30A:
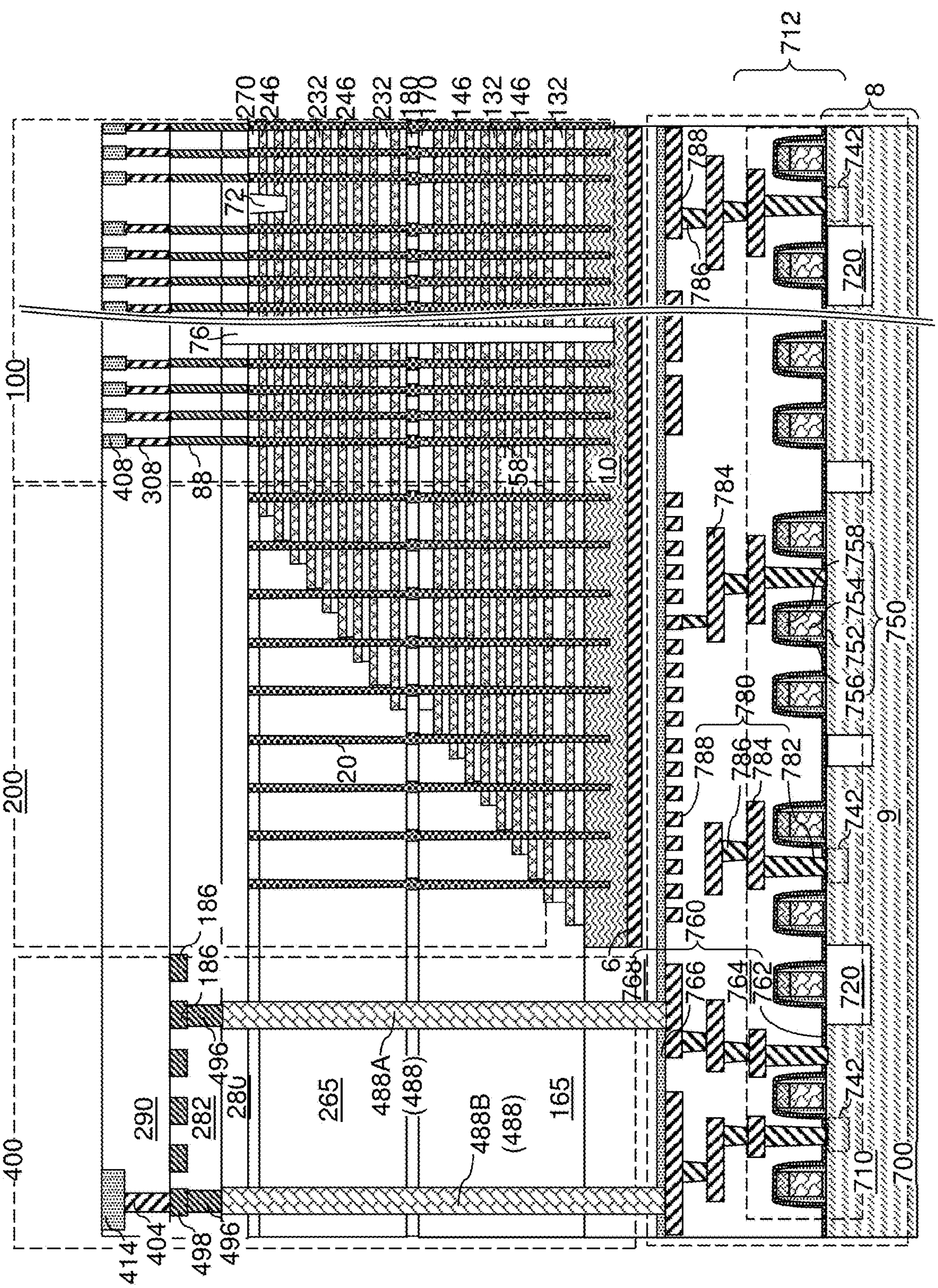
FIG. 30A is a vertical cross-sectional view of the second exemplary structure after formation of a first interconnect-level dielectric layer, first via-level structures, and second line-level structures according to the second embodiment of the present disclosure.
Figure 30B:
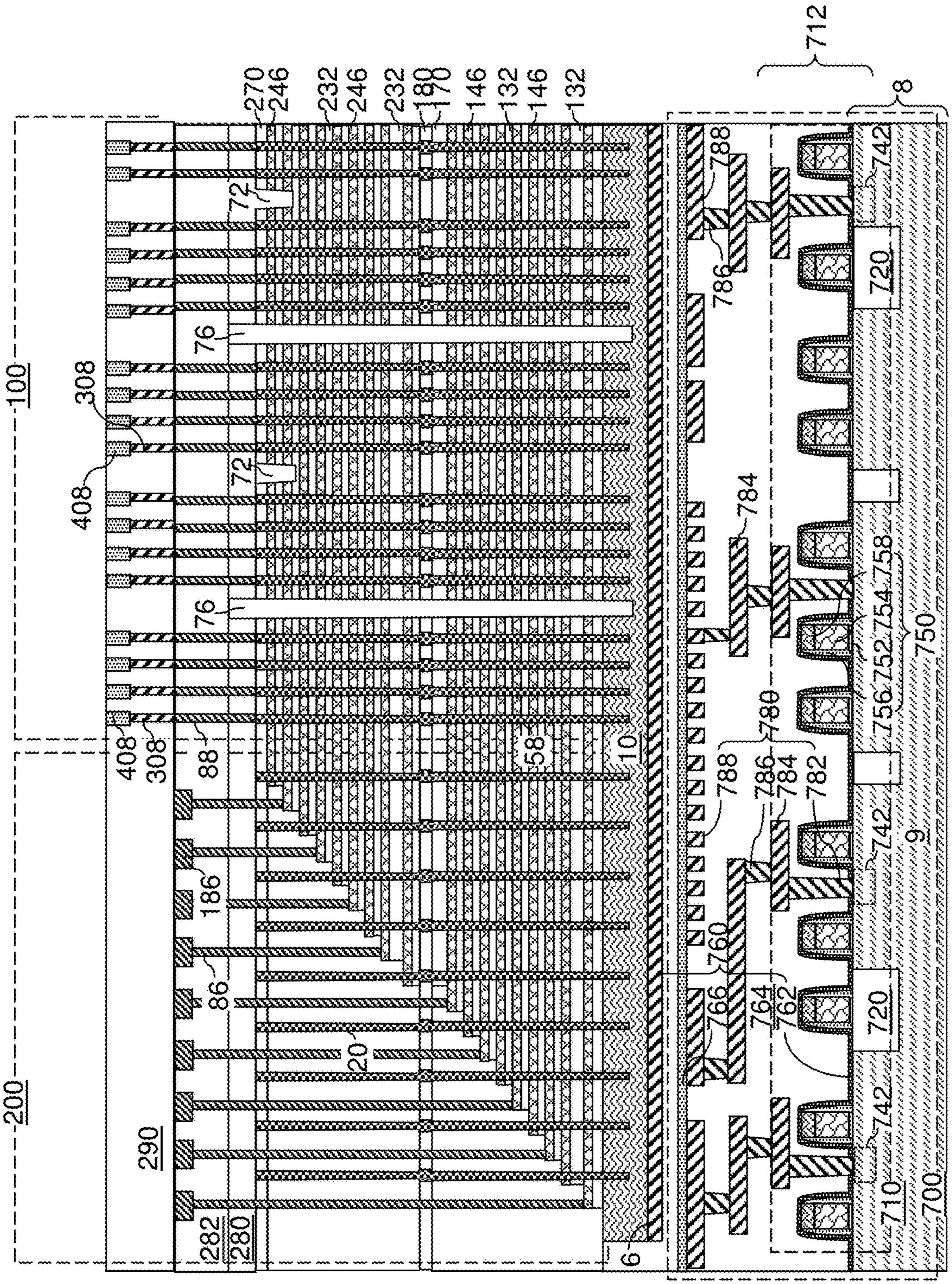
FIG. 30B is another vertical cross-sectional view of the second exemplary structure of FIG. 30A along the hinged vertical plane C-C' of FIG. 29B.

Referring to FIGS. 30A-30B, the processing steps of FIGS. 22A-22E can be performed as in the first embodiment to form a first interconnect-level dielectric layer 290 and to form via structures and second line-level structures. The via structures in the first interconnect-level dielectric layer 290 can include drain-connection via structures 308, first peripheral via structures 404, and optional additional via structures described in the first embodiment. The drain-connection via structures 308 contact a top surface of a respective one of the drain contact via structures 88. The first peripheral via structures 404 contact a top surface of a respective one of the first peripheral region metal pads 498.

The metal lines in the first interconnect-level dielectric layer 290 can be provided as standalone metal lines or as an upper portion of an integrated line and via structure. The metal lines in the first interconnect-level dielectric layer 290 can be formed in an upper portion of the first interconnect-level dielectric layer 290 after formation of the via structures, or can be formed concurrently with formation of the via structures as a component in integrated line and via structures. The metal lines in the first interconnect-level dielectric layer 290 can be concurrently by deposition of a same set of at least one conductive material.

The second line-level structures formed in the first interconnect-level dielectric layer 290 can include bit lines 408, second peripheral region metal pads 414, and optionally additional second line-level structures described in the first embodiment. The bit lines 408 are electrically connected to a respective set of drain contact via structures 88, and laterally extend straight along the second horizontal direction hd2. Optionally, a portion of the bit lines 408 may have the configuration of the first embodiment shown in FIGS. 22A to 23B.

In one embodiment, the word-line-interconnect metal lines 186 can laterally extend along the second horizontal direction (e.g., bit line direction) hd2, and thus, can be parallel to the bit lines 408. The bit lines 408 are formed at a level above the level of the word-line-interconnect metal lines 186. Thus, the word-line-interconnect metal lines 186 can be vertically spaced from the substrate 8 by a lesser vertical separation distance than the bit lines 408 are from the substrate 8.

Referring to FIGS. 31A and 31B, additional dielectric layers 310, additional metal interconnect structures 328, and bonding pads 338 can be formed over the first interconnect-level dielectric layer 290. The additional dielectric layers 310 can include at least one additional interconnect-level dielectric layer such as a second interconnect-level dielectric layer, a third interconnect-level dielectric layer, etc. The additional metal interconnect structures 328 can include various interconnect via structures and/or interconnect metal lines. The bonding pads 338 can be formed on a topmost subset of the metal interconnect structures 328.

Referring to FIGS. 24A-31B and according to the second embodiment of the present disclosure, a three-dimensional memory device comprises peripheral circuitry 712 comprising field effect transistors 710 located over a substrate 8, lower-level metal interconnect structures 780 embedded in lower-level dielectric material layers 760 overlying the field effect transistors 710 and connected to nodes of the field effect transistors 710, and groups (G1-G6) of alternating stacks of insulating layers (132, 232) and electrically conductive layers (146, 246) located over the lower-level dielectric material layers 760, each alternating stack {(132, 246), 232, 2461}} laterally extending along a first horizontal direction hd1.

The groups (G1-G6) of alternating stacks {(132, 246), 232, 246}} comprise odd-numbered groups (G1, G3, G5) that alternate with even-numbered groups (G2, G4, G6) along a second horizontal direction hd2 that is perpendicular to the first horizontal direction hd1.

Odd-numbered groups (G1, G3, G5) of alternating stacks each comprise a first laterally-protruding staircase segment 200PA on a first end (e.g., on the right side of FIG. 26B), and a first indented region (e.g., peripheral connection region) 400A on a second end (e.g., on the left side of FIG. 26B) opposite to the first end along the first horizontal direction hd1.

Even-numbered groups (G2, G4, G6) of alternating stacks each comprise a second laterally-protruding staircase segment 200PB on a second end (e.g., on the left side of FIG. 26B) located between two of the first indented regions 400A, and a second indented region 400B located between two of the first laterally-protruding staircase segments 200PA on a first end (e.g., on the right side of FIG. 26B) opposite to the second end along the first horizontal direction hd1.

The device further comprises dielectric material portions (165, 265) located in the first and second indented regions (400A, 400B), clusters of memory stack structures 55 vertically extending through the groups of alternating stacks, word line contact via structures 86 contacting the electrically conductive layers (e.g., word lines) (146, 246), word-line-interconnect metal lines 186 electrically connected to (e.g., directly contacting or indirectly contacting through one or more intermediate conductors) a respective one of the word line contact via structures 86 and extending from above the respective one of the word lines (146, 246) over a respective one of the dielectric material portions (165, 265) along the second horizontal direction hd2, and through-memory-level word-line-connection via structures 488A electrically connected to a respective one of the word-line-interconnect metal lines and extending through a respective one of the dielectric material portions (165, 265) and electrically connected to (e.g., directly or indirectly contacting) a respective one of the lower-level metal interconnect structures 780.

In one embodiment, steps S in the first and second laterally-protruding staircase segments (200PA, 200PB) step down in both the first horizontal direction hd1 and in the second horizontal direction hd2. For example, the steps S in the first laterally-protruding staircase segments 200PA step down in the second horizontal direction hd2 into the second indented regions 400B, while the steps S in the second laterally-protruding staircase segments 200PB step down in the second horizontal direction hd1 into the first indented regions 400A.

In one embodiment, the dielectric material portions (165, 265) comprise retro-stepped dielectric material portions having lateral extents that increase stepwise as a function of a vertical distance from the substrate 8 along the first horizontal direction and along the second horizontal direction. In one embodiment, each of the retro-stepped dielectric material portions comprises a first set of stepped surfaces including vertical surfaces that are laterally spaced apart along the first horizontal direction, and a second set of stepped surfaces including vertical surfaces that are laterally spaced apart along the second horizontal direction. The first set of stepped surfaces and the second set of stepped surfaces contact steps S of the first and second laterally-protruding staircase segments (200PA, 200PB).

In one embodiment, alternating stacks that are present within a same group of alternating stacks are laterally spaced apart from each other by line trenches 79 that vertically extend through each level of the alternating stacks and laterally extend along the first horizontal direction hd1.

In one embodiment, through-memory-level word-line-connection via structures 488A are electrically connected to a respective word line control transistor 710T of the field effect transistors 710. Through-memory-level transistor-connection via structures 488B are electrically connected to the word line control transistors 710 and extend through a respective subset of the dielectric material portions (165, 265). A pair of a through-memory-level transistor-connection via structure 488A and a through-memory-level word-line-connection via structure 488B electrically connected to a same word line control transistor 710T pass through a same subset of dielectric material portions (165, 265).

The lateral indentations of the staircase region 200 extend around peripheral connection regions 400 at locations that are laterally offset from laterally-protruding staircase segments 200P of the staircase region 200 along the bit line direction. A set of word line contact via structures 86, a through-memory-level word-line-connection via structure 488A, a through-memory-level transistor connection via structure 488B, and word line control transistor 710T located below the word lines (146, 246) can be formed in proximity to each other, thereby minimizing signal transmission lengths and reducing the area of the three-dimensional memory device, and while utilizing a dielectric filled region 400 that may remain unutilized in prior art devices. A bonding pad 338 connected to a word line control transistor 710T can be formed directly over a through-memory-level transistor connection via structure 488B that is connected to the word line control transistor 710T, thereby minimizing the length of the signal path between the word line control transistor and the bonding pad 338.

Although the foregoing refers to particular embodiments, it will be understood that the disclosure is not so limited. It will occur to those of ordinary skill in the art that various modifications can be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure can be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

a first alternating stack of insulating layers and electrically conductive layers located over a substrate;

a second alternating stack of insulating layers and electrically conductive layers located over the substrate and spaced apart from the first alternating stack;

clusters of memory stack structures vertically extending through the first and second alternating stacks, wherein each memory stack structure comprises a memory film and a vertical semiconductor channel; and bit lines electrically connected to an upper end of a respective subset of the vertical semiconductor channels, wherein:

each bit line in a first subset of the bit lines extends over the first and second alternating stacks as a continuous line structure and is vertically spaced from the substrate by a first interconnect-level separation distance; and each bit line in a second subset of the bit lines comprises a respective multi-level structure, each multi-level structure including bit-line-level bit line segments spaced from the substrate by the first interconnect-level separation distance and an interconnection line segment that is spaced from the substrate by a distance that is different from the first interconnect-level separation distance.

2. The three-dimensional memory device of claim 1, wherein the first and the second alternating stacks are laterally spaced apart from each other in a second horizontal direction by a retro-stepped dielectric material portion that laterally extends along a first horizontal direction over stepped surfaces of the first and second alternating stack.

3. The three-dimensional memory device of claim 2, wherein:

the bit-line-level bit line segments of each multi-level structure laterally extend along the second horizontal direction that is perpendicular to the first horizontal direction; and the interconnection line segment of each multi-level structure includes at least one portion that laterally extends along a horizontal direction that is different from the second horizontal direction.

4. The three-dimensional memory device of claim 3, wherein the bit-line-level bit line segments of each multi-level structure comprises:

a first bit-line-level bit line segment that overlies the first alternating stack; and a second bit-line-level bit line segment that overlies the second alternating stack, wherein lengthwise sidewalls of the first bit-line-level bit line segment and lengthwise sidewalls of the second bit-line-level bit line segment are located within a pair of two-dimensional Euclidean planes.

5. The three-dimensional memory device of claim 4, wherein the interconnection line segment of each multi-level structure comprises:

a linear portion that extends along the second horizontal direction and laterally offset from the first bit-line-level bit line segment and from the second bit-line-level bit line segment; and a pair of lateral-jog portions that extend along the first horizontal direction and adjoined to end regions of the linear portion.

6. The three-dimensional memory device of claim 5, wherein the pair of lateral-jog portions are connected to the first bit-line-level bit line segment and to the second bit-line-level bit line segment by a pair of bit-line-interconnection via structures that contact a respective one of the first bit-line-level bit line segment and to the second bit-line-level bit line segment.

7. The three-dimensional memory device of claim 6, further comprising:

drain regions contacting an upper end of a respective one of the vertical semiconductor channels;

drain contact via structures contacting a top surface of a respective one of the drain regions; and drain-connection via structures contacting a top surface of a respective one of the drain contact via structures and vertically spaced from the substrate by a same vertical separation distance as each of the pair of bit-line-interconnection via structures are from the substrate.

8. The three-dimensional memory device of claim 7, wherein top surfaces of the drain contact via structures are located within a same horizontal plane as top surfaces of the interconnection line segment of each multi-level structure.

9. The three-dimensional memory device of claim 5, wherein the interconnection line segments underlie the first subset of the bit lines and have an areal overlap with the first subset of the bit lines in a plan view along a direction perpendicular to a top surface of the substrate.

10. The three-dimensional memory device of claim 3, wherein the interconnection line segment of each multi-level structure is more proximal to the substrate than the bit-line-level bit line segments of each multi-level structure are to the substrate.

11. The three-dimensional memory device of claim 3, further comprising a through-memory-level via structure comprising at least one metallic material and vertically extending through the retro-stepped dielectric material portion, wherein:

the bit lines do not overlie an area of the through-memory-level via structure; and the interconnection line segments of the multi-level structures are located in an area that that surrounds the area of the through-memory-level via structure.

12. The three-dimensional memory device of claim 11, further comprising an interconnect metal pad located within the area of, and electrically connected to, the through-memory-level via structure, and is vertically spaced from the substrate by the first interconnect-level separation distance.

13. The three-dimensional memory device of claim 11, further comprising:
- field effect transistors located over a top surface of the substrate under the first and second alternating stacks; and
- lower-level metal interconnect structures embedded in lower-level dielectric material layers and located between the field effect transistors and the retro-stepped dielectric material portion, wherein the through-memory-level via structure contacts one of the lower-level metal interconnect structures.

14. The three-dimensional memory device of claim 1, wherein the first and the second alternating stacks are laterally spaced apart from each other in a second horizontal direction by an alternating stack of the insulating layers and dielectric spacer layers.

15. A method of forming a three-dimensional memory device, comprising:
- forming first and second alternating stacks of insulating layers and electrically conductive layers located over a substrate and clusters of memory stack structures vertically extending through the first and second alternating stacks, wherein each memory stack structure comprises a memory film and a vertical semiconductor channel; and
- forming bit lines electrically connected to an upper end of a respective subset of the vertical semiconductor channels, wherein:
- each bit line in a first subset of the bit lines extends over the first and second alternating stacks as a continuous line structure and is vertically spaced from the substrate by a first interconnect-level separation distance; and
- each bit line in a second subset of the bit lines comprises a respective multi-level structure, each multi-level structure including bit-line-level bit line segments spaced from the substrate by the first interconnect-level separation distance and an interconnection line segment that is spaced from the substrate by a distance that is different from the first interconnect-level separation distance.

16. The method of claim 15, further comprising forming a retro-stepped dielectric material portion between and over stepped surfaces of the first and second alternating stacks, wherein the first subset of the bit lines and the second subset of the bit lines extend over the retro-stepped dielectric material portion.

17. The method of claim 15, wherein the interconnection line segment of each multi-level structure comprises:
- a linear portion that extends along a second horizontal direction and laterally offset from the bit-line-level bit line segments, and
- a pair of lateral-jog portions that extend along a first horizontal direction and adjoined to end regions of the linear portion; and
- the method further comprises forming bit-line-interconnection via structures that connect each lateral-jog portion to a respective one of the bit-line-level bit line segments.

18. The method of claim 17, further comprising:
- forming drain regions on an upper end of a respective one of the vertical semiconductor channels;
- forming drain contact via structures on a top surface of a respective one of the drain regions; and
- forming drain-connection via structures on a top surface of a respective one of the drain contact via structures concurrently with formation of the bit-line-interconnection via structures.

19. The method of claim 16, further comprising:
- forming a through-memory-level via structure comprising at least one metallic material between the two groups of alternating stacks, wherein:
- the bit lines do not overlie an area of the through-memory-level via structure; and
- the interconnection line segments of the multi-level structures are located in an area that that surrounds the area of the through-memory-level via structure; and
- forming an interconnect metal pad within an area of and electrically connected to the through-memory-level via structure, wherein the interconnect metal pad is formed concurrently with formation of the first subset of the bit lines and the bit-line-level bit line segments of the second subset of the bit lines using a same metallic material deposition step and a same patterning step.

20. The method of claim 19, wherein the through-memory-level via structure is formed through the retro-stepped dielectric material portion.

* * * * *